US012701384B2

(12) United States Patent
Kaetel

(10) Patent No.: US 12,701,384 B2
(45) Date of Patent: Aug. 4, 2026

(54) APPARATUS AND METHOD FOR GENERATING A CONTROL SIGNAL FOR A SOUND GENERATOR OR FOR GENERATING AN EXTENDED MULTI-CHANNEL AUDIO SIGNAL BY USING A SIMILARITY ANALYSIS

(71) Applicant: Kaetel Systems GmbH, Munich (DE)

(72) Inventor: Klaus Kaetel, Munich (DE)

(73) Assignee: KAETEL SYSTEMS GMBH, Munich (DE)

( * ) Notice: Subject to any disclaimer, the term of this patent is extended or adjusted under 35 U.S.C. 154(b) by 273 days.

(21) Appl. No.: 18/521,034

(22) Filed: Nov. 28, 2023

(65) Prior Publication Data

US 2024/0098448 A1    Mar. 21, 2024

Related U.S. Application Data

(63) Continuation of application No. PCT/EP2022/064637, filed on May 30, 2022.

(30) Foreign Application Priority Data

May 31, 2021    (DE) ..................... 10 202 120 5545.1

(51) Int. Cl.
*H04S 7/00*        (2006.01)
*H03F 3/26*        (2006.01)
*H04S 1/00*        (2006.01)

(52) U.S. Cl.
CPC .............. *H04S 7/307* (2013.01); *H03F 3/26* (2013.01); *H04S 1/002* (2013.01); *H04S 2400/13* (2013.01)

(58) Field of Classification Search
CPC ...... H04S 7/307; H04S 1/002; H04S 2400/13; H04R 3/00; H04R 3/02; H04R 3/004
See application file for complete search history.

(56) References Cited

U.S. PATENT DOCUMENTS 4,612,663 A  * 9/1986 Holbrook .................. H04S 3/00
                                                            381/1
6,356,644 B1     3/2002 Pollak
               (Continued)

FOREIGN PATENT DOCUMENTS

CN          1575037 A      2/2005
DE      695 33 706 A1      4/2005
               (Continued)

OTHER PUBLICATIONS

International Search Report and Written Opinion dated Sep. 28, 2022, issued in application No. PCT/EP2022/064637.
Illusonic GMBH; "IAP Owner's Manual;" Dec. 2018; pp. 1-52.

*Primary Examiner* — James K Mooney
(74) *Attorney, Agent, or Firm* — McClure, Qualey & Rodack, LLP

(57) ABSTRACT

Apparatus for generating a control signal for a sound generator including a push-pull signal generator for generating a push-pull signal from a first channel signal and a second channel signal of a of a multi-channel audio signal; a controllable amplifier for amplifying or attenuating the push-pull signal with an adjustable amplification or attenuation according to an adjustment value, wherein the apparatus is configured to identify the control signal from an output signal of the controllable amplifier; and a controller for determining the adjustment value, wherein the controller is configured to determine a first adjustment value in case of a first similarity between the first channel signal and the second channel signal, and to determine a second adjustment value in case of a second similarity between the first channel signal and the second channel signal, wherein the first similarity represents a lower similarity than the second similarity.

25 Claims, 24 Drawing Sheets

(56)     References Cited

U.S. PATENT DOCUMENTS

| | | | |
|---|---|---|---|
| 2002/0013698 A1* | 1/2002 | Vaudrey | H04S 7/30 |
| 2004/0247132 A1* | 12/2004 | Klayman | H03G 5/025 |
| | | | 381/1 |
| 2006/0049889 A1 | 3/2006 | Hooley | |
| 2006/0147056 A1* | 7/2006 | Klayman | H04S 1/002 |
| | | | 381/98 |
| 2023/0362532 A1 | 11/2023 | Kaetel | |

FOREIGN PATENT DOCUMENTS

| | | | |
|---|---|---|---|
| DE | 10 2021 200 552 A1 | 7/2022 |
| DE | 10 2021 203 632 A1 | 10/2022 |
| DE | 10 2021 203 640 A1 | 10/2022 |
| EP | 0 875 126 B1 | 10/2004 |
| EP | 2 137 726 B1 | 9/2011 |
| EP | 2 692 144 B1 | 2/2017 |
| EP | 2 692 154 B1 | 9/2017 |
| EP | 2 692 151 B1 | 1/2018 |
| EP | 3 061 262 B1 | 1/2018 |
| EP | 3 061 266 B1 | 9/2020 |
| TW | 200627999 A | 8/2006 |
| WO | 87/06090 A1 | 10/1987 |
| WO | 2010/105280 A1 | 9/2010 |

* cited by examiner without partition wall combined
with orthogonal bandpasses
(Fig. 7b, 8a)

BP filter with $f_1$, $f_3$, $f_5$, ... belongs to the first plurality
BP filter with $f_2$, $f_4$, $f_6$, ... belongs to the second plurality

APPARATUS AND METHOD FOR GENERATING A CONTROL SIGNAL FOR A SOUND GENERATOR OR FOR GENERATING AN EXTENDED MULTI-CHANNEL AUDIO SIGNAL BY USING A SIMILARITY ANALYSIS

CROSS-REFERENCES TO RELATED APPLICATIONS

This application is a continuation of copending International Application No. PCT/EP2022/064637, filed May 30, 2022, which is incorporated herein by reference in its entirety, and additionally claims priority from German Application No. DE 10 202 120 5545.1, filed May 31, 2021, which is incorporated herein by reference in its entirety.

BACKGROUND OF THE INVENTION

The present invention relates to electro acoustics and particularly to concepts for generating and reproducing audio signals.

Typically, acoustic scenes are recorded using a set of microphones. Each microphone outputs a microphone signal. For example, 25 microphones may be used for an audio scene of an orchestra. A sound engineer then mixes the 25 microphone output signals, e.g., into a standard format such as a stereo format, a 5.1 format, a 7.1 format, a 7.2 format, or any other corresponding format. In case of a stereo format, e.g., the sound engineer or an automatic mixing process generates two stereo channels. In the case of a 5.1 format, mixing results in five channels and one subwoofer channel. Analogously, in case of a 7.2 format, e.g., mixing results in seven channels and two subwoofer channels. If the audio scene is to be rendered in a reproduction environment, a mixing result is applied to electrodynamic loudspeakers. In a stereo reproduction scenario, there are two loudspeakers, the first loudspeaker receiving the first stereo channel, and the second loudspeaker receiving the second stereo channel. For example, in a 7.2 reproduction format, there are seven loudspeakers at predetermined positions, and two subwoofers, which can be placed relatively arbitrarily. The seven channels are applied to the corresponding loudspeakers, and the subwoofer channels are applied to the corresponding subwoofers.

The use of a single microphone arrangement when capturing audio signals, and the use of a single loudspeaker arrangement when reproducing the audio signals typically neglects the true nature of the sound sources. European patent EP 2692154 B1 describes a set for capturing and reproducing an audio scene, in which not only the translation but also the rotation and, in addition, the vibration is captured and reproduced. Thus, a sound scene is not only reproduced by a single capturing signal or a single mixed signal but by two capturing signals or two mixed signals that, on the one hand, are recorded simultaneously, and that, on the other hand, are reproduced simultaneously. This ensures that different emission characteristics of the audio scene are recorded compared to a standard recording, and are reproduced in a reproduction environment.

To this end, as is illustrated in the European patent, a set of microphones is placed between the acoustic scene and a (imaginary) listener space to capture the "conventional" or translation signal that is characterized by a high directionality, or high quality.

In addition, a second set of microphones is placed above or to the side of the acoustic scene to record a signal with lower quality, or lower directionality, intended to represent the rotation of the sound sources in contrast to the translation.

On the reproduction side, corresponding loudspeakers are placed at the typical standard positions, each of which has an omnidirectional arrangement to reproduce the rotation signal, and a directional arrangement to reproduce the "conventional" translational sound signal. In addition, there is a subwoofer at each of the standard positions, or there is only a single subwoofer at an arbitrary location.

European patent EP 2692144 B1 discloses a loudspeaker for reproducing, on the one hand, the translational audio signal and, on the other hand, the rotary audio signal. Thus, the loudspeaker has, on the one hand, an arrangement that emits in an omnidirectional manner, and, on the other hand, an arrangement that emits in a directional manner.

European patent EP 2692151 B1 discloses an electret microphone that can be used for recording the omnidirectional or the directional signal.

European patent EP 3061262 B1 discloses earphones and a method for manufacturing earphones that generate both a translational sound field and a rotary sound field.

European patent application EP 3061266 A0, which is intended for grant, discloses earphones and a method for producing earphones configured to generate the "conventional" translational sound signal by using a first transducer, and to generate the rotary sound field by using a second transducer arranged perpendicular to the first transducer.

Recording and reproducing the rotary sound field in addition to the translational sound field leads to a significantly improved and therefore high-quality audio signal perception that almost conveys the impression of a live concert, even though the audio signal is reproduced by the loudspeaker or headphones or earphones.

This achieves a sound experience that can almost not be distinguished from the original sound scene in which the sound is not emitted by loudspeakers but by musical instruments or human voices. This is achieved by considering that the sound is emitted not only translationally but also in a rotary manner and possibly also in a vibrational manner, and is therefore to be recorded and reproduced accordingly.

A disadvantage of the concept described is that recording the additional signal that reproduces the rotation of the sound field represents a further effort. In addition, there are many pieces of music, for example classical pieces or pop pieces, where only the conventional translational sound field has been recorded. Typically, the data rate of these pieces is heavily compressed, e.g., according to the MP3 standard or the MP4 standard, contributing to an additional deterioration of quality, however, which is typically only audible for experienced listeners. On the other hand, there are almost no audio pieces that have not been recorded at least in the stereo format, i.e. with a left channel and a right channel. Rather, the development goes towards generating more channels than only a left and a right channel, i.e. generating surround recordings with five channels or even recordings with higher formats, for example, which is known under the keyword MPEG surround or Dolby Digital in the technology.

Thus, there are many pieces that have been recorded at least in the stereo format, i.e. with a first channel for the left side and a second channel for the right side. There are even more and more pieces where recording has been done with more than two channels, e.g., for a format with several channels on the left side and several channels on the right side and one channel in the center. Even higher level formats use more than five channels in the horizontal plane and in addition also channels from above or channels from obliquely above and possibly also, if possible, channels from below.

However, all these formats have in common that they only reproduce the conventional translational sound by applying the individual channels to corresponding loudspeakers with corresponding transducers.

SUMMARY

An embodiment may have an apparatus for generating a control signal for a sound generator, comprising: a push-pull signal generator for generating a push-pull signal from a first channel signal and a second channel signal of a of a multi-channel audio signal; a controllable amplifier for amplifying or attenuating the push-pull signal with an adjustable amplification or attenuation according to an adjustment value, wherein the apparatus is configured to identify the control signal from an output signal of the controllable amplifier; and a controller for determining the adjustment value, wherein the controller is configured to determine a first adjustment value in case of a first similarity between the first channel signal and the second channel signal, and to determine a second adjustment value in case of a second similarity between the first channel signal and the second channel signal, wherein the first similarity represents a lower similarity than the second similarity, and wherein the first adjustment value represents a lower amplification than the second adjustment value or a larger attenuation than the second adjustment value.

Another embodiment may have an apparatus for generating an extended multi-channel audio signal, comprising: an input interface for acquiring the multi-channel audio signal comprising a first channel signal and a second channel signal; a controller for determining an adjustment value for an amplification or attenuation of a push-pull signal derivable from the first channel signal and the second channel signal, wherein the controller is configured to determine a first adjustment value in case of a first similarity between the first channel signal and the second channel signal, and to determine a second adjustment value in case of a second similarity between the first channel signal and the second channel signal, wherein the first similarity represents a lower similarity than the second similarity, and wherein the first adjustment value represents a smaller amplification than the second adjustment value or a larger attenuation than the second adjustment value; and an output interface for outputting the extended multi-channel audio signal comprising the first channel signal, the second channel signal, and metadata, wherein the metadata comprises the adjustment value.

Another embodiment may have a method for generating a control signal for a sound generator, comprising: generating a push-pull signal from a first channel signal and a second channel signal of a of a multi-channel audio signal; amplifying or attenuating the push-pull signal with an adjustable amplification or attenuation according to an adjustment value, wherein the method is configured to identify the control signal from an output signal amplified or attenuated with the adjustable amplification or attenuation; and determining the adjustment value to determine a first adjustment value in case of a first similarity between the first channel signal and the second channel signal, and to determine a second adjustment value in case of a second similarity between the first channel signal and the second channel signal, wherein the first similarity represents a lower similarity than the second similarity, and wherein the first adjustment value represents a lower amplification than the second adjustment value or a larger attenuation than the second adjustment value.

Another embodiment may have a method for generating an extended multi-channel audio signal, comprising: acquiring the multi-channel audio signal comprising a first channel signal and a second channel signal; determining an adjustment value for an amplification or attenuation of a push-pull signal derivable from the first channel signal and the second channel signal, wherein determining is configured to determine a first adjustment value in case of a first similarity between the first channel signal and the second channel signal, and to determine a second adjustment value in case of a second similarity between the first channel signal and the second channel signal, wherein the first similarity represents a lower similarity than the second similarity, and wherein the first adjustment value represents a smaller amplification than the second adjustment value or a larger attenuation than the second adjustment value; and outputting the extended multi-channel audio signal comprising the first channel signal, the second channel signal, and metadata, wherein the metadata comprises the adjustment value.

Another embodiment may have a non-transitory digital storage medium having a computer program stored thereon to perform the method for generating a control signal for a sound generator, comprising: generating a push-pull signal from a first channel signal and a second channel signal of a of a multi-channel audio signal; amplifying or attenuating the push-pull signal with an adjustable amplification or attenuation according to an adjustment value, wherein the method is configured to identify the control signal from an output signal amplified or attenuated with the adjustable amplification or attenuation; and determining the adjustment value to determine a first adjustment value in case of a first similarity between the first channel signal and the second channel signal, and to determine a second adjustment value in case of a second similarity between the first channel signal and the second channel signal, wherein the first similarity represents a lower similarity than the second similarity, and wherein the first adjustment value represents a lower amplification than the second adjustment value or a larger attenuation than the second adjustment value, when said computer program is run by a computer.

Another embodiment may have a non-transitory digital storage medium having a computer program stored thereon to perform the method for generating an extended multi-channel audio signal, comprising: acquiring the multi-channel audio signal comprising a first channel signal and a second channel signal; determining an adjustment value for an amplification or attenuation of a push-pull signal derivable from the first channel signal and the second channel signal, wherein determining is configured to determine a first adjustment value in case of a first similarity between the first channel signal and the second channel signal, and to determine a second adjustment value in case of a second similarity between the first channel signal and the second channel signal, wherein the first similarity represents a lower similarity than the second similarity, and wherein the first adjustment value represents a smaller amplification than the second adjustment value or a larger attenuation than the second adjustment value; and outputting the extended multi-channel audio signal comprising the first channel signal, the second channel signal, and metadata, wherein the metadata comprises the adjustment value, when said computer program is run by a computer.

A synthetic generation of the rotation signal is possible when there is an audio piece with more than one channel, i.e.

one that already has stereo channels or even more channels, for example. By calculating an at least approximate difference, according to the invention, at least an approximation with respect to the difference signal, or rotation signal, is obtained, which may be used to drive an omnidirectional transducer, or one having lower directionality, so as to derive a rotation component from a signal that is actually only recorded translationally, and to reproduce it in the sound field. The push-pull signal or difference signal may also be used to control, together with the common-mode signal, two transducers with similar directionality or even two identically built transducers so that these transducers together generate a sound field that can be described with rotatory and translational sound particle velocity vectors.

The approximate difference signal or push-pull signal is generated by a push-pull signal, namely from a first channel signal and a second channel signal of a multi-channel audio signal. Furthermore, a controllable amplifier for amplifying or attenuating the push-pull signal with an adjustable amplification or attenuation according to an adjustment value is provided, wherein the apparatus for generating the control signal is further configured to generate the final control signal for a sound transducer from an output signal of the controllable amplifier.

The adjustment value for the controllable amplifier is identified by a controller for determining the adjustment value, wherein the controller is configured to determine a first adjustment value in case of a first similarity between the first channel signal and the second channel signal, and to determine a second adjustment value in case of a second similarity between the first channel signal and the second channel signal, wherein the first similarity represents a lower similarity than the second similarity, and wherein the first adjustment value represents a lower amplification than the second adjustment value or a greater attenuation than the second adjustment value.

Depending on the embodiment, the controller performs a direct analysis of the push-pull signal or the channel signals. Alternatively, the controller reads the adjustment value from metadata assigned to the multi-channel audio signal.

According to the invention, a controllable amplification of the push-pull signal is carried out on the basis of a consideration as to the similarity of the two channel signals from which the push-pull signal is derived. This avoids that the level of the push-pull signal deviates too strongly. If the two channel signals are identical, i.e. in-phase, that is fully similar, the difference signal will be very small. Thus, the push-pull signal component in the final output signal for a loudspeaker in a headphone or in a loudspeaker system not bound to a headphone will become weak, suppressing the effect to be achieved therewith. Thus, in the case of great similarity, amplification of the push-pull signal is carried out to avoid this loss due to the difference formation for generating the push-pull signal, or to at least partially counteract this loss. On the other hand, when the first channel signal and the second channel signal become more and more dissimilar, such a loss takes place less and less so that the amplification of the controllable amplifier may be lowered gradually. If the signals become more and more dissimilar and, in the extreme case, end up to be out of phase, i.e. being completely dissimilar, a push-pull signal with a relatively high level is obtained, which is why the controllable amplification of the controllable amplifier is set to a controllable attenuation so that the level of the push-pull signal is even attenuated in order to not be of too much disturbance in the final audio image generated by a headphone, earphone, or loudspeaker system on the basis of one or several control signals.

If the controller in the apparatus for generating the control signals is configured to read out the adjustment value from the metadata of the input signal, an actual analysis of the channel signals or the push-pull signal is carried out on the signal generator side, i.e. in an apparatus for generating an extended multi-channel audio signal that contains the adjustment value in its metadata. This represents "encoder-side" processing, with the "encoded" signal having the adjustment value in its metadata.

In contrast, if a conventional multi-channel audio signal without an adjustment value in its metadata is processed to obtain the control signal, the analysis of the channel signals or the push-pull signal to obtain the adjustment value is carried out in the apparatus since there is no corresponding metadata. This represents "decoder-side" processing.

In mixed embodiments, metadata is available, e.g., as start values that may then be refined by additional "decoder-side" processing if the functionalities are available.

In general, regardless of whether the controller is arranged in the apparatus for generating the extended multi-channel audio signal or the controller is arranged in the apparatus for generating a control signal, it may include the same functionalities and implementations. Various implementations for the controller in the apparatus for generating a control signal are subsequently described as examples. The same implementations of the controller may be used in the apparatus for generating the extended multi-channel audio signal.

In embodiments of the present invention, a correlation calculation between the first audio signal and the second audio signal is carried out, and particularly advantageously, a correlation calculation is performed by using a normalized cross-correlation function delivering a maximum value range between −1 and +1, wherein an attenuation is carried out in case of negative values and an amplification is carried out in case of positive values, wherein the course of a mapping curve for mapping the typically quantitative similarity values to adjustment values of the controllable amplifier is monotonous and, depending on the implementation, may even be adjusted in a linear or a non-linear manner. The exact implementation is not critical for a corresponding implementation since it may be specified, for example, via a ROM table that obtains a similarity value as input quantity and that delivers the adjustment value assigned to this similarity value as an output quantity. For example, actual functional relationships are alternatives for a ROM table, i.e. where the controller identifies the similarity value and calculates therefrom the adjustment value by using a specified algorithm, e.g. with a closed equation.

In an alternative embodiment, a cross correlation function calculation is not performed, but a consideration of the level of the push-pull signal itself, wherein the push-pull signal is amplified if it has a low level since this indicates high similarity of the channel signals, while the push-pull signal is attenuated, or less amplified, if it has a high value since this indicates low similarity. In the implementation of the similarity consideration on the basis of the level of the push-pull signal, in contrast to the calculation by using a correlation function, there is no automatic normalization with the level of the first and the second channel signal of the multi-channel audio signal. However, such a normalization is advantageous since the levels of all signals can be adjusted via external volume adjustment performed by a user via a user interface. Thus, if the determination of the adjustment value on the basis of the push-pull signal is performed prior to the volume adjustment of the signals on the basis of the user-side volume control, the current volume adjustment is not required for the amplifier adjustment. In contrast, if the controllable amplification of the push-pull signal is carried out in the course of the signal path after the volume adjustment has occurred by using an external volume adjustment, in addition to the level of the push-pull signal, the current volume adjustment requested by the user is required for the correct amplifier adjustment for the controllable amplifier so as to obtain the correct amplification value for the controllable amplifier.

The present invention is of advantage in that system-intrinsic level deviations that can occur in the calculation of the push-pull signal may be compensated, or reduced, in order to obtain a uniform sound rotation impression, regardless of how the particular similarity and particularly the phase position of the audio channel signals the push-pull signal has been derived from was currently.

Depending on the implementation, an automatic continuous adjustment of the controllable amplifier up to a sample-precise control may occur, i.e. with respect to a control per sample value. However, in order to avoid artifacts, it is advantageous to carry out filtering and in particular low-pass filtering of adjustment values so as to achieve an amplification change that is not too fast. On the other hand, further temporal averaging is achieved by setting, for the calculation of the cross-correlation function, if it is used, certain integration times for the required temporal integrations, across the length of which the "sluggishness" of the amplification control may be adjusted. Depending on the implementation, a cross-correlation value, or similarity value, may even be determined for an entire audio piece, and this similarity value is then maintained across the entire piece. Even in such a case, a complete integral similarity of the two channel signals the push-pull signal is determined from is considered so that even in such a case a signal-adaptive, albeit temporally very slow, amplification adjustment is carried out, or even one that is determined for a special signal.

The accordingly amplified, or attenuated, push-pull signal may be used in different implementations. In an implementation in which two different loudspeakers, or loudspeaker systems, are available to generate the rotation sound field and the translational sound field, the amplified push-pull signal can be used without further measures in order to drive a loudspeaker system for the generation of the rotation sound field. However, in such an implementation, it is advantageous to carry out a corresponding signal manipulation to achieve a further audio signal quality enhancement. Similarly, the common mode signal used to determine the push-pull signal, i.e. the first channel signal and the second channel signal, may be applied directly to a separate loudspeaker system for generating the conventional translational sound. However, it is advantageous to carry out a signal manipulation here as well, typically in the sense of a bandwidth extension beyond the audible range.

In other embodiments, the amplified push-pull signal may be combined with a corresponding common mode signal to drive a corresponding loudspeaker pair that may be housed in a headphone or earphone, or that may be housed in a single loudspeaker housing. Then, for each headphone side, or for each loudspeaker housing in which at least two sound transducers are housed, signal processing is performed from the amplified push-pull signal and the assigned common mode signal to obtain at least two signals for the two sound transducers housed in one headphone side or earphone side or housed in a loudspeaker housing. Partition of the two loudspeakers may be achieved, depending on the implementation, mechanically, via a ridge in a headphone side or earphone side, or via a ridge in the loudspeaker housing. Alternatively, however, it is advantageous to carry out this partition in a signal processing-manner by using a filterbank in each branch to generate the actual control signals for the two sound transducers, wherein the filterbank in one branch is interlocked, or "interlaced", with respect to the filterbank in the other branch so that the other filterbank has rejection bands where the one filterbank has passbands.

Preferred measures that are of particularly good usability when sound signals are generated for separate loudspeaker systems that, on the one hand, generate the translational sound and, on the other hand, generate the rotary sound are illustrated in the following.

The approximate difference signal is manipulated by a signal manipulator in order to obtain the second control signal for a rotary transducer. In particular, the signal manipulation is done by delaying the combination signal and/or by amplifying or attenuating the combination signal in a frequency-selective manner so as to at least partially counteract a non-linear transducer characteristic over the frequency of the second transducer, i.e. the rotary transducer. Alternatively or additionally, a bandwidth extension stage is provided for improving the reception quality, advantageously for the first control signal for the (normal) translational transducer and, according to the implementation, also for the third control signal for the second (conventional) translational transducer. On the other hand, the fourth control signal for the further rotary transducer is again advantageously delayed and/or linearized by a linearization filter so as to at least partially compensate the typically heavily non-linear frequency response of the rotary transducer.

According to the invention, in contrast to a conventional bandwidth extension, it is not the audible range, e.g. extending up to 20 kHz, that is targeted, but the non-audible range above it. In order to achieve a realistic sound perception, sound energy is emitted in the non-audible range above 20 kHz, wherein the signal for the sound energy in the non-audible range is derived from the audible sound signal by bandwidth extension, either of non-harmonic nature or advantageously of harmonic nature. Furthermore, in contrast to a conventional bandwidth extension, this synthetically generated non-audible spectrum is amplified instead of attenuated so as to again achieve that the typical conventional translational sound transducers still emit enough sound energy in the non-audible range, although the emission efficiency typically decreases towards frequencies above 30 to 40 kHz. However, it is advantageous to emit sound signals up to 80 kHz.

Although these sound signals are not directly audible, they still have a decisive effect with respect to the quality of the audible signal since the harmonics spectrum at these high frequencies is used to condition the air, so to speak, so that sound signals with lower frequencies in the harmonics spectrum can better propagate through the air. This achieves the "jungle" effect for certain sound signals, which is characterized in that certain e.g. very insistent sounding parrots are audible over a very long distance, although this should not be the case according to the normal laws of propagation, according to which the sound energy decreases as the square of the distance. These particularly good propagation characteristics of such natural signals are due to the fact that the audio signals have a particularly powerful harmonics component that reaches very high frequencies, which is used to achieve the above-mentioned air pre-conditioning. For example, it is similar for certain percussive instruments in the orchestra, such as a triangle. Although it does not generate a particularly high sound pressure level, it can be heard particularly clearly even at a considerable distance, e.g. even in the back rows of a concert hall. This also assumes that this particularly good audibility is achieved by conditioning the air in which the audible sound waves propagate by means of a particularly strong harmonics content so that the decrease in volume proportionally to the square of the distance is compensated by energy from the harmonics so that certain signals rich in harmonics carry particularly far and are at the same time clearly audible despite the great distance from the sound source.

In embodiments of the present invention, a delay is carried out so as to delay the rotation signal with respect to the translational signal in order to use the precedence effect, or the Haas effect. The delay in the magnitude of 10 to 40 ms achieves that, according to the principle of the first wave front, the localization of the sound source by a listener takes place on the basis of the translational signal that carries the directional information. At the same time, the rotary signal does not interfere with the directional perception, however, at the same time leads to a high-quality and life-like audio signal experience due to the excitation of rotating sound particle velocity vectors in the sound field by the corresponding second and fourth transducers that reproduce the second and fourth control signals, respectively. Due to the Haas effect, the listener thinks that the rotating components of the sound field originate from the source whose translational sound field has reached the listener's ear shortly before.

In embodiments, only a coarse linearization of the typically heavily non-linear frequency response of the transducer, or transducer system, is carried out in the linearization filter for the reproduction of the rotary sound field. A non-linear emission characteristic, or a non-linear frequency response, is typically characterized by overshoots and cancellations. According to the invention, however, the linearization filter is only configured to reduce overshoots partially or advantageously completely, however, to leave the cancellations almost untouched so as to avoid potentially disturbing artifacts by avoiding a strong amplification in the cancellations that would otherwise be required. It has been found that the quality of a rotating sound field is not noticeably affected if, due to the cancelations still present as a result of comb filter effects potentially occurring in the transducers for the rotary sound, certain tones are missing in the part of the sound filter comprising rotating sound particle velocity vectors. In contrast, the attenuation of the overshoots prevents the rotating component of the sound field from being perceived as unnatural. In order to obtain a favorable setting of the linearization filter, it is advantageous in certain embodiments to record the reproduction or frequency response characteristic of the rotatory transducer by measurement and to then set the linearization filter for the control signal for this transducer on the basis of the performed measurement. However, it is also possible to set a prototype linearization characteristic that is predetermined for certain transducer classes, which provides usable results even if the actual second, or fourth, transducer does not fully match the prototype characteristic.

Preferably, the apparatus for generating the first control signal for the first transducer and the second control signal for the second transducer also comprises means to generate a control signal for the third and the fourth transducers to achieve, e.g., a stereo reproduction over loudspeakers. If more than two channels are to be reproduced, further control signals are generated, e.g., for a left rear loudspeaker, a right rear loudspeaker, and a center loudspeaker. Then, a transducer for the translational sound and a transducer for the rotatory sound will be provided at each location of the standardized loudspeaker output format, and the control signal for the rotatory sound generated synthetically according to the invention is determined for each individual loudspeaker position or is derived from one and the same manipulated combination signal, according to the effort of the corresponding embodiment.

Preferred embodiments provide an interface that receives a first electric signal, e.g. for a left channel, and a second electric signal, e.g. for a right channel. The signals are supplied to a signal processor in order to reproduce the first electric signal for the first transducer and the second electric signal for a third transducer. These transducers are the conventional transducers. In addition, the signal processor is configured to calculate the at least approximate difference from the first electric signal and the second electric signal and to determine from this difference a third electric signal for a second transducer or a fourth electric signal for a fourth transducer.

In an embodiment, the signal processor is configured to output the first electric signal for the first transducer and the second electric signal for the third transducer, and to calculate a first at least approximate difference from the first electric signal and the second electric signal, and to calculate a second at least approximate distance from the first electric signal and the second electric signal, and to output a third electric signal for the second transducer on the basis of the first at least approximate difference and to output a fourth electric signal for the fourth transducer on the basis of the second at least approximate difference. Preferably, the difference is a precise difference where the second signal is changed by 180° and is added to the first signal. If this signal is the first at least approximate difference, the different second at least approximate difference is what results if the first signal is phase-shifted by 180°, i.e. is applied with a "minus" and the unchanged second signal is added thereto. Alternatives consist of calculating the first at least approximate difference and applying thereto a phase shift of 180°, for example, in order to calculate the second at least approximate difference. Then, the second at least approximate difference is directly determined from the first at least approximate difference. Alternatively, both differences may be determined independently, i.e. both from the original first and second electric signals, that is the left and the right input signals.

Ideally, the difference is a value that is obtained if a first channel is subtracted from the second channel, or vice versa. However, an at least approximate difference also results and is useful in certain embodiments if the phase shift is not 180°, but larger than 90° and smaller than 270°. In the even more advantageous range, which is smaller, the phase shift has a phase value of between 160° and 200°.

In an embodiment, one of the two signals may be subjected to a phase shift equal to or different from 180° before the difference is formed, and, possibly, to frequency-dependent processing before addition, e.g. by means of equalizer processing or frequency-selective or non-frequency-selective amplification. Further processing performed either before or after calculating the difference consist of high-pass filtering. If a high-pass filtered signal is combined with the other signal, e.g., with an angle of 180°, this is also an at least approximate difference. The difference calculated at least approximately in order to generate therefrom the signal for exciting rotation waves in corresponding transducers separate from the conventional transducers may be approximated by not changing the values of the two signals and by varying the phase between the two signals between an angle of between 90° and 270°. For example, an angle of 180° may be used. The amplitudes of the signals may be varied in a frequency-selective or non-frequency-selective manner. Combinations of frequency-selectively or non-frequency-selectively varied amplitudes of the two electric signals together with an angle of between 90° and 270° also lead to a rotation excitation signal for the separate rotation transducer, i.e. the second transducer on the left side and the second transducer on the right side, that is useful in many cases.

The difference signal for the one side and the different difference signal for the other side are advantageously used for loudspeakers that are remote from the listener's head. Each of these loudspeakers has at least two transducers that are fed with different signals, wherein the first loudspeaker for the "left side" has a first transducer that is fed with the original left signal, or a possibly delayed left signal, whereas the second transducer is fed with the signal derived from the first at least approximate difference. The individual transducers of the second loudspeaker for the "right side" are driven accordingly.

In a further embodiment where there are more than two channels, i.e. for example in case of a 5.1 signal, the signal processor or the interface has connected upstream thereto a down-mixer for the first electric signal, i.e. for the left channel, and a further down-mixer for the second electric signal, i.e. for the right channel. However, if the signal is available as an original microphone signal, e.g. as an ambisonics signal with several components, each down-mixer is configured to calculate a left or right channel from the ambisonics signal accordingly, which is then used by the signal processor to calculate the third electric signal and the fourth electric signal on the basis of at least approximate differences.

When generating control signals for identical loudspeaker systems that together generate the translational and the rotatory sound field, if headphone signals are to be generated, an efficient sound generator concept is advantageously achieved by providing a first sound generator element on a head side and a second sound generator element on a second head side with two sound transducers each. Preferably, but not necessarily, the sound transducers are arranged in parallel in the respective sound generator element, or deviate by less than 30%.

This makes it possible that the individual sound transducers "rise" relatively little in the corresponding headphone capsules, achieving headphone capsules that may be configured to be relatively flat. In addition, this concept enables an implementation within an in-ear headphone element, i.e. within a headphone that is not worn as a headphone capsule at the outside of the ear, but is introduced into the outer ear channel. Since the two loudspeakers, or sound transducers, in a headphone capsule, or in an in-ear element for one ear, both emit in the same direction, or in a direction that diverges only a little, it is possible that these two sound transducers may be arranged in the same plane, i.e. typically next to each other. Compared to earlier headphones, this enables a larger width of a headphone capsule since two transducers are now arranged next to each other. However, in contrast to the alternative with one transducer in front of the other transducer, this is significantly simpler in terms of construction and is uncritical with respect to the greater need for space since the measurements for the individual sound transducers are uncritical in any case, in contrast to the measurements of headphone capsules that enclose the entire ear. In in-ear designs, the implementation is uncritical in any case, since two miniature transducers arranged next to each other may emit into the ear via two openings arranged next to each other. This achieves a space-efficient structure with good audio quality.

Depending on the implementation, i.e. whether the headphone is provided with a signal processor or whether the headphone is already fed with the individual signals for the transducers, and depending on the implementation of the signal generation for the individual headphones, a partition bar, or a partition ridge, is provided between the two headphones to separate the two sound transducers arranged on one side in a sound transducer element so as to, so to speak, mechanically decouple the two sound transducers arranged next to each other. This mechanical decoupling may be omitted if electronic decoupling is performed, e.g., such as achieved by means of a signal processor comprising filterbanks that are advantageously interleaved, or interlocked, in the signal paths for the different sound transducers in a found transducer element. The first sound transducer obtains a signal that was filtered by a first plurality of bandpass filters, and the second sound transducer obtains a control signal that was filtered by a second plurality of bandpass filters, wherein the filters for the individual sound transducers are not identical, but are arranged in an interleaved or "interdigital" way with respect to the center frequencies of the different bandpass filters.

Depending on the implementation, i.e. implementation with a partition ridge and a signal processor without interlocked bandpass filter arrangements, or an implementation with interlocked bandpass filter arrangements in the different signal paths and no partition ridge between the sound transducers in the sound transducer element or an implementation with a partition ridge and interlocked bandpass filter arrangements in the different signal paths, optimum control of the signals is achieved by the sound transducers arranged next to each other that are each applied with different signals, which are phase-shifted in advantageous embodiments. In other embodiments, the signals applied at the sound transducers in one and the same sound generator element are phase-shifted and further have the same bandwidth, disregarding possibly different filterbanks in the signal paths for the sound transducers. Still, the implementation with different filterbanks typically arranged interdigitally or interleaved with respect to each other in the different signal paths is not a division of a signal in a treble range, a mid-range, and a base range. Instead, the entire spectrum, possibly disregarding missing bands due to the plurality of bandpass filters, is output via each signal transducer.

In embodiments, enrichment of the signals for the individual sound transducers to emulate a rotation is achieved using a side-signal generator that calculates a side signal for a left channel and a right channel, wherein the side signal is typically the difference signal between the left and right sides. This embodiment is advantageous if there is no separate rotation signal. However, if there is a separate rotation signal, this signal is fed into the signal paths instead of the side signal.

The side signal or the rotation signal is advantageously delivered to both signal paths so that the side signal or the rotation signal is output by both signal generators in addition to the corresponding left and/or right channel. In the present invention, compared to the prior art, a sound generator in a sound generator element no longer serves to reproduce the translational signal while the other sound transducer functions to reproduce the rotary signal. Instead, both sound generators function to reproduce a combination of both signals, the rotary portion that is determined from the side signal or that is applied directly, and the translational portion that is represented by the input for the corresponding left channel signal and/or right channel signal.

In other embodiments in which a side-signal generator is not available, the control signal for the sound transducers in a sound transducer element is generated by adding, in addition to the left channel, a high pass-filtered left channel with corresponding processing and a phase shift that is different for both signal paths. The combination signal then consists of the left signal available for the left side and an additional high pass-filtered and possibly amplified or attenuated original signal to which different phase shifts are applied depending on the signal path.

In embodiments, the signal processor is contained in the sound transducer wearable at the head. Then, the sound transducer wearable at the head, e.g., a headphone or an earphone, only obtains the left and the right channel, and the signals for the at least four sound transducers provided according to the invention are then calculated, or generated, from the received left and right channel, e.g., transmitted to the sound generator wearable at the head by a mobile telephone via Bluetooth. In this case, an autonomous current supply such as a current supply by a battery or a chargeable accumulator exits in the sound generator wearable at the head.

In other embodiments, the left and the right channel or the four control signals for the different sound transducers are transmitted in a wired or wireless communication to the sound generator elements. In the case of a wired transmission, it is advantageous to further achieve a voltage supply for the sound generator elements via the wired communication as well. In the case of wireless transmissions, as is illustrated, a current supply such as a chargeable accumulator has to be available in the sound generator wearable at the head. Depending on the implementation, the generation of the control signals for the sound generators is carried directly in the sound generator wearable at the head, or separately, e.g., with a mobile telephone that then transmits the individual control signals for each individual sound transducer via a wireless communication such as via Bluetooth or Wi-Fi to the sound transducer. Thus, an aspect of the present invention also consists of the implementation of a signal processor for generating the control signals for the sound transducers in a headphone or an earphone, wherein the signal processor is configured separately from the sound transducers, that is as an arrangement within a mobile telephone or another mobile device, for example In an alternative implementation in which the amplified push-pull signal is used to deliver control signals for sound transducers housed in a loudspeaker housing, a first sound generator with a first emission direction and a second sound generator with a second emission direction are used, wherein the sound generators are arranged with respect to each other such that the two emission directions intersect in a sound chamber, wherein the emission directions have an intersection angle that may be parallel, however, that is advantageously greater than 60° and smaller than 120°. In addition, the first sound generator, the second sound generator, and the sound chamber are advantageously accommodated in a housing, wherein the housing comprises a gap that is configured to enable gas communication between the sound chamber and a surrounding area of the loudspeaker.

With respect to the signal processor, the first sound generator and the second sound generator are driven such that a common-mode signal supplied to the first sound generator and the second sound generator is overlapped with a push-pull signal so as to obtain the control signal for the first sound generator. Furthermore, the common-mode signal is overlapped with a second push-pull signal so as to obtain the control signal for the second sound generator. The two push-pull signals differ from each other.

This achieves that both sound generators together reproduce the common-mode signal, i.e. the translational component, and the push-pull signal, i.e. the rotary component. Due to the fact that the sound emission of the two sound generators is mixed in the sound chamber, and due to the fact that a gap is provided in the housing, through which the sound can exit from the sound chamber into the surrounding area of the loudspeaker, it is achieved that the exiting sound has translational and rotary components, i.e. common mode parts and push-pull parts. In particular, it has been shown that, when leaving the gap, the sound has sound particle velocity vectors that represent the translational component, directed away from the propagation direction of the sound transducer. These sound particle velocity vectors representing the translational component are directed towards the source or away from the source, and change their length; however, they do not rotate. It has been found at the same time, however, due to the arrangement of the sound generators in the sound chamber, the generated output sound signal also comprises sound particle velocity vectors that rotate, and therefore generate a rotatory sound signal in the surrounding area of the loudspeaker, which, together with the translational sound field, leads to the audio perception becoming particularly natural.

In contrast to conventional transducers that only generate a translational sound field, the quality of the inventive loudspeaker is superior because, in addition to the translational sound field, the rotatory sound field is generated as well, creating a particularly high-quality almost "live" impression. On the other hand, the generation of these particularly natural sound fields with translational and rotatory components, i.e. with linear and rotating sound particle velocity vectors, is particularly compact because two sound generators arranged obliquely to each other in one sound chamber generate the combined sound field that exits through a gap.

According to an aspect of the present invention, the loudspeaker is arranged to be separate from the signal processor. In such an embodiment, the loudspeaker has two signal inputs that may be wired or wireless, wherein a signal for one sound generator in the loudspeaker is generated at each signal input. The signal processor providing the control signals for the sound generators is arranged remotely from the actual loudspeaker and is connected to the loudspeaker via a communication link, such as a wired link or a wireless link.

In another embodiment, the signal processor is integrated into the loudspeaker. In such a case, in the loudspeaker with the integrated signal processor, the common-mode signal is derived and, according to the implementation and the embodiment, the push-pull signal is derived separately, or from the common-mode signal. An aspect of the present invention therefore concerns the loudspeaker without a signal processor. Another aspect of the present invention therefore also concerns the signal processor without a loudspeaker, and a further aspect of the present invention concerns the loudspeaker with an integrated signal processor.

In embodiments, the two push-pull signals are derived from a base push-pull signal by using two all-pass filter processes, wherein, in an advantageous embodiment, the base push-pull signal is filtered with a first all-pass filter so as to generate the first push-pull signal directly or, possibly, by using further processing steps. The base push-pull signal is filtered with a second all-pass filter that differs from the first all-pass filter so as to generate the second push-pull signal for the second sound generator in the loudspeaker directly or, possibly, by using further processing steps.

According to the implementation, filterbank processing may be performed in the push-pull signal processing, wherein two interleaved, or interlocked, or "interlaced", filterbanks are provided in the two processing branches for the two push-pull signals. Through this, the push-pull signal of the two sound transducers is interleaved in terms of frequency, so to speak, or is brought into the sound chamber in a frequency-multiplexed way. It has been shown that, in such a case, to at least partially separate the sound output of the first sound generator from the sound output of the second sound generator, a partition wall in the sound chamber is not required. In contrast, if interleaved filterbank processing is not carried out, but the two push-pull signals essentially have identical frequency components across the entire frequency range, it is advantageous to provide a partition wall in the sound chamber, which leads to an increase of the ratio of the rotating sound particle velocity vectors in the output signal and, at the same time, to an overall more efficient sound output.

The base push-pull signal processed by using advantageously two different all-pass filters to generate the two push-pull signals for the two sound generators in the loudspeaker may be obtained in different ways. It is one possibility to record this signal directly in a separate way with certain microphone arrangements and to generate it as a combined audio representation together with the translational or common-mode signal. This ensures that the common-mode signal for the translational sound component and the push-pull signal for the rotary sound component are not mixed in the inventive signal processor on the way from the recording to the reproduction.

In an alternative embodiment, e.g., if the separate rotatory component signal is not present and there is only a mono signal or one channel signal, the base push-pull signal may be derived from the common-mode signal by high-pass filtering and/or, possibly, attenuation or amplification.

In a further embodiment of the present invention, when there is a multi-channel signal, e.g., a stereo signal or a signal with three or more channels, the push-pull signal is derived from this multi-channel representation. In the case of a stereo signal, e.g., a side signal representing the difference of the left and the right channel is calculated, wherein, if applicable, this side signal is then attenuated or amplified accordingly, and, according to the implementation, is mixed with a common-mode signal that is not high-pass filtered or is high-pass filtered. In principle, the side signal itself may already be used as the base push-pull signal if the output signal is a stereo signal. If the output signal has several channels, the base push-pull signal may be generated as the difference between any two channels of the multi-channel representation. Thus, for example, a difference between the left rear side and the right rear side (right surround) could be generated, or, alternatively, a difference between the center channel and one of the other four channels of a five-channel representation. In case of such a five-channel representation, a difference between left and right may be determined to generate the side signal, as is the case in a stereo representation. In a further embodiment, certain channels of the five-channel representation may be added, i.e. a two-channel downmix may be determined, from which the base push-pull signal may be obtained through calculating a difference. An exemplary implementation for generating a two-channel downmix signal consists of the addition, possibly with weighting factors, left rear (left surround), left, and center, so as to generate a left downmix channel. To generate the right downmix channel, the right surround channel, the right channel and the center channel are again added up, possibly with weighting factors. The base push-pull signal may then be determined from the left downmix channel and the right downmix channel by calculating the difference.

Thus, there are different possibilities to derive a separate push-pull signal from conventional common-mode signals if such a push-pull signal does not (yet) exist.

BRIEF DESCRIPTION OF THE DRAWINGS

Embodiments of the present invention will be detailed subsequently referring to the appended drawings, in which:

FIG. 4a shows an advantageous mapping function for mapping a similarity to an adjustment value for the controllable amplification or attenuation in an analysis of the two channel signals the push-pull signal is derived from;

FIG. 7b shows an advantageous embodiment for illustrating the first and second push-pull signal processing of FIG. 7a;

DETAILED DESCRIPTION OF THE INVENTION

Figure 1:
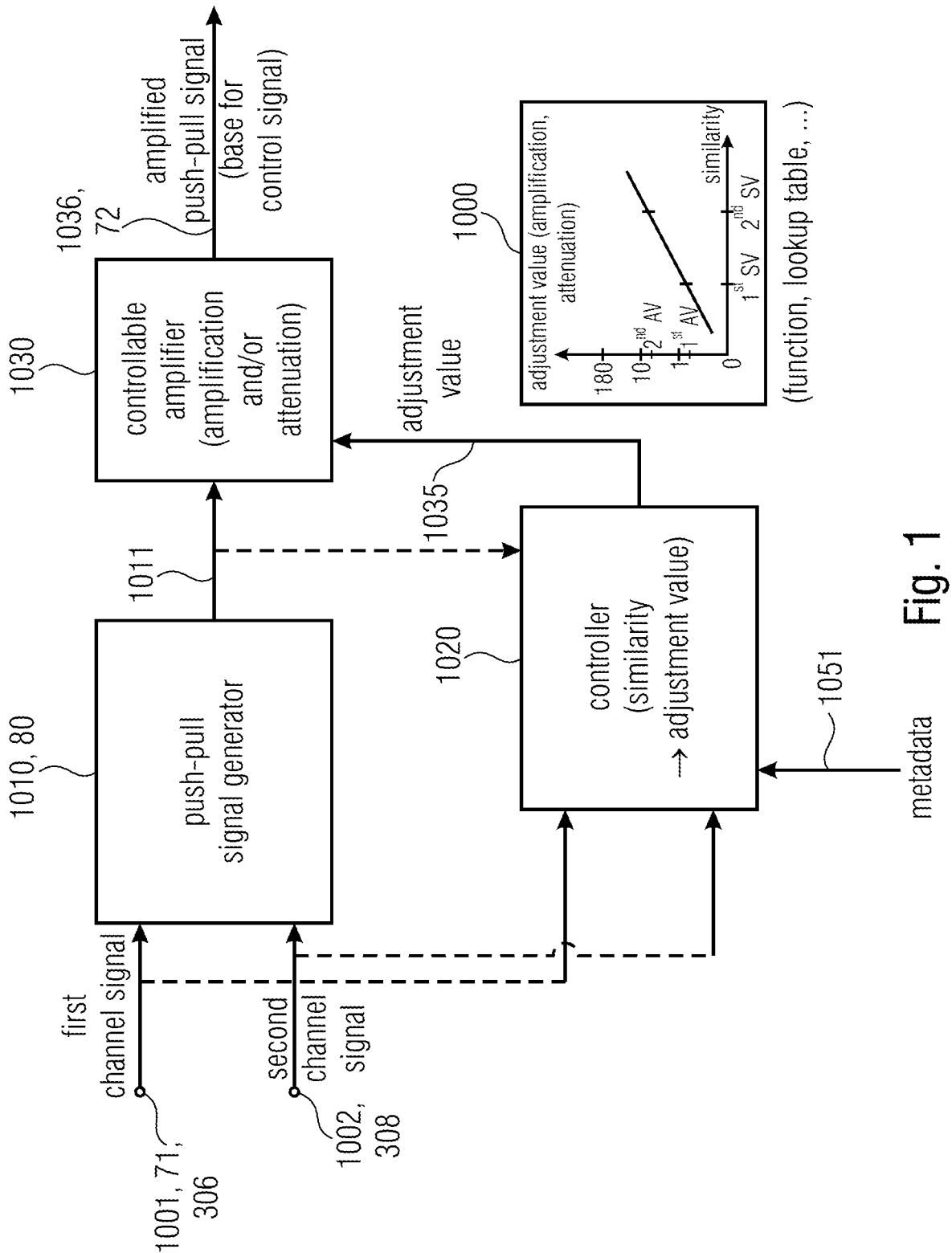
FIG. 1 shows an apparatus for generating a control signal according to a first embodiment.

FIG. 1 shows an apparatus for generating a control signal for a sound generator, comprising a push-pull signal generator 1010, 80, a controllable amplifier 1030, and a controller 1020. The push-pull signal generator 1010, 80 is configured to generate a push-pull signal 1011 from a first channel signal and a second channel signal. The first channel signal 1001, or 71, or 306, and the second channel signal 1002, or 308, originate from a multi-channel audio signal and may be the left channel signal and the right channel signal, for example. Alternatively, the first channel signal may also be a left rear channel (left surround) or a right rear channel (right surround) or any other channel of a multi-channel audio signal that may not only include a 5.1 format but also higher formats such as a 7.1 format, etc.

The controllable amplifier 1030 is configured to amplify or to attenuate the push-pull signal 1011, namely with an adjustable amplification or attenuation according to an adjustment value 1035 which the controllable amplifier 1030 receives from the controller 1020. In particular, the apparatus in FIG. 1 is configured to use the amplified push-pull signal 1036, or 72, as a basis for the control signal for one or several sound generators, wherein different variations for the generation of the final control signal from the amplified push-pull signal are subsequently illustrated with reference to FIGS. 5b, 7a, 7b, 8a, 8b, 11, 12, 13, 14, 15a, 15b or 16.

The controller 1020 is configured to determine the adjustment value 1035 such that a first adjustment value is determined in case of a first similarity between the first channel signal and the second channel signal, and such that a second adjustment value is determined in case of a second similarity between the first channel signal and the second channel signal, wherein, in particular, the first similarity represents a lower similarity than the second similarity, and wherein the first adjustment value represents a lower amplification than the second adjustment value or a greater attenuation than the second adjustment value. This relationship is schematically illustrated in the mapping function 1000, illustrating an adjustment value for an amplification (adjustment value larger than 1) and/or for an attenuation (adjustment value smaller than 1), namely depending on a similarity scale. In particular, the amplification becomes larger and larger for greater similarity values, i.e. for stronger similarities between the first channel signal and the second channel signal. This is advantageous in that the level loss of the push-pull signal advantageously generated as a difference signal or approximate difference signal is leveled out, or partially compensated, through this. On the other hand, the more dissimilar the two channel signals are, the smaller and smaller the amplification becomes, since the level of the push-pull signal increases more and more. In particular, a special situation arises if the first channel signal and the second channel signal are particularly dissimilar, i.e. fully correlated, but inversely phased. Then, the calculation of the push-pull signal leads to an exaggeration of the level of the push-pull signal, which, according to the mapping function to map similarity values to adjustment values, as is schematically shown at 1000 in FIG. 1, is handled, according to the invention, in that the push-pull signal is amplified less or is even attenuated, i.e. with an amplification factor smaller than 1 on a linear scale or with a negative amplification factor on a logarithmic scale, such as a dB scale.

An amplification may be an amplification that leads to an increase of the level, i.e. an amplification with an amplification factor larger than 1, or a positive amplification factor on a dB scale. However, an amplification may also be an amplification with an amplification factor of less than 1, i.e. an attenuation. Then, the amplification factor is between 0.1, or in the negative range on an dB scale.

Figure 17:
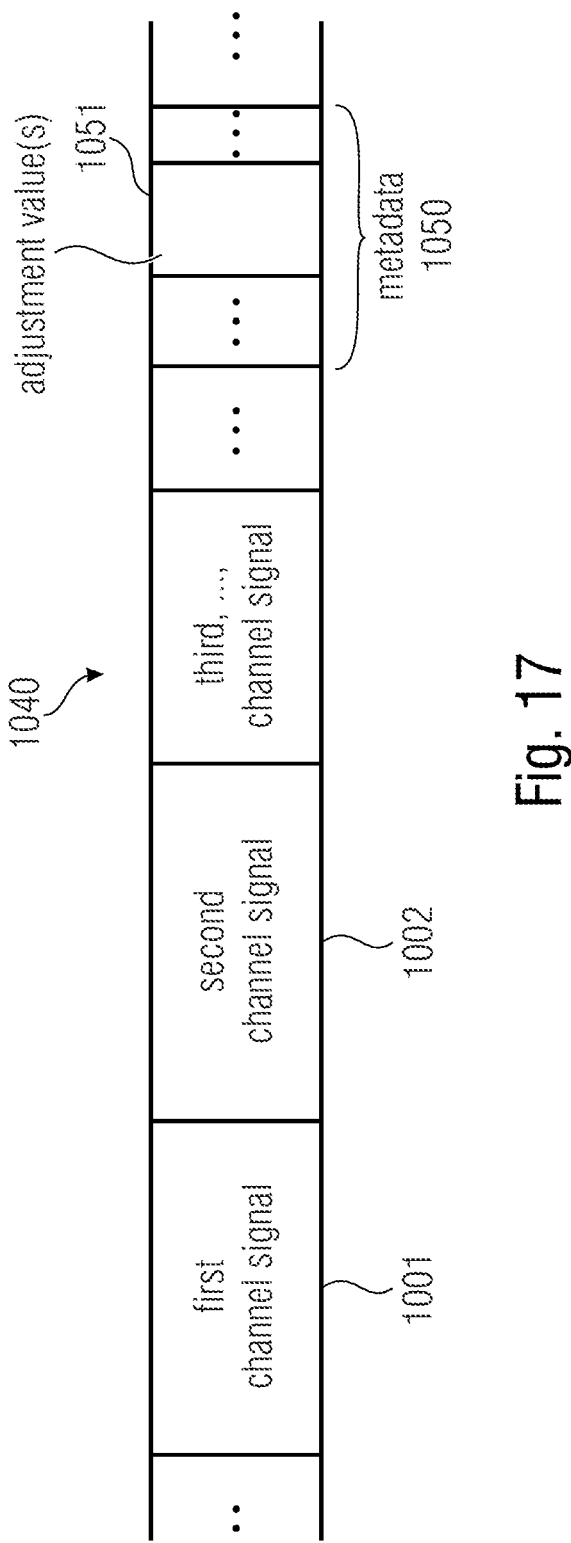
FIG. 17 shows an illustration of an extended multi-channel audio signal with one or several adjustment values in the metadata.

Depending on the embodiment, direct analysis of the signals to determine the adjustment value takes place in the apparatus of FIG. 1. Alternatively, the multi-channel audio signal including the first channel signal 1001, 71, 306, and the second channel signal 1002, 308 includes metadata 1050, as illustrated in FIG. 17. The controller 1020 is configured to extract the adjustment value 1035, 1051 from the metadata 1050. The controllable amplifier is configured to apply the adjustable amplification or attenuation to the push-pull signal 1011 according to the extracted adjustment value. This is illustrated by the arrow into block 1020 for the metadata at 1051. Then, direct signal analysis does not necessarily take place in the apparatus of FIG. 1. In a mixed implementation, a starting value for the adjustment value is read out from the metadata 1051, which may then be refined by an apparatus configured for actual signal analysis. On the other hand, an apparatus that cannot perform signal analysis but can only read out the metadata 1051 will use the same starting value for an entire piece, which already represents an improvement, or, at certain points in time within a piece at which a new adjustment value is available in the metadata, will use this new adjustment value to adjust the controllable amplifier(s).

Preferably, the controller 1020 is configured to determine a correlation value between the first channel signal 1001, 71, 306, and the second channel signal 1002, 308, wherein the correlation value is a measurement for the similarity. Particularly advantageously, the controller 1020 is configured to calculate a normalized cross-correlation function from the first channel signal and the second channel signal, wherein a value of the normalized cross-correlation function is a measurement for the similarity. In particular, the controller 1020 is configured to calculate a correlation value by using a correlation function having a value range of negative and positive values, wherein the controller is configured to determine, for a negative value of the cross-correlation function, an adjustment value that represents an attenuation or amplification, and, for a positive value of the correlation function, the adjustment value that represents an amplification, or attenuation, i.e. the opposite. A typical normalized cross-correlation function has a value range of between −1 and +1, wherein the value −1 means that the two signals are fully correlated but inversely phased, and therefore dissimilar to the maximum.

On the other hand, a value of +1 is obtained if the two channel signals are fully correlated and in-phase, i.e. fully similar. The push-pull signal increases more and more with a decreasing value of −1 to 0 in case of a normalized cross-correlation function, which is why the amplification factor in this range is reduced more and more. With a value of the normalized cross-correlation function between 0 and −1, the similarity decreases more and more, which is why the push-pull signal is attenuated more and more, or is amplified less and less, to counteract the exaggeration of the push-pull signal. A similarity between the channel signals is therefore synchronous with the cross-correlation function only if the two channel signals are in phase, i.e. if the sign of the cross-correlation function is +1. However, the similarity is non-synchronous with respect to the value of the cross-correlation function if the sign of the cross-correlation function is negative.

Figure 4A:
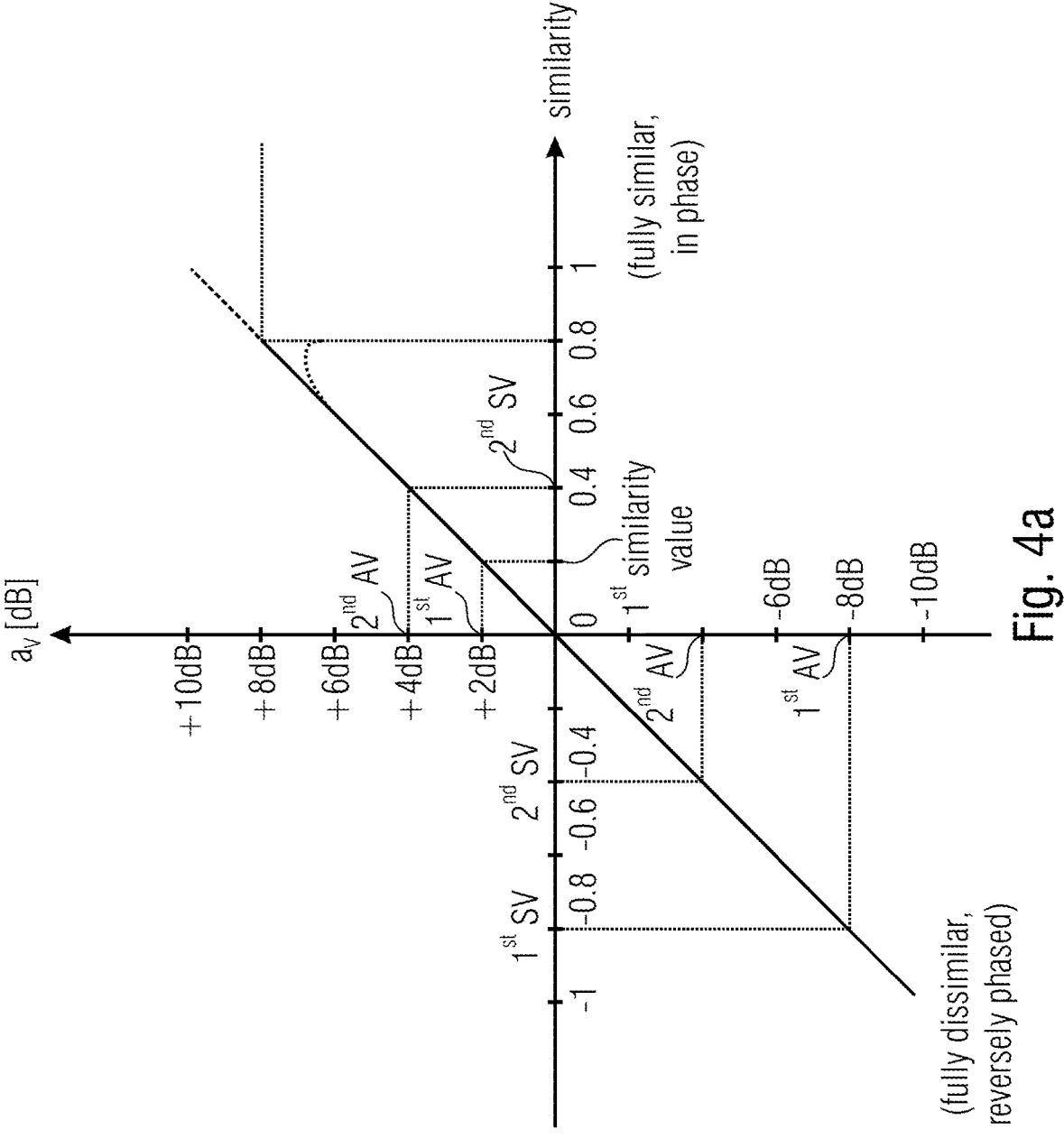

FIG. 4 shows an advantageous mapping function that may be used as a mapping function in 1000 of FIG. 1, for example. The y axis represents the amplification amount $a_v$ in dB. The similarity value along the x axis has a value range of between −1 and +1, wherein a maximum similarity would be obtained at a value of the cross-correlation function of +1. However, a maximum dissimilarity corresponding to a value of the cross-correlation function with respect to the amount of 1 and a negative sign would lead to the fact that the amplification becomes an attenuation, i.e. an amplification of less than 1, or an amplification in the negative dB range. In the embodiment shown in FIG. 4a, the relationship between the similarity value on the one hand and the adjustment value on the other hand is linear, namely up to the values of about 0.8 in an embodiment. Above values of more than 0.8, for example, the progression of the amplification to the adjustment value is drawn in a dotted line and will no longer run linearly in certain embodiments. This is due to the fact that the push-pull signal becomes smaller and smaller and, in an extreme case if signals that are 100% in phase are present at the input of the controller, could even become 0. A very strong amplification would then lead to the fact that a very small signal that would largely consist of noise will be amplified. In this case, the amplification is either left on a maximum level, as is shown by the dotted horizontal line in FIG. 4a, or the amplification is lowered to 0 in order to "turn off", so to speak, the push-pull signal for such a case. Another possibility is to decrease the amplification factor in advance, as is shown by the curved dashed line that then reaches the vertical dashed line, to go into a certain compression at values of maybe 0.6 or 0.7, to go into an amplification of 0 dB at a value of 0.8 or at values of larger than 0.8 but smaller than 1.

On the other hand, such a measure is not required for the negative quadrant of the mapping function of FIG. 4a. Here, it is advantageous to monotonously increase the attenuation, i.e. the amplification with an amplification value of less than 1, up to a maximum value of, in this case, −10 dB for a maximum dissimilarity, i.e. the two channel signals being of inverse phase. It is to be noted that the range between −10 dB and +10 dB represents an embodiment, however, other ranges may be used, such as between −20 dB and +20 dB or −10 dB in the negative range and +5 dB in the positive range, etc.

Figure 4B:
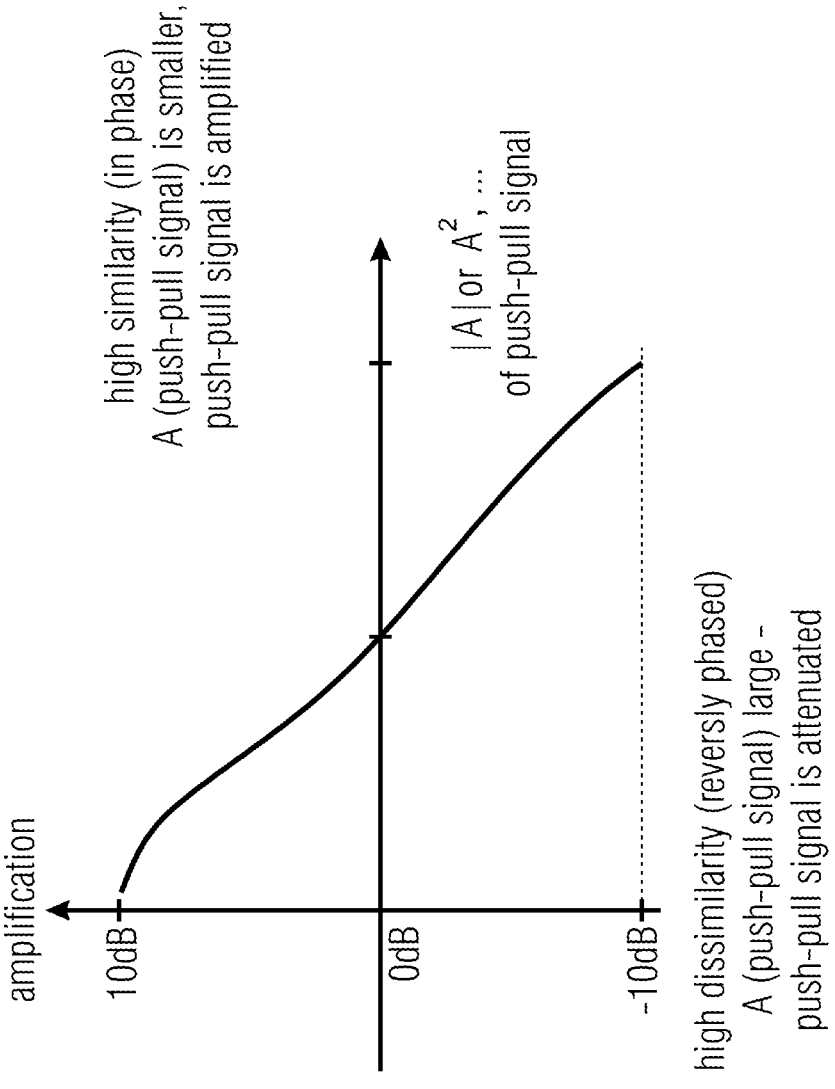
FIG. 4b shows an amplification function in dependence of an amplitude-related characteristic of the push-pull signal.

In an alternative embodiment of the present invention, the adjustment value is not determined on the basis of the channel signals 1001, 1002, but on the basis of the push-pull signal 1011, as is illustrated by the dotted lines from the push-pull signal 1011 to the controller 1020 in FIG. 1. Here, a level, an amplitude, or another amplitude-related quantity, such as the magnitude of the amplitude, the square of the amplitude, or the third power of the amplitude, is captured as an approximation of the loudness, etc., of the push-pull signal 1011. Depending on this level, the amplification is adjusted in order to select a large amplification in case of a low level, or a low amplitude of the push-pull signal, and to use an attenuation, or an amplification with an amplification value of less than 1, in case of a high level of the push-pull signal. FIG. 1b shows only as an example a situation in which the amplification range is illustrated, again as in FIG. 4a, between +10 dB and −10 dB. In addition, FIG. 4b again shows a certain "compression" of the amplification that decreases to very small levels of the push-pull signal, or a very small amplitude-related quantity, and may be set to 0 in case of very small values, or may be adjusted in any other way to avoid a large generation of artifacts by amplification of mostly noise. A high dissimilarity of the two channel signals will lead to a very high level of the push-pull signal, which is why the push-pull signal is attenuated, as is illustrated in FIG. 4b for the value of −10 dB. On the other hand, when forming the push-pull signal, a high similarity occurring when the two channel signals are in phase leads to a very small push-pull signal so that the push-pull signal is amplified. Between the range of the maximum and the minimum amplification, there is again an advantageously monotonous range that may, to some extent, also be linear. However, on the other hand, other monotonous ranges may be used that are in portions squared, cubic, or have a progression that is monotonous in portions, however, not necessarily completely smooth. Depending on the implementation, the amplification-similarity mapping function may be stored in a look-up table in the controller 1020 of FIG. 1, or may be calculated by using a function with a quantitative similarity value as an input quantity and the adjustment value 1035 as an output quantity. Alternative possibilities that differ from a table or a function can also be used.

Figure 2:
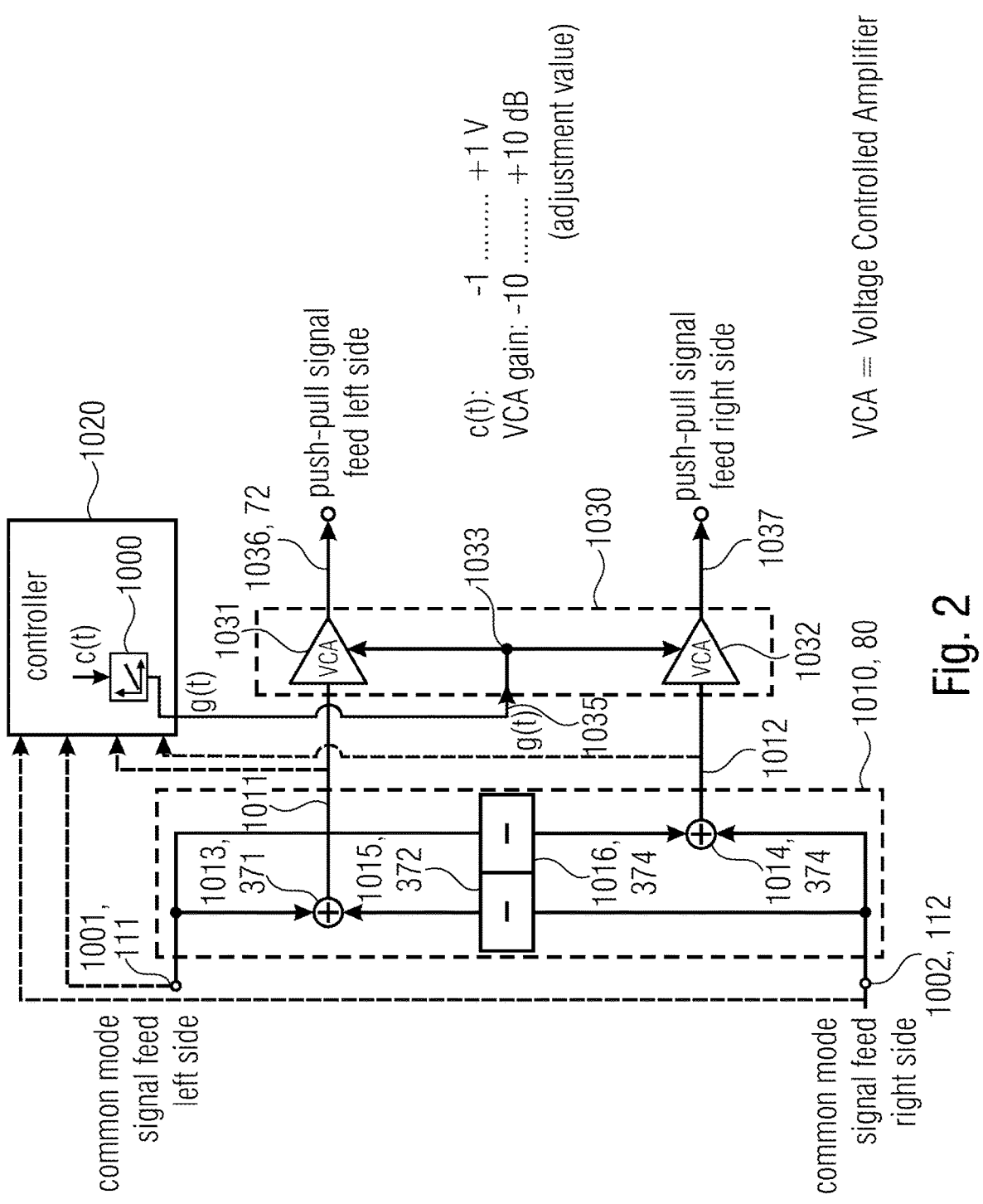
FIG. 2 shows an apparatus for generating a control signal according to a second embodiment with two amplified push-pull signals for a first or left and a second or right push-pull signal feed.

FIG. 1 shows a general implementation of the present invention that can be used if only a single control signal for a single sound transducer is to be calculated. FIG. 1 further shows a base implementation in which further push-pull signals for further loudspeakers may be calculated. Such a special implementation for the calculation of two push-pull signals, i.e. a push-pull signal for a left side and a push-pull signal for the right side, for example, is illustrated in FIG. 2. In FIG. 2, in a common mode signal feed, a left channel signal is fed in as an example for the first channel signal 1001, also having the reference numeral 1011 in subsequent illustrations. Furthermore, in case of a further common mode signal feed, a right signal 1002, or 1012, may be fed in.

The push-pull signal generator 1010, 80 is illustrated with a dashed line and includes an adder 1013, or 371, a further adder 1014, or 374, and two polarity reversal stages 1015, 372, or 1016, 374, respectively. This achieves calculating a first push-pull signal 1011 as a difference signal from the left channel signal and the right channel signal and generating a further push-pull signal 1012 from the difference between the right channel and the left channel, both of which are input into the controllable amplifier 1030, which includes a first individual amplifier 1031 for the left, or first, push-pull signal, and which includes a second individual amplifier 1032 for the second, or right, push-pull signal 1012. The amplifier 1030 has an input for the adjustment value g(t) that may in this case be a voltage value derived from a signed value c(t) of the normalized cross-correlation function delivering a value range of −1 und +1. The amplifiers 1031, 1032 obtain the same adjustment value via the branching point 1033 and are advantageously configured as voltage-controlled amplifiers. For the given similarity value range between −1 und +1 advantageously converted into driver voltages, i.e. into values with the dimension volt (V), they deliver an amplification of between −10 dB und +10 dB. In the embodiment shown in FIG. 2, the controller 1020 internally calculates the value c(t) of the advantageously used normalized cross-correlation function and converts this value via a mapping 1000 into the corresponding amplification value g(t) that is provided to the amplifier 1030 via the connection 1035. Preferably, this value is given to a branching point 1033 and is forwarded equally to the two symbol amplifiers 1031, 1032. However, alternative different amplification values may be used for the different signals, however, wherein it is advantageous to use the same adjustment value for both differences.

Depending on the implementation, individual amplifiers 1031, 1032 may be configured to obtain a special voltage value, a special current value, or a special digital value as the adjustment value. In such a case, the controller 1020 is configured to convert a corresponding similarity value into the voltage value, current value, or digital value required by the amplifiers 1031, 1032 by using the table 1000. In alternative embodiments, the controllable amplifier 1030 may be configured such that it already includes a conversion by means of a table 1000. Then, with respect to the terminology of the present invention, this conversion is to be considered as being part of the controller. Thus, it is to be noted that the controller 1020 and the amplifier 1030 not necessarily have to be separate physical elements, or semiconductor elements, or separate entities, but that the definitions of these elements are functional definitions.

Finally, the controllable amplifier 1030 provides two push-pull signals, i.e. a first signal 1036, 72 for the left side and a second signal 1037 for the right side.

Figure 3:
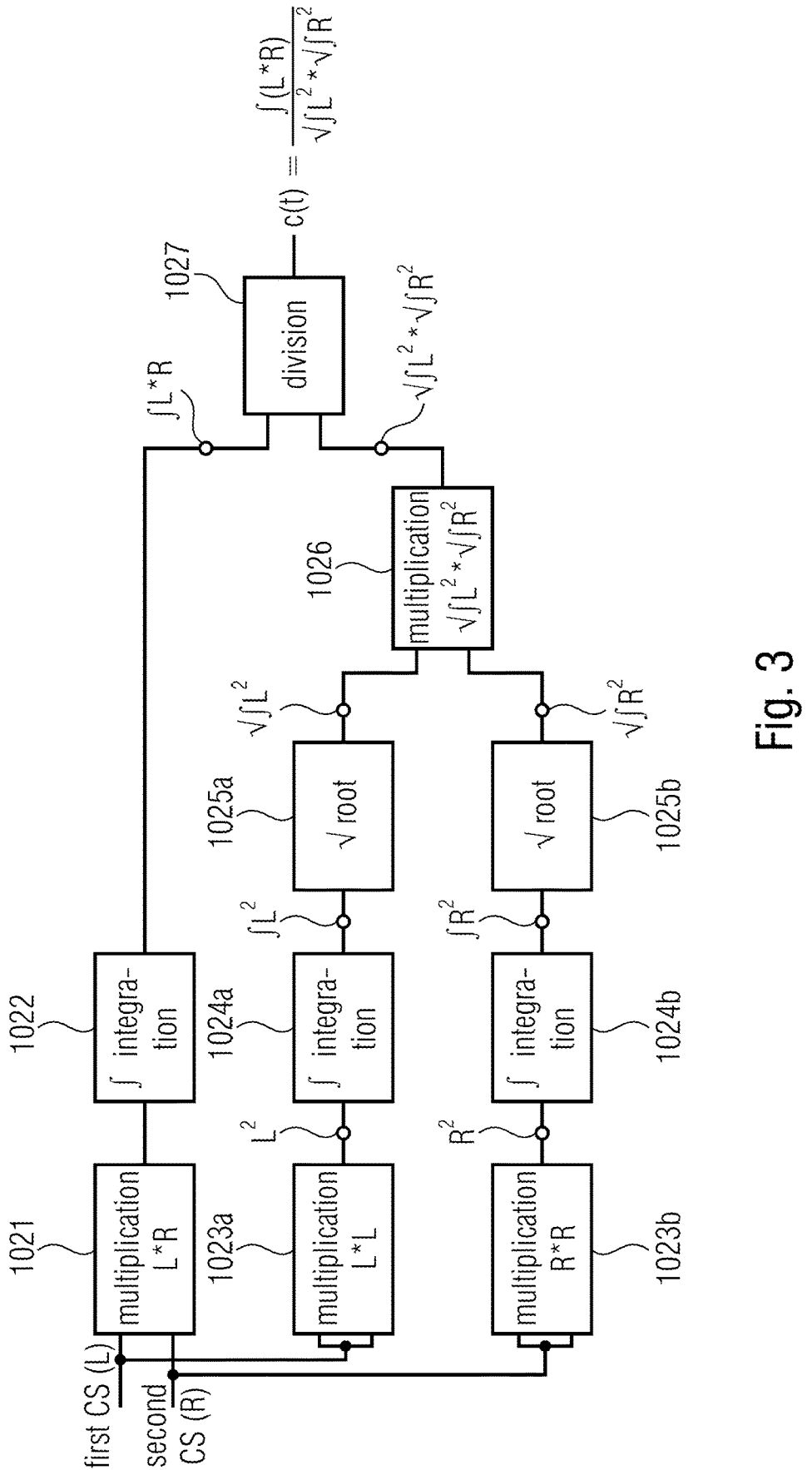
FIG. 3 shows an advantageous embodiment of the controller of FIG. 1.

FIG. 3 shows an advantageous embodiment for the calculation of the normalized cross-correlation function as carried out in the controllable amplifier 1030 to obtain the correlation value c(t) that is a dimensionless quantity and that is converted into an adjustment value required for the amplifier 1030 according to the mapping rule 1000. In particular, the implementation of the controller 1020 of FIG. 3 includes a first multiplier 1021 for multiplying the first channel signal, e.g. the left channel signal, and the second channel signal, e.g. the right channel signal. An integrator 1022 feeding a first input of a division element, or divisor 1027, is connected downstream of the multiplier 1021. In this implementation, the controller additionally includes a further multiplier 1023a for multiplying the left channel with itself, and a downstream integrator 1024a that is in turn followed by a root element 1025a to feed a first input of a multiplier 1026. In addition, there is a similar branch with a multiplier 1023b, an integrator 1024b, and a root element 1025b for the right channel to feed a second input of the multiplier 1026. On the output side, the multiplier 1026 is connected to a further input of the divisor 1027, and the divisor finally provides the value for the normalized cross-correlation function, as is illustrated in FIG. 3. Using the normalized cross-correlation function is advantageous in that it is independent of the volume set by the user, i.e. the level finally generated by the sound generators, or the sound generator system that may include one or several individual sound transducers, or loudspeakers. In the calculation of the normalized cross-correlation function, due to the denominator, a normalization according to the level of the left and the right channel signal is carried out in the divisor, being independent of a volume setting.

In embodiments, the controller 1020 advantageously comprises the following features: a multiplier 1021, 1023a, 1023b for multiplying the first channel signal and the second channel signal to obtain a first multiplication result, or for multiplying the first channel signal with itself to obtain a second multiplication result, or for multiplying the second channel signal with itself to obtain a third multiplication result; an integrator 1022, 1024a, 1024b for integrating the first multiplication result to obtain a first integration result, or for integrating the second multiplication result to obtain a second integration result, or for integrating the third multiplication result to obtain a third integration result; a root former 1025a, 1025b for forming a root from the second integration result to obtain a first root result, or for forming a root from the third integration result to obtain a second root result; a further multiplier 1026 to multiply the first root result with the second root result to obtain a fourth multiplication result; and a divisor 1027 for dividing the first integration result by the fourth multiplication result to obtain a quantitative similarity value, the controller 1020 being configured to identify the adjustment value from the quantitative similarity value 1000.

Depending on the implementation, e.g., by means of the circuit of FIG. 3 or another way, an automatic continuous adjustment of the controllable amplifier up to a sample-precise control, i.e. with respect to one control per sample value, can be carried out. However, to avoid artifacts, it is advantageous to carry out filtering, and in particular low-pass filtering, of adjustment values to achieve a change of amplification that is not too fast.

On the other hand, a further temporal averaging is achieved by setting, so as to calculate the cross-correlation function if it is used, certain integration times for the temporal integrations required there, across whose length the "sluggishness" of the amplification control can be adjusted. Depending on the implementation, a cross-correlation value, or a similarity value, may even be determined for an entire audio piece, and this similarity value is then maintained over the entire piece. Even in such a case, an overall integral similarity of the two channel signals the push-pull signal is determined from is considered so that a signal-adaptive, albeit temporally very slow, amplification adjustment is carried out, or even one that is determined for a special signal.

In such embodiments, the controller 1020 is configured to determine the adjustment value in a variable manner across time for the multi-channel audio signal on the basis of a starting value. Alternatively or additionally, the controller 1020 is configured to determine the adjustment value on the basis of a temporal range of the multi-channel audio signal, extending before a current point in time or after a current point in time, wherein the range before the current point in time or the range after the current point in time includes a timespan between 1 ms and 2 minutes, or, even more advantageously, between 0.1 s und 15 s, or wherein the range includes an entire piece.

FIG. 17 shows an illustration of an extended multi-channel audio signal 1040 with one or several adjustment values 1051, or 1035, in metadata 1050 of the extended multi-channel audio signal. Here, the metadata is assigned to a portion of the first channel signal 1001 and the second channel signal 1002. The portion may be the entire piece. Then, for the entire piece, there is a starting value for the adjustment value that may be used in an unchanged way in the reproduction of the entire piece by the apparatus of FIG. 1, or that is only used as a starting value if the apparatus of FIG. 1 may also perform an analysis to replace the starting value after a certain time between 1 ms and 2 minutes or, more advantageously between 0.1 s und 15 s by a new value.

Alternatively, FIG. 17 shows a section of the extended multi-channel audio signal 1040 representing the adjustment value or several adjustment values for certain channel pairs for one or several signal frames of the audio signal. Then, the controller 1020 of FIG. 1 will read out current adjustment values 1035, or 1051, and provide them to the amplifier 1030 to achieve a temporally modified control without an actual analysis of the signals occurring in FIG. 1.

Figure 18:
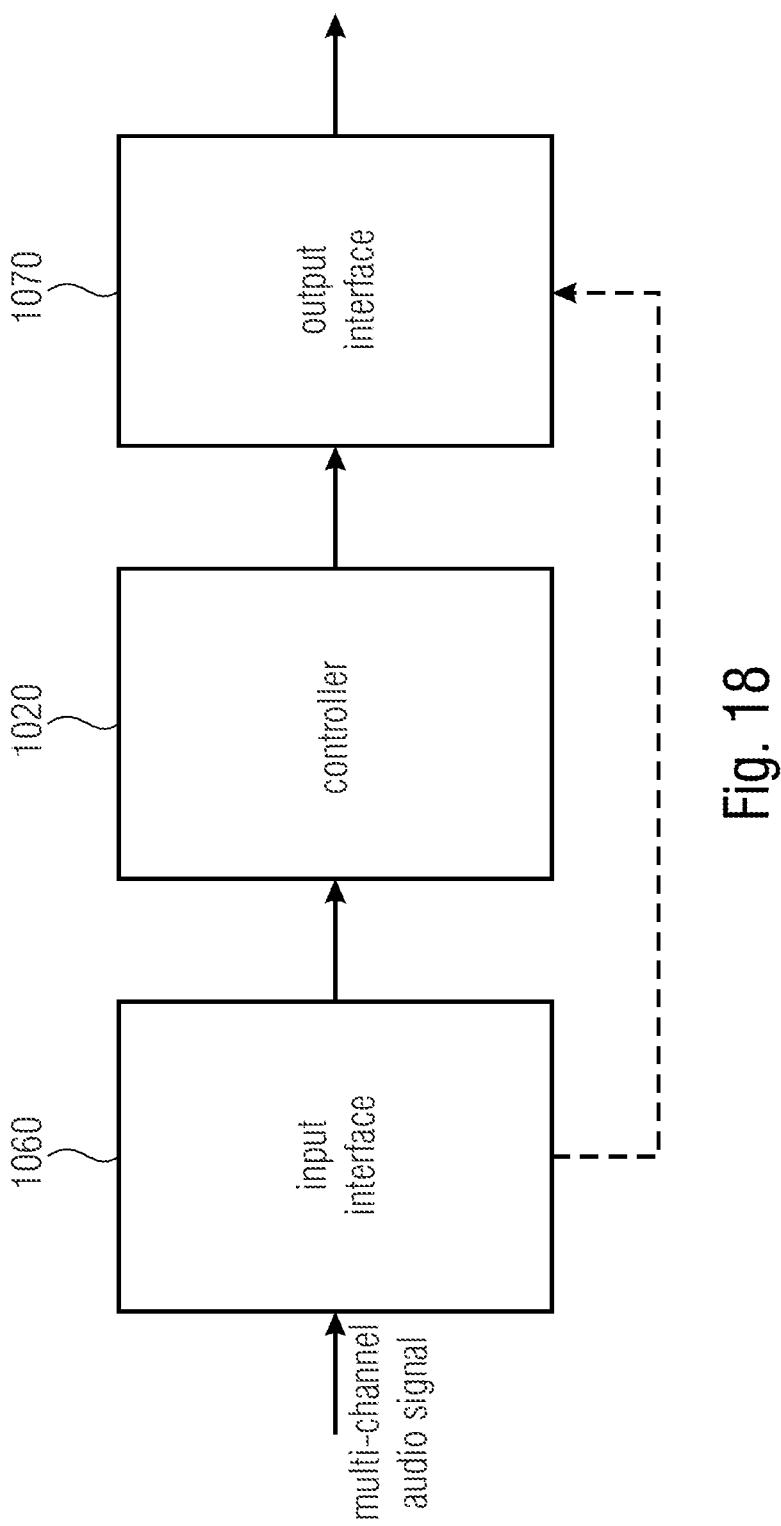
FIG. 18 shows an illustration of an apparatus for generating an extended multi-channel audio signal with one or several adjustment values in the metadata of FIG. 17.

FIG. 18 shows an illustration of an apparatus for generating an extended multi-channel audio signal (1040). The same includes an input interface 1060 for obtaining the multi-channel audio signal comprising a first channel signal 1001, 71, 306 and a second channel signal 1002, 308, a controller (1020) for determining an adjustment value for an amplification or attenuation of a push-pull signal (1011) derivable from the first channel signal (1001, 71, 306) and the second channel signal (1002, 308), wherein the controller 1020 is configured to determine a first adjustment value in case of a first similarity between the first channel signal and the second channel signal, and to determine a second adjustment value in case of a second similarity between the first channel signal and the second channel signal, wherein the first similarity represents a lower similarity than the second similarity, wherein the first adjustment value represents a smaller amplification than the second adjustment value or a larger attenuation than the second adjustment value.

The apparatus in FIG. 18 further includes an output interface 1070 for outputting the extended multi-channel audio signal 1040 including the first channel signal 1001, 71, 306, the second channel signal 1002, 308, and metadata 1050, wherein the metadata 1050 comprises the adjustment value 1051. The controller 1020 in FIG. 18 may be configured similarly to the controller 1020 in FIG. 1. However, it will perform actual signal analysis to determine the adjustment value 1035, or 1051. For example, the controller 1020 of FIG. 18 may be configured as is described and defined with reference to FIGS. 1, 2, 3, 4a, 4b, 5a, 5b and in the claims, even if the claims relate to the apparatus for generating a control signal. In contrast thereto, in case of the apparatus in FIG. 18, the adjustment value 1035, or 1051, is not applied to a controllable amplifier as in FIG. 1, but is introduced by the output interface 1070 into the metadata 1050 of the extended multi-channel audio signal 1040 or is added as individual metadata.

Figure 5A:
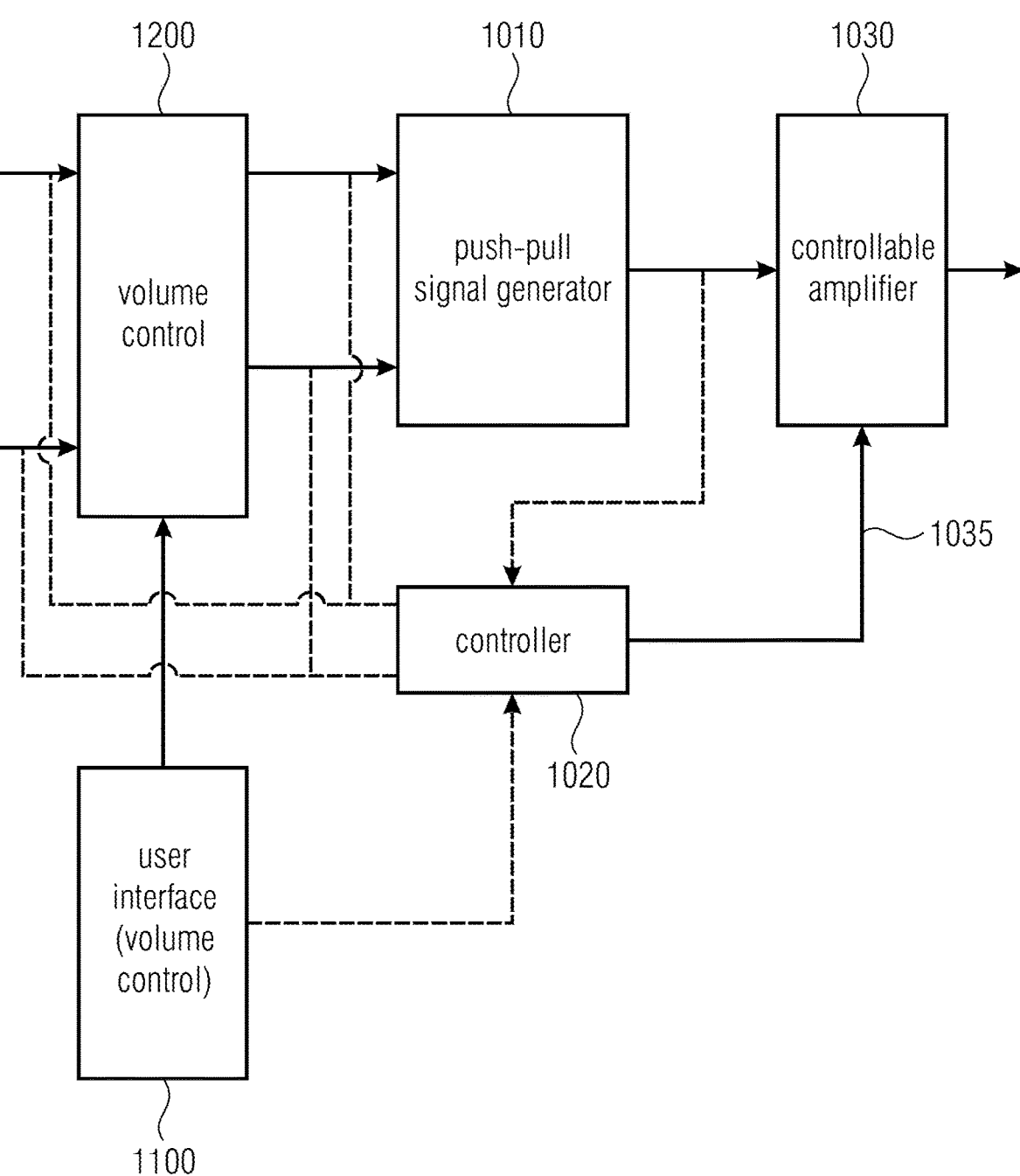
FIG. 5a shows an implementation of the present invention in a volume adjustment prior to the push-pull signal generation.

For example, volume adjustment may be carried out via a user interface 1100, as is shown in FIG. 5a, and by a volume adjuster 1200 controlled by the user interface 1100. Due to the implementation as shown in FIG. 3, in which the similarity value is calculated on a normalized basis, the controller 1020, when it uses the channel signals at the output of the volume adjuster 1200 for the similarity calculation, does not have to have any information about the actual volume adjustment that a user has carried out at a volume control of the user interface 1100. The same applies when the channel signals are used at the input of the volume adjuster 1200, as is illustrated by dashed lines in FIG. 5a. However, if the controller 1020 is operated such that it does not perform an adjustment of the control on the basis of the analysis of the two channel signals before or after the volume adjuster 1200, but on the basis of the push-pull signal itself, as is illustrated by the dashed line between the output of the push-pull signal generator and the controller 1020, the controller further requires, so as to obtain a correct amplification adjustment, the current amplification value from the user interface 1100, as is in turn illustrated by the dashed line between block 1100 and block 1020 of FIG. 5a.

Figure 5B:
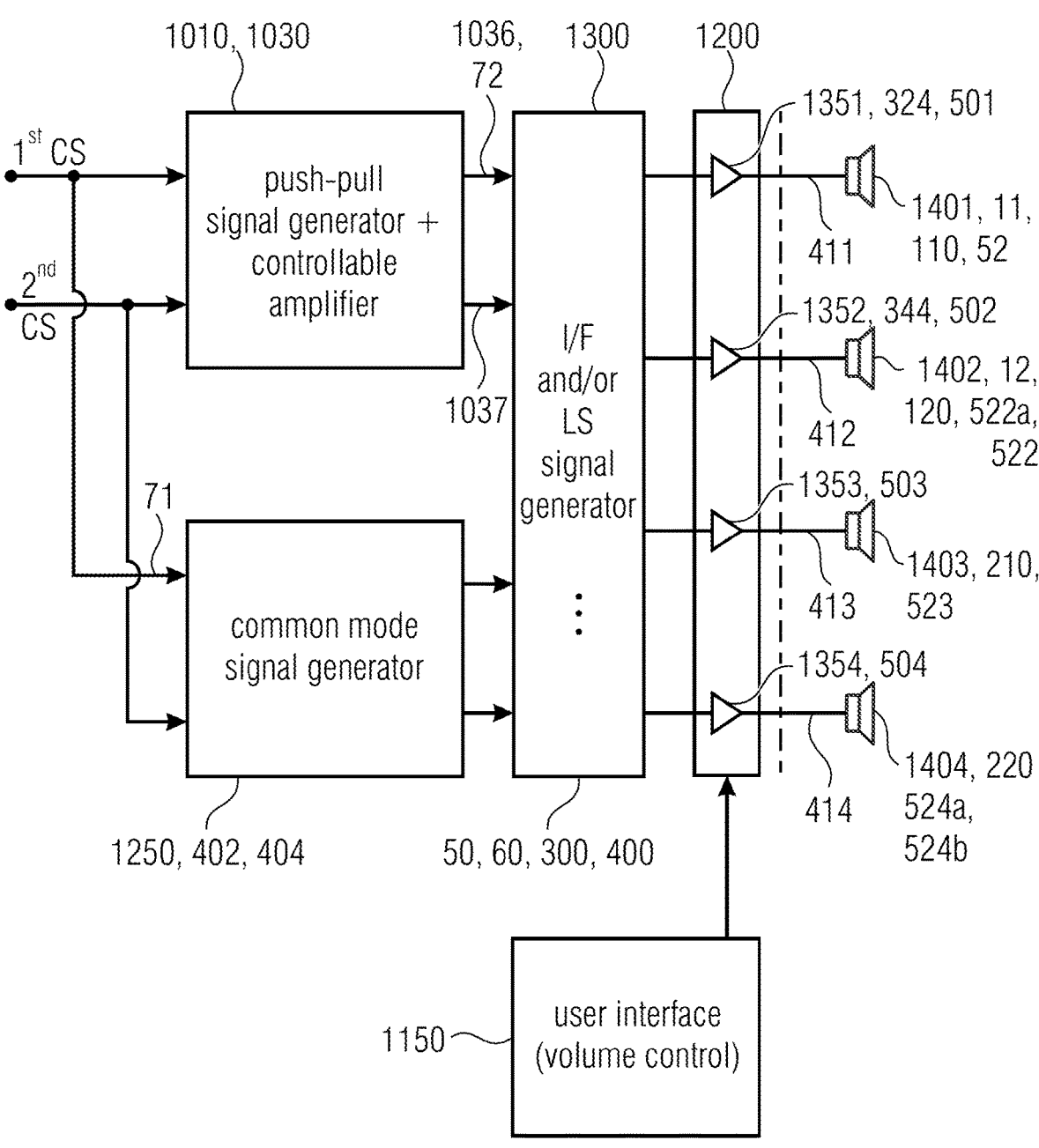
FIG. 5b shows an implementation of the present invention in a volume adjustment after the push-pull signal generation and the push-pull signal amplification.

In an alternative embodiment shown in FIG. 5b, the volume adjustment is performed by the volume adjuster 1200 only at the output of the system, i.e. by amplifiers for each control signal finally obtained. Then, the determination of the amplification value for the controllable amplifier may follow regardless of whether it takes place on the basis of the channel signals or on the basis of the push-pull signal or the several push-pull signals, since all signals are available in the normalized range, and the actual volume adjustment is only performed directly in front of the actual sound transducers via the volume adjuster 1200 illustrated as a controllable amplifier at the respective outputs for the individual sound transducers, or loudspeakers.

In particular, besides the block of the push-pull signal generator and the controllable amplifier that unites the two blocks 1010, 1030, FIG. 5b also shows a common mode signal generator specified with the reference numeral 1250, 402, 404. The push-pull signal generator provides two push-pull signals 1036, 1037 amplified according to the invention, and the common mode signal generator 1250, 402, 404 provides two common mode signals that, depending on the implementation, may be the channel signals so that the common mode signal generator 1250 just has a conveyance function or is not present at all. Alternatively, the two common mode signals may be specially processed common mode signals, e.g., that have been subjected to a bandwidth extension or any other functionality. In particular, the two push-pull signals amplified according to the invention and shown at 1036 and 1037, as well as the common mode signals at the output of block 1250, are provided to an interface, or a loudspeaker signal generator 1300, wherein block 1300 is also referred to in later drawings as block 50, 60, or as block 300, 400. Depending on which actual sound generation is carried out by the four output-side loudspeakers 1401, 1402, 1403, 1404, the amplified push-pull signals 1036 are fed to the amplifier stage 1200 by the block 1300 acting as the output interface, or the push-pull signals and the common mode signals are combined and processed to obtain the actual control signals.

Figure 16:
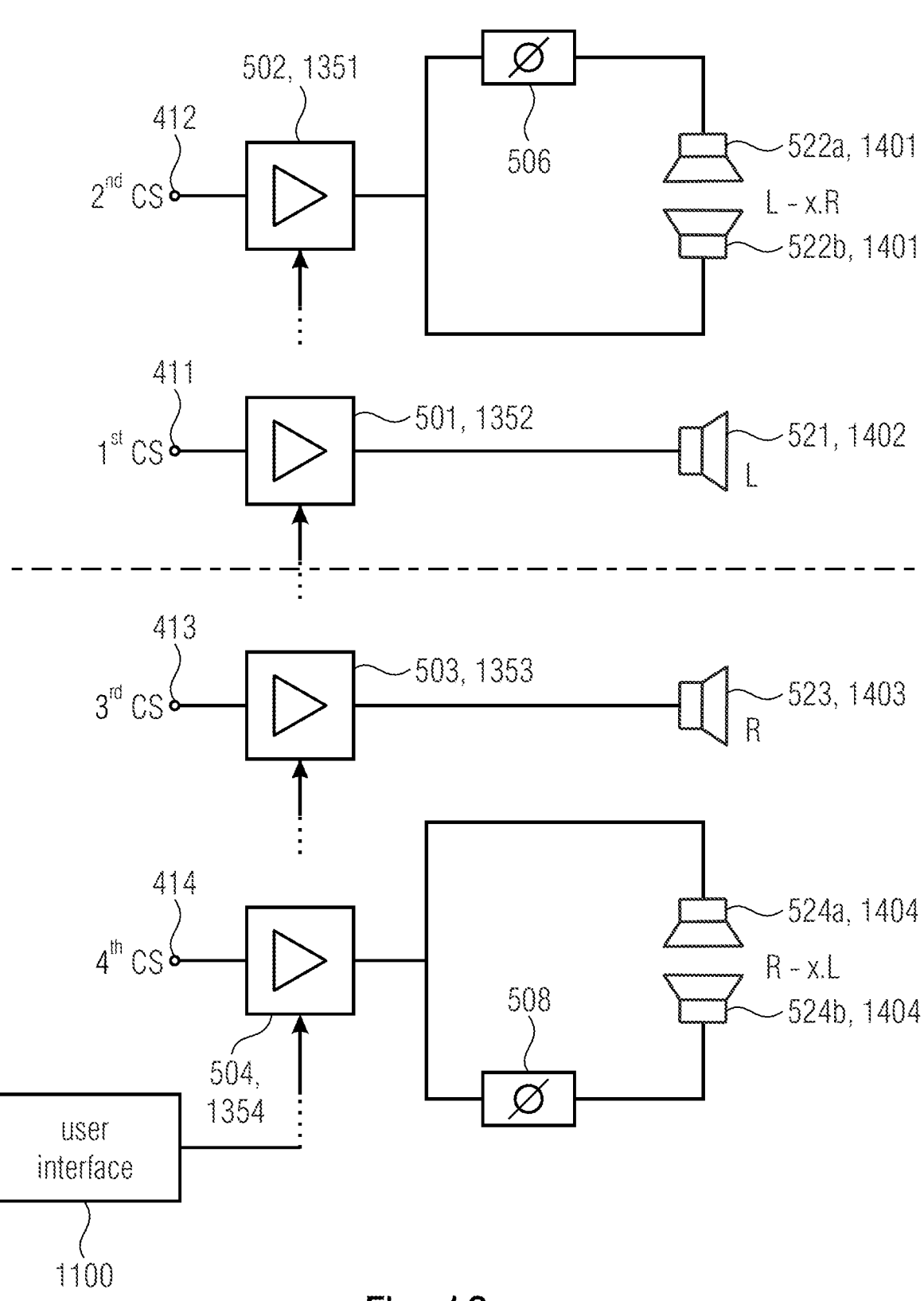
FIG. 16 shows a schematic illustration of the loudspeaker side of a loudspeaker system for a two-channel output format with different loudspeakers, or loudspeaker systems, for the translational sound field and the rotatory sound field.

Thus, FIG. 16 shows an implementation in which the control signals are sent to separate loudspeakers, or loudspeaker systems, reproducing a translational sound, such as for the loudspeakers 521, 523, and further reproducing a rotatory sound, such as for the loudspeaker system 1401 including the transducers 522a, 522b, wherein this loudspeaker system is provided for the left side, and wherein the push-pull signal is further introduced on the right side to feed the loudspeaker system 1404 consisting of the individual transducers 524a, 524b. In such a case, block 1300 is configured as an interface, since the output signals 1036, 1037 correspond to the control signals 412, 414 of FIG. 16, and since the common mode output signals of the block 1250, 402, 404 correspond to the control signals 412, 414 of FIG. 16.

Furthermore, the user interface 1100 of FIG. 5*b* is illustrated in FIG. 16. Alternatively, the user interface 1100 may possibly be implemented, as is illustrated in FIG. 5*a*, such that the amplifiers in block 1200 are in this case the amplifiers that are directly arranged in the loudspeaker boxes, or loudspeaker systems, and that have a fixed amplification independent of the user interface.

Figures 6A, 6B, 6C:
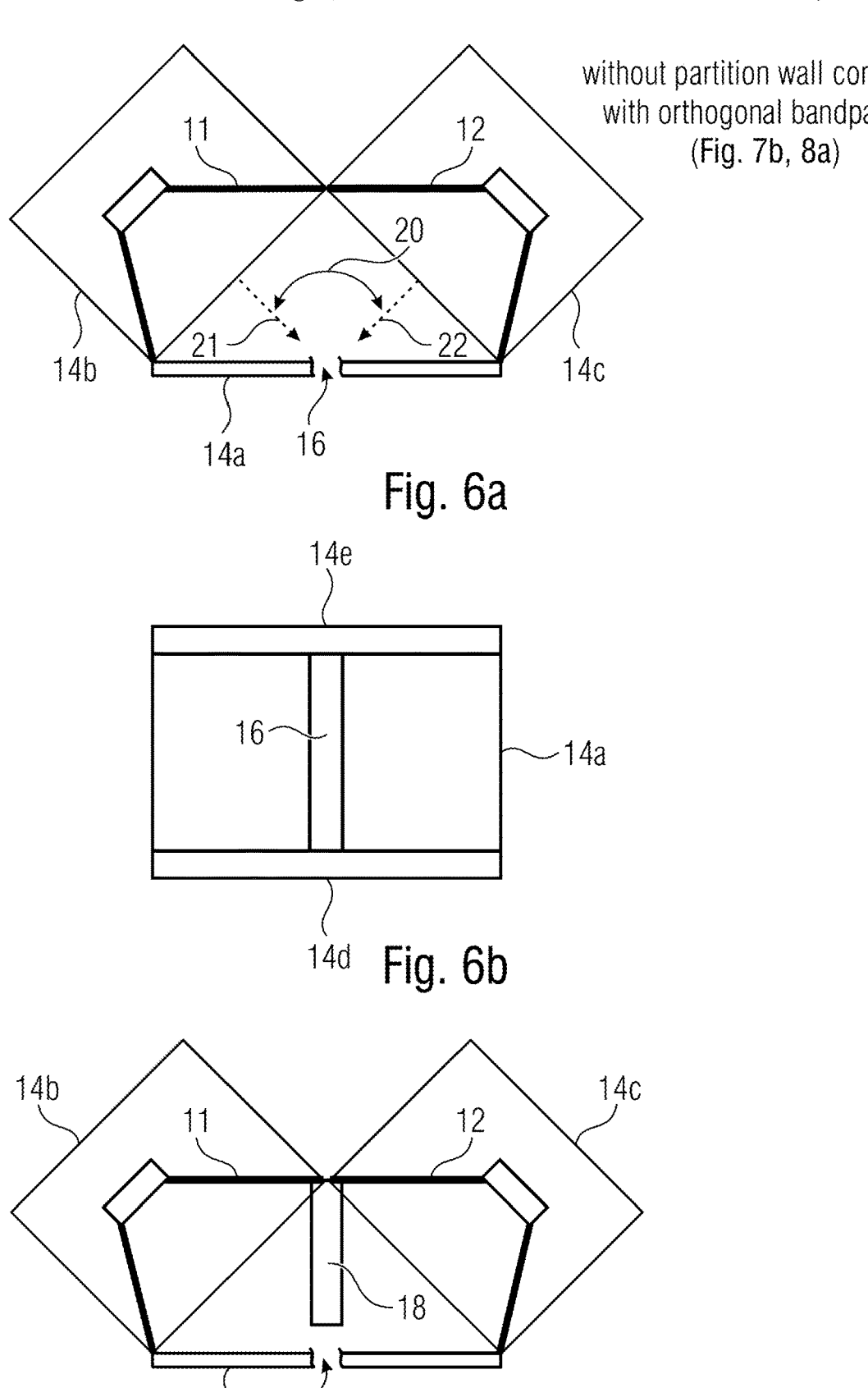
FIG. 6a shows a sectional view of a loudspeaker with two sound generators.
FIG. 6b shows a frontal view of the loudspeaker.
FIG. 6c shows a sectional view of the loudspeaker of FIG. 6a having an additional partition wall.
Figure 10:
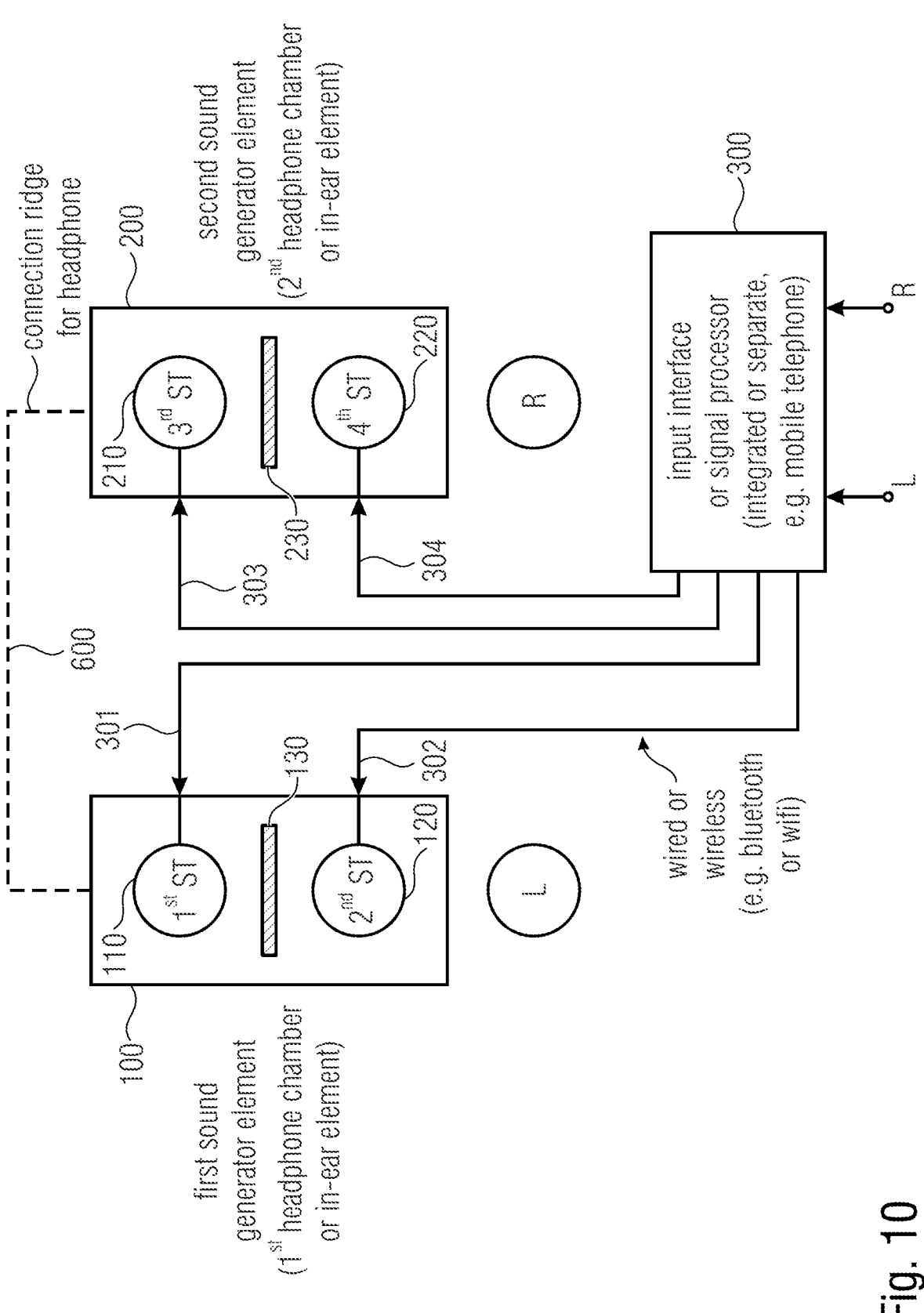
FIG. 10 a schematic illustration of a sound generator wearable at a head.

However, if the sound generation is achieved by generating the translational sound and the rotary sound via correspondingly controlled and similarly configured sound transducers, such as illustrated for the loudspeakers in FIGS. 6*a* to 6*c*, or as will be illustrated for a headphone, or earphone, in FIG. 10 and the subsequent figures, block 1300 will operate as a loudspeaker signal generator 50, 60, 300, 400 that calculates two control signals for the two transducers 1401, 1402 for one side from the amplified common mode signals 1036, 1037, wherein these control signals may further contain the common mode signals as output from block 1250, namely by using a corresponding combination stage as will be illustrated with reference to FIGS. 7*a* to 8*b* and 11 to 13.

Subsequently, an advantageous implementation of the present invention will be illustrated in connection with loudspeaker systems as schematically illustrated in FIGS. 6*a* to 6*c*, and described in the unpublished German patent application 102021203632.5, herein incorporated by reference in its entirety. A push-pull signal and a common mode signal for one channel, e.g. for a left channel, a right channel, a center channel, etc., are combined and led to a sound generator comprising two or several individual sound transducers such as the individual sound transducers 11 or 12.

FIG. 6*a* shows a loudspeaker having a first sound generator 11 with a first emission direction 21 and a second sound generator with a second emission direction 22. Both sound generators 11, 12 are arranged with respect to each other such that the two emission directions 21, 22 intersect in a sound chamber and have an intersection angle 20 that is larger than 60° and smaller than 120°. In the advantageous embodiment of FIG. 6*a*, the two sound generators are arranged such that the emission directions of the sound generators intersect at an angle of advantageously 90°, or in an advantageous range between 80° and 100°. However, even if the sound generators are arranged such that the angle α is larger than an angle of 60°, thus, if the emission directions become more parallel, or if the angle 20 in FIG. 6*a* increases to up to 120°, i.e. if the emission directions of the sound generators are less parallel or directed more towards each other, there is a good sound emission characteristic of the loudspeaker.

The sound chamber is formed by the area between the membrane of the first sound generator 11 and the membrane of the second sound generator 12, and a frontal wall of the housing, indicated with 14*a*. A gap 16 configured to enable gas communication between the sound chamber within the loudspeaker and a surrounding area of the loudspeaker is provided in the housing, or in the frontal wall of the housing. In particular, in the embodiment shown in FIG. 6*a*, the first sound generator 11 is accommodated separately with the housing 14*b*. In addition, the second sound generator 12 is in turn accommodated with a separate housing 14*c*. This ensures that the rear sides of the two sound generators 11, 12, i.e. the sides of the sound generators facing away from the sound chamber, do not communicate with each other, since a gas-tight seal is provided where the two sound generators touch opposite the gap. In addition, the sound generators themselves are sealed tight with respect to their rear side, apart from air openings required for normal loudspeakers, however, which are not critical for the sound generation, but just ensure pressure equalization so that the corresponding membrane of the sound generator can move freely.

FIG. 6*b* shows a front view of the loudspeaker, where the gap 16 is illustrated in the front view, wherein the entire housing, or the sound chamber, is enclosed by a lid 14*e* and a bottom 14*d*. Reference numeral 14*a* indicates the frontal wall in which the gap 16 is arranged. FIG. 6*b* shows an embodiment of a loudspeaker that is similar to FIG. 6*a*, however, in which a partition wall 18 having a partition wall end near the gap 16 and connected at the other side, i.e. at the side facing away from the gap, to the housing 14*b* of the first sound generator and the housing 14*c* of the second sound generator is arranged in the sound chamber so that communication from the first sound generator to the second sound generator takes place only around the area of the partition wall end, i.e. in the area in which the gap 16 is arranged as well.

In embodiments of the present invention, the partition wall 18 is provided if the signal generation for the push-pull signal for the respective sound generator is carried out such that the frequency content of the two push-pull signals is essentially equal. In such an implementation, interleaved band-passes are not used. In the embodiment in FIG. 6*a*, on the other hand, a partition wall is not provided. This embodiment of the loudspeaker is advantageously combined with the push-pull signal generation in which the two push-pull signals for the two sound generators are generated by using interleaved band-passes so that the frequency content of the one push-pull signal is essentially interleaved with the frequency content of the other push-pull signal. However, it is to be noted that interleaved is to be understood as approximately interleaved, since band-pass filters comprise overlaps between neighboring channels because band-pass filters with a very steep edge cannot be implemented, or only with a very great effort. A band-pass filter implementation as schematically illustrated in FIG. 7*c* is also regarded as an interleaved band-pass filter implementation, even though there are overlap areas between the different band-pass filters, however, which are attenuated with respect to the frequency content at the center frequency of the respective band-pass filter by at least 6 dB and advantageously by at least 10 dB, for example.

While the push-pull signal generation without interleaved band-pass filters uses a high-pass filter with a cut-off frequency of 150-250 Hz and advantageously 190 to 210 Hz, it is advantageous to not use high-pass filtering when using the interleaved filters, but to also use the low frequency range for generating the two different push-pull signals.

In embodiments of the present invention, the gap 16 in the frontal area 14 is configured such that the frontal area is separated, in a top view, into a left part arranged left of the gap in FIG. 6*b*, and a right part. Preferably, the division is done in the center so that the gap extends in the frontal area, in the frontal dimension of the sound chamber, centrally from top to bottom, however, the deviation from the center may deviate in a tolerance range of +/−20° from the right dimension of the right part perpendicular to the gap. This means that the gap can be shifted towards the right or the left by 20% of the dimension of the right and left parts if the gap were to be arranged in the center.

In addition, as is shown in FIG. 1*b*6*b* the gap is advantageously configured completely from top to bottom. However, the gap is not configured in the lid and in the bottom. In contrast, these two elements are configured continuously without an opening. In embodiments, the gap has a width of between 0.5 cm and 4 cm. Preferably, the dimension of the gap is in a range of between 1 cm and 3 cm, and particularly advantageously between 1.5 cm and 2 cm.

The partition wall 18 shown in FIG. 6*c* is configured to divide the sound chamber into a first region for the first sound generator, and into a second region for the second sound generator, wherein an end of the partition wall is located close to the gap, but separated from the gap, so that the first region for the first sound generator and the second region for the second sound generator is in gas communication with the surrounding area of the loudspeaker through the gap. In addition, the first region and the second region are also in gas communication because the partition wall 18 does not extend completely up to the gap. At the other end, the partition wall is connected either to the first or the second sound generator, as is shown in FIG. 6*c*, for example. Alternatively, however, the partition wall may be arranged between the first and the second sound generator so that the first and the second sound generator do not contact each other; however, they are connected to the partition wall such that the gas communication is discontinued in the "rear" region of the partition wall. In embodiments, the height of the first housing 14*b* and the height of the second housing 14*c* are between 10 cm and 30 cm, and particularly advantageously between 15 cm and 25 cm. In addition, the width of the first housing and the width of the second housing are between 5 cm and 15 cm and particularly advantageously between 9 cm and 11 cm. Preferably, the depth is in a range of between 5 cm and 15 cm, and particularly advantageously between 9 cm and 11 cm.

Subsequently, on the basis of FIG. 7*a* to FIG. 8*b*, the second and the third aspects of the present invention are explained, i.e. the second aspect with respect to a signal processor separated from the loudspeaker, and the third aspect with respect to an integrated variation in which the loudspeaker is configured to be integrated with the signal processor. In particular, in the embodiment shown in FIG. 7*a*, the loudspeaker includes the signal processor or signal generator 105 configured to drive the first signal generator 11 and the second signal generator 12 with a first signal generator signal 51 and a second signal generator signal 52, respectively. In the embodiment shown in FIG. 7*a*, one amplifier 324 and 344 each is arranged in front of the sound generators 11, 12, respectively. According to the embodiment, these amplifiers may be integrated into the loudspeaker or may be integrated into the signal processor. However, if the signal processor is arranged remotely from the loudspeaker and communicates, e.g., in a wireless manner with the loudspeaker, it is advantageous to arrange the amplifiers 324, 344 in the loudspeaker and to transmit the signals 51, 52, e.g., in a wireless manner via a mobile telephone, as will be illustrated on the basis of FIG. 9, from the signal processor 105 to the loudspeaker, as is exemplarily illustrated in FIG. 6*a*. Furthermore, the controllable amplifier 1030 being adjusted with the adjustment value 1035 is illustrated in the drawing. The amplifier amplifies the push-pull signal to obtain the output signal that has been obtained by amplification or attenuation of the push-pull signal according to the adjustment value.

In an advantageous embodiment, the signal processor includes a combiner 50 configured to overlap a common-mode signal supplied via an input 71 with a first push-pull signal. In the embodiment shown in FIG. 7*a*, this is done through the adder 322. In addition, the combiner is configured to overlap the common-mode signal supplied via the input 71 with a second push-pull signal, which is implemented by the adder 342 in the embodiment shown in FIG.

7*a*. In addition, the sound generator is configured such that the first push-pull signal supplied to the adder 322 and the second push-pull signal supplied to the adder 342 differ from one another. To generate these two push-pull signals, the signal generator includes a push-pull signal generator 60. The push-pull signal generator 60 is configured to obtain a base push-pull signal via an input 72, and to generate the first push-pull signal from the base push-pull signal by using a first push-pull signal processing, exemplarily shown at 326*e* in FIG. 7*a*, and to generate the second push-pull signal by using a second push-pull signal processing, exemplarily shown at 326*f* in FIG. 7*a*.

Figure 7A:
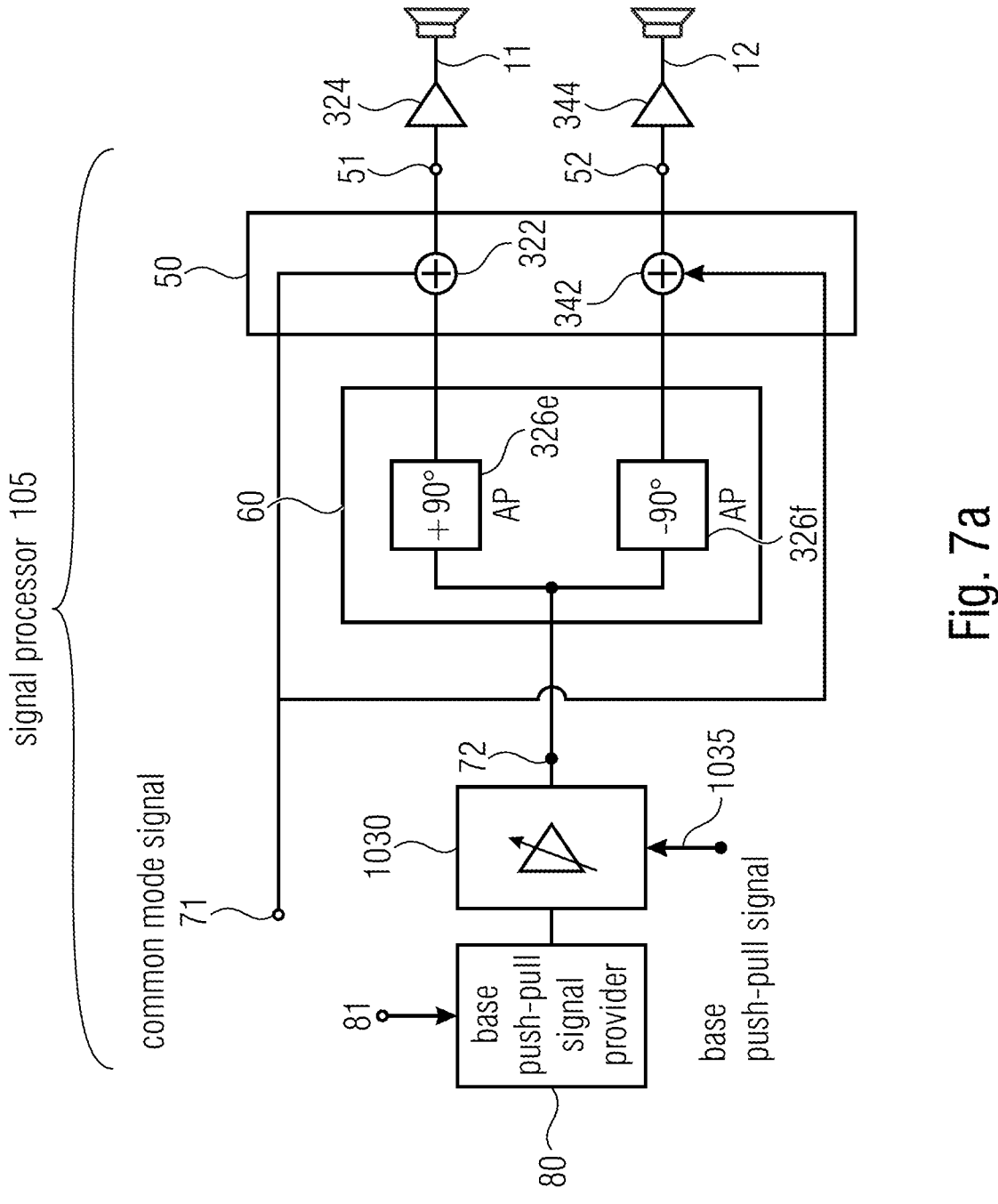
FIG. 7a shows a block circuit diagram of a signal processor for the schematically illustrated sound generator of a loudspeaker of FIGS. 6a to 6c.

The first push-pull signal processing includes all-pass filtering, as is illustrated by "AP" in FIG. 7*a* and in the other figures. In addition, the second push-pull signal processing includes all-pass filtering, or an all-pass filter, as is also illustrated with "AP" in FIG. 7*a* and the other figures. The two all-pass filters 326*e*, 326*f* are configured to achieve a phase shift during the first push-pull signal processing, and to achieve a second phase shift that differs from the first phase shift during the second push-pull signal processing. In embodiments, in the context of the first push-pull signal processing, the phase shift is only +90°, and in the context of the second push-pull signal processing, the phase shift is −90°. This achieves a phase difference of 180° between the two push-pull signals. Alternatively, however, the two push-pull signal processings are configured to achieve a phase shift of between 135° and 225° between the two push-pull signals, wherein, in alternative embodiments, due to the all-pass filters 326*e*, 326*f*, the phase shifts are implemented such that one element generates a positive phase shift, e.g. the element 326*e*, and the other element generates a negative phase shift, e.g. the element 326*f*. Even in such an implementation, which does not necessarily have to have the optimum phase shift of 180° between the two push-pull signals, a certain portion of a rotating sound field is already generated in the sound field. With a phase shift of between 170° and 190° between the two push-pull signals, the efficiency of the generation of the rotating sound field portion is in the best range.

In embodiments, the signal processor is further configured to provide the base push-pull signal for the input 72 of the push-pull signal generator 60. This is achieved by a base push-pull provider 80 that obtains an input signal via an input 81.

In an implementation, in which the rotating sound field has not been recorded separately, the base push-pull signal may be obtained from the side signal of a center-side signal processing. Thus, the base push-pull signal provider is configured to obtain the common-mode signal 71 via the input 81, and any other channel signal, as will be illustrated on the basis of FIG. 8*b*, so as to determine, from a difference of these two signals, the side signal that may then be used directly or may be delayed or attenuated or amplified, according to the implementation.

There are further possibilities for generating a base push-pull signal, wherein a rotating sound field component is generated, since the first push-pull signal and the second push-pull signal are overlapped with the common-mode signal so that the two sound generators 11, 12 in the loudspeaker perform a push-pull signal excitation that can be perceived outside of the gap 16 as a rotating sound field. According to a special generation of the push-pull signal, the rotating sound field will correspond more to the original physical rotating sound field. Thus, it has been shown that a derivation of the push-pull signal from the common-mode signal at a corresponding overlap through the signal combiner 50 already leads to a significantly improved hearing impression compared to an implementation in which the two sound generators are only driven with a common-mode signal and operate in a common mode-manner.

Figure 7B:
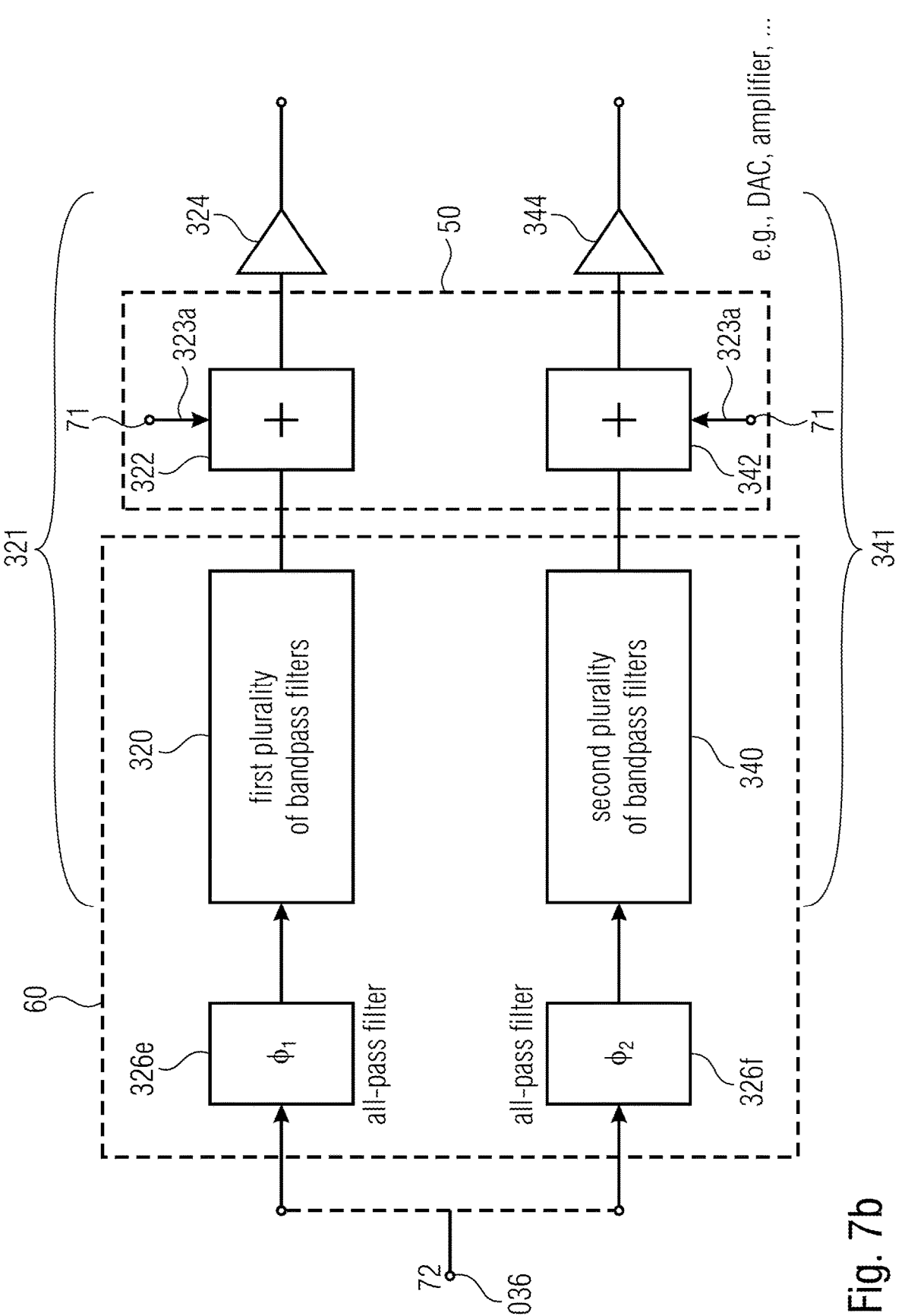
Figure 7C:
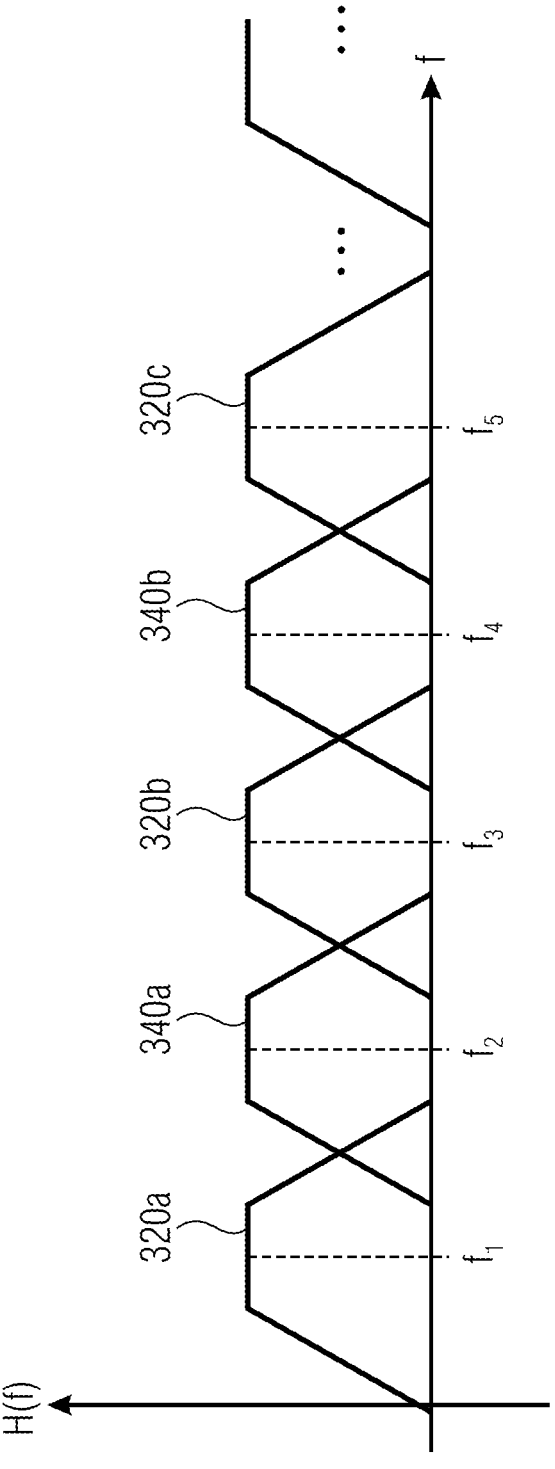
FIG. 7c shows a schematic illustration of the two different pluralities of bandpass filters.

FIG. 7b shows an advantageous embodiment of the push-pull signal generator. Apart from all of the all-pass filters 326e, 326f, which were already described with respect to FIG. 7a and which generate different phase shifts that advantageously have different signs, a first plurality of band-pass filters 320 is provided in the push-pull signal generator for the upper signal path 321, and a second plurality of band-pass filters 340 is provided for the lower signal path, i.e. the signal path 341.

The two band-pass filter implementations 320, 340 differ from each other, as is schematically illustrated in FIG. 7c. The band-pass filter with the center frequency f1, illustrated with respect to its transfer function H(f) in FIG. 7c with 320a, the band-pass filter 320b with the center frequency f3, illustrated with 320b, and the band-pass filter 320c with the center frequency f5 belong to the first plurality of band-pass filters 320 and are therefore arranged in the first signal pass 321, while the band-pass filter 340a, 340b with the center frequencies f2 and f4 are arranged in the lower signal path 341, i.e. they belong to the second plurality of band-pass filters. Thus, the band-pass filter implementation 320, 340 are configured to be interleaved with each other, or they are configured to be interdigital, so that the two signal transducers in one sound generator element emit signals with the same overall bandwidth, but differently in such a way that every second band is attenuated in each signal. This makes it possible to omit the partition ridge since the mechanical partition is replaced by an "electric" partition. The bandwidths of the individual band-pass filters in FIG. 7c are only shown schematically. Preferably, the bandwidths increase from the bottom to the top, in the shape of an advantageously approximated Bark scale. In addition, it is advantageous to divide the entire frequency range into at least 20 bands so that the first plurality of band-pass filters includes 10 bands and the second plurality of band-pass filters also includes 10 bands, which then reproduce the entire audio signal through overlap due to the emission of the sound generators.

Figure 8A:
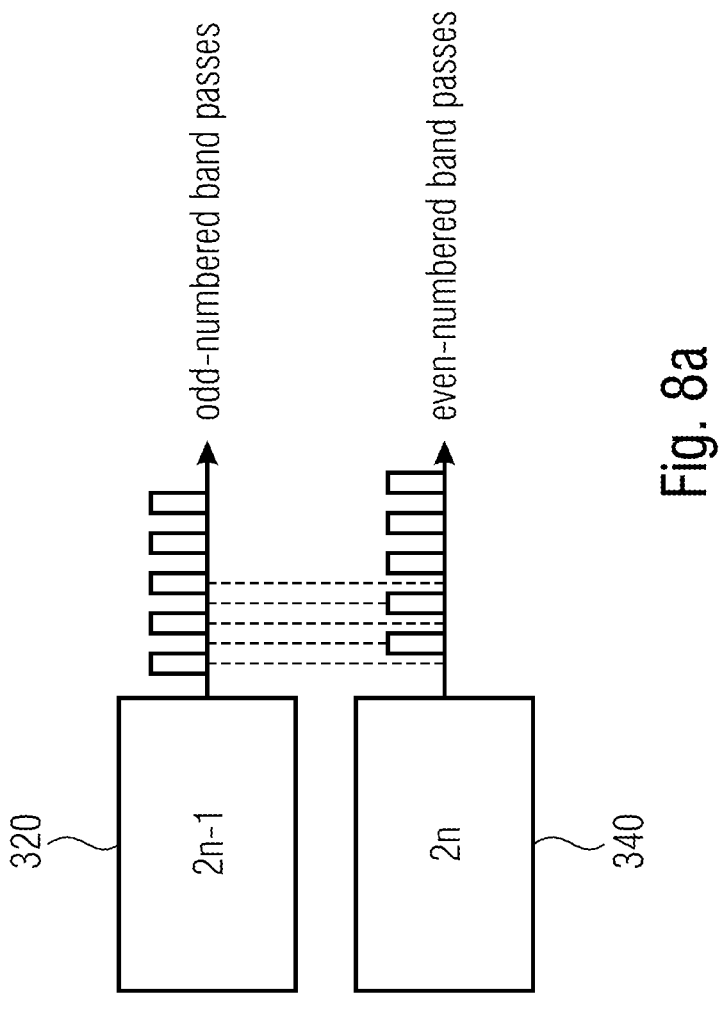
FIG. 8a shows a further schematic illustration of interleaved or interlocked or interlaced bandpasses that are divided in odd numbered and even numbered bandpasses.

FIG. 8a shows a schematic illustration of using 2n even-numbered band-passes in the generation of the upper control signal, while using 2n−1 (odd-numbered band-passes) for the generation of the lower control signal.

Other subdivisions, or implementations, of the band-pass filters in a digital way, e.g. by means of a filterbank, a critically sampled filterbank, a QMF filterbank, or any type of Fourier transformation, or a MDCT implementation with subsequent combination or different processing of the bands can also be used. Similarly, the different bands may also have a constant bandwidth from the lower end to the upper end of the frequency range, e.g. from 50 to 10000 Hz or above. In addition, the number of the bands may also be significantly larger than 20, e.g. 40 or 60 bands, so that each plurality of band-pass filters reproduces half of the entire number of bands, e.g. 30 bands in the case of 60 bands overall.

FIG. 7b illustrates an advantageous implementation of the signal combiner 50, wherein the output signal of the first plurality of band-pass filters and the common-mode signal 323a available at the common-mode signal input 71 are added via the adder 322. Accordingly, the second adder 342 in the signal combiner 50 adds the output signal of the second plurality of band-pass filters 340 and the common-mode signal 323a available at an input 71 of FIG. 7a, for example. In addition, the first all-pass filter 326e and the second all-pass filter 326f obtain the base push-pull signal. The base push-pull signal 72 is supplied directly to both all-pass filters 326e, 326f in the embodiment shown in FIG. 7b. Alternatively, amplification/attenuation may be provided either for both branches 321 and 341, or only for one branch. This could be useful, e.g., if the two signal generators in the loudspeaker as shown in FIG. 6a are not configured exactly symmetrically, or are not arranged exactly symmetrically.

In addition, FIG. 7b illustrates that the amplifiers 324, 344 may be configured not only as amplifiers, but also as digital-analog transducers, or as an input stage of a loud-speaker. Then, the radio distance between a signal processor, or signal generator, 105 and the loudspeakers would be located between the elements 322 and 324, or 342 and 344. In such an implementation, each loudspeaker is configured to receive two input signals, i.e. an input signal for each sound generator 11, 12, and to process, and particularly to amplify, these input signals accordingly, so as to obtain the control signals for the membranes of the sound generators 11, 12.

Figure 8B:
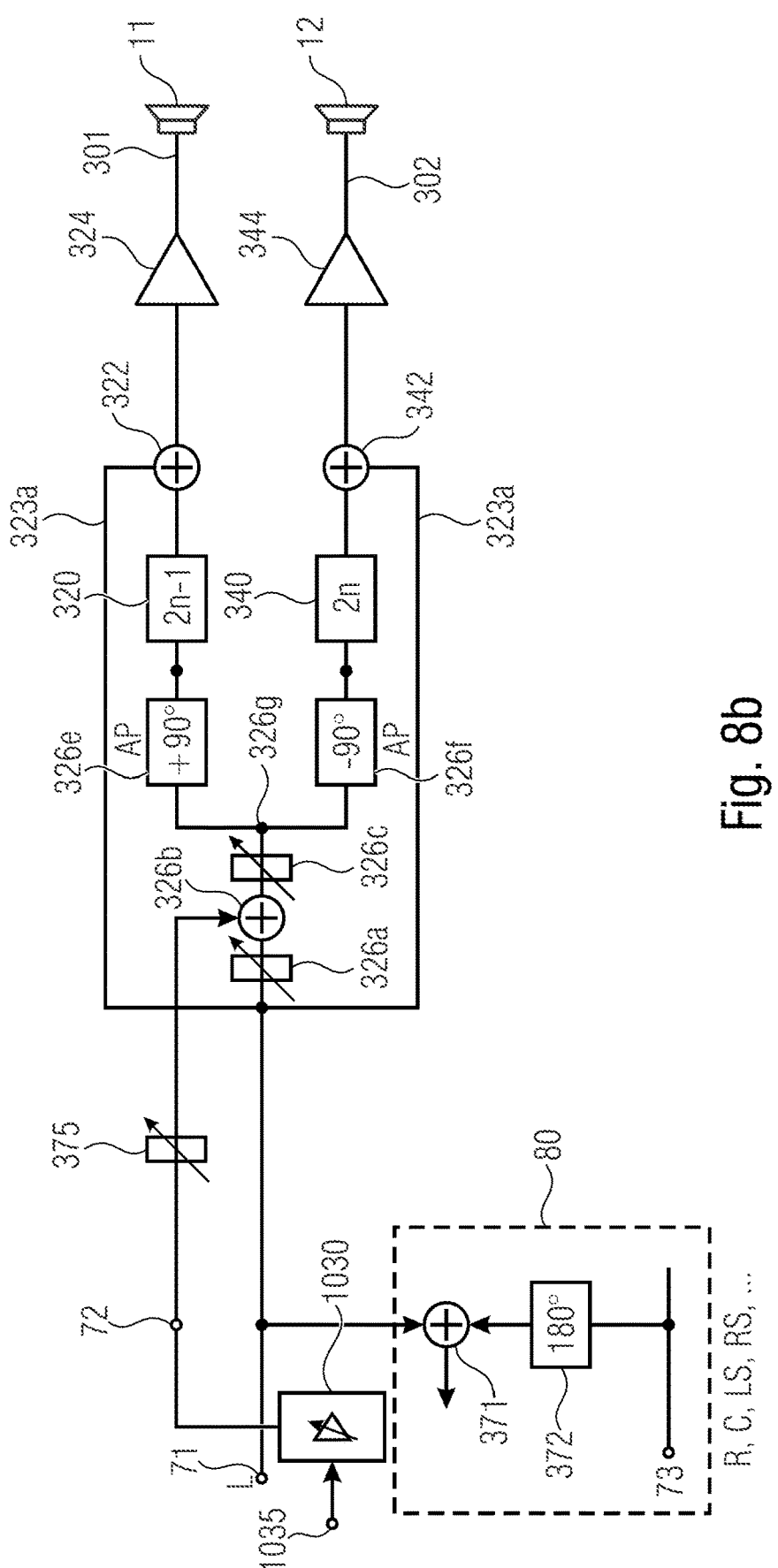
FIG. 8b shows an advantageous embodiment for generating the push-pull signals with a derivation of the base push-pull signal from a difference between two channels and a subsequent controlled amplification of the base push-pull signal to obtain the amplified push-pull signal.

FIG. 8b shows an advantageous embodiment of a signal processor, in which the base push-pull signal provider 80 is configured as a side signal generator. For example, if the common-mode signal is a left signal at the input 71, the base push-pull signal 72 is advantageously obtained by calculating a difference signal between the common-mode signal at the input 71 and another channel of a two or multi-channel representation, e.g., which may contain a right channel R, a center channel C, a left rear channel LS, or a right rear channel RS.

To obtain a difference formation, a phase reversal 372 is advantageously applied to the other channel at the input 73, achieving a phase shift of 180°. Preferably, this is achieved if the signal is available as a difference signal between two poles. Then, the phase reversal 372 is simply achieved by plugging in the channel in a "reverse" manner into an adder 371, so to speak. The adder 371 is therefore advantageously configured such that the common-mode signal is plugged in at its one input "correctly", and the other channel signal is plugged in at its other input "incorrectly", so as to achieve the phase shift of 180° indicated by the phase shifter 372. In other implementations, other phase shifts may be used if an actual phase shifter is used instead of the "incorrect plug-in".

Furthermore, the controllable amplifier 1030 being adjusted with the adjustment value 1035 is illustrated in the drawing. The amplifier amplifies the push-pull signal to obtain the output signal that has been obtained by amplification or attenuation of the push-pull signal according to the adjustment value.

The difference signal at the output of the adder then represents the base push-pull signal 72, which may then be further processed. In the embodiment illustrated in FIG. 8b, the push-pull signal generator includes further elements, i.e. the potentiometers, or amplifiers, with an amplification of less than one 375, 326a, and the adder 326b and the potentiometer 326c. In contrast to the embodiment of FIG. 7a or FIG. 7b where the push-pull signal has been fed directly into the branch point 326b from the output 72 and from there into the two all-pass filters, or interleaved band-pass filters, the base push-pull signal in FIG. 8b is modified prior to branching, i.e. by an amplifier, or a potentiometer 375. Furthermore, the base push-pull signal is mixed with the common-mode signal at the input 71 via the adder 326b, and the result of the mixing is amplified by the amplifier, or the potentiometer 326c. However, it is to be noted that, if the amplifier 375 has an amplification factor of 1, if the amplifier 326a has an amplification factor of 0, i.e. attenuates fully, and if the amplifier 326*c* has an amplification factor of 1, the implementation of FIG. 8*b* is identical to the implementation of FIG. 7*a*, apart from the interleaved band-pass filters 320, 340, wherein, in the embodiment shown in FIG. 8*a* and particularly in FIG. 8*b*, odd-numbered band-passes are arranged in the upper branch, and even-numbered band-passes are arranged in the lower branch. However, the arrangement of even-numbered and odd-numbered band-passes may be done reversely so that the signal processed with the all-pass filter 326*e* is further processed with even-numbered band-pass filters. In the embodiments shown in FIG. 8*b*, it is further to be noted that the order of the all-pass filter and the filterbank may also be reversed. In alternative embodiments, the all-pass filters may also be omitted, since, in such a case, the filterbanks already lead to the push-pull signals being different in the upper branch and in the lower branch. Thus, an implementation with interleaved band-pass filters but without all-pass filters, where the branch point is the direct input into the filterbanks 320, 340, and the output of the filterbanks is directly connected to the corresponding input of the adders 322, 342, also leads to a sound signal at the output of the gap comprising translational or rotatory components.

In addition, the use of the all-pass filters has the advantage that the partition wall in the sound chamber can be omitted, as is illustrated in FIG. 6*a*. However, if interleaved filterbanks are not provided, e.g. as in FIG. 7*a*, it is advantageous to provide the partition wall 18 in the sound chamber, as is illustrated in FIG. 6*c*.

Figure 9:
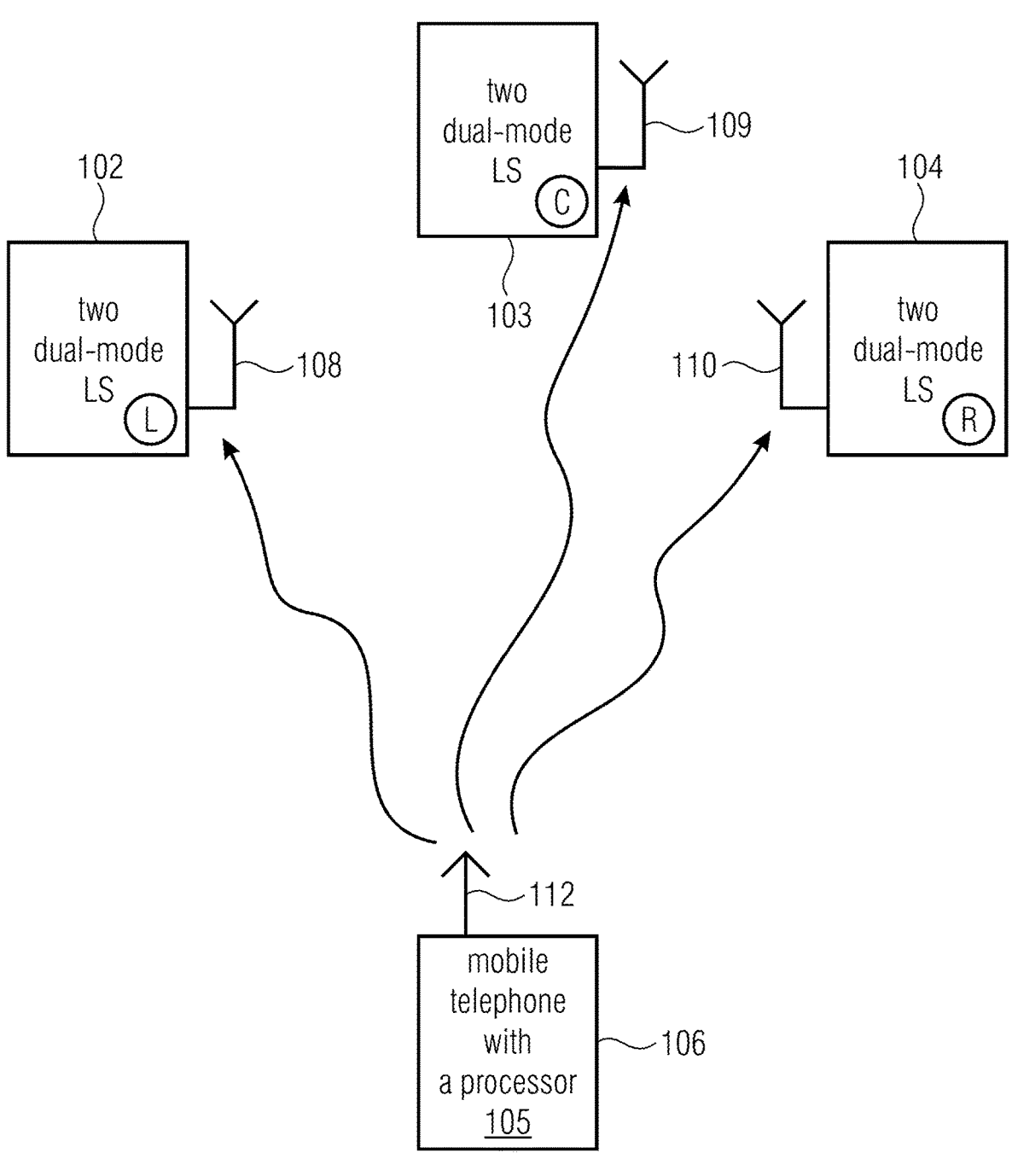
FIG. 9 shows a schematic illustration of a scenario with several dual mode twin transducer loudspeakers and a mobile device such as a mobile telephone for the control.

FIG. 9 shows an advantageous implementation of the present invention in connection with a mobile device, such as a mobile telephone. A mobile device 106 includes an output interface symbolized by a transmission antenna 112. In addition, each loudspeaker 102, 103, 104, which may advantageously be implemented as in FIG. 6*a* to FIG. 6*c*, includes an input interface symbolized by input antennas 108, 109, 110. The mobile telephone 106 includes the signal processor, or signal generator, 105 illustrated in FIG. 7*a*, 7*b*, or 8*c* as the part that is located between the input 71, 73 and the output amplifiers 324, 344. Preferably, the corresponding output amplifiers 324, 344 are arranged in each of the individual loudspeakers 102, 103, 104, and the signals to be amplified are supplied to the output of the respected input interfaces of the corresponding loudspeakers 102, 103, 104. In the scenario shown in FIG. 9, the audio signal is a three-channel signal with a left channel L, a center channel C, and a right channel R. Preferably, the audio signal comes from an audio library in the mobile telephone 106 or originates from a remote audio server, such as a streaming service, etc. Preferably, the interface symbolized by the transmission antenna 112 is a near-field interface, such as a Bluetooth interface.

According to the implementation, the mobile telephone, or the signal processor or signal generator 105, may be configured, as has been illustrated on the basis of FIG. 8*b*, to calculate the base push-pull signal as a difference between a left channel and, e.g., a right channel. If, however, in deviation from FIG. 9, a multi-channel representation with, e.g., five channels exists, as is illustrated in FIG. 8*b*, the base push-pull signal provider 80 may also be configured to calculate the side signal as a difference between a left downmix channel and a right downmix channel. The left downmix channel is calculated by addition of left and left rear (LS) and possibly using an additional addition with a weighted center channel C, e.g. weighted with the factor 1.5. In addition, the right downmix channel is calculated by addition of the right channel R and the right rear channel (RS) and possibly with a weighted center channel C, e.g. weighted with a factor of 1.5. Then, the side signal is obtained by subtraction of the left and the right downmix channels.

Alternatively, the side signal may also be obtained by subtraction of LS and RS, without using the push-pull signal. To calculate the side signal, any number of channel pairs or a downmix channel and an original channel, etc. may be used, and, as illustrated in FIG. 8*b*, the same common-mode signal then added to the two push-pull signals by the signal combiner does not have to be used to calculate the base push-pull signal.

A advantageous implementation of the present invention is subsequently described using the example of a headphone or earphone, or a device wearable at a head, which could also be implemented in a hearing device. Such elements are described in the unpublished German patent application 102021200552.7, incorporated herein by reference in its entirety. Analogously to the embodiment illustrated with respect to FIG. 6*a* to 8*b*, the individual control signals for the individual sound transducers are here again generated from the combination of the amplified push-pull signals and the common mode signals.

FIG. 10 shows a sound generator wearable at the head according to an advantageous embodiment of the present invention. The sound generator wearable at the head includes a first sound generator element 100 on a first side and a second sound generator element 200 on a second side. For example, the first side may be the left side and the second side may then be the right side. Further, the first sound generator element 100 comprises at least a first sound transducer 110 and a second sound transducer 120 arranged such that sound emission directions of the first sound transducer 110 and the second sound transducer 120 are oriented parallel to each other or deviate from each other by less than 30°. Further, the arrangement in the sound generator element 200 for the other or right side with respect to the third sound transducer 210 and the fourth sound transducer 220 is such that sound emission directions of the third sound transducer 210 and the fourth sound transducer 220 are parallel to each other or deviate from each other by less than 30°.

When the sound generator wearable at the head is a headphone, the two sound generator elements are then connected to each other via a connecting ridge 600. Further, in certain embodiments, separating ridges 130 and 230, respectively, are arranged in the sound generator elements between the individual sound transducers and separate the sound transducers 110 and 120 and 210 and 220, respectively, which are advantageously arranged horizontally relative to each other. This means that if the present invention is configured as headphones, the separating ridges 130 or 230 extend vertically, i.e. from bottom to top or from top to bottom, when the headphones are worn at a head. Further, the sound generator wearable at the head is provided with either an input interface or a signal processor, wherein the signal processor is integrated into the headphones or is implemented separately, such as within a mobile phone or other mobile device, as illustrated with respect to element 300. The output of the element 300 thus provides the control signals 301 for the first sound transducer, 302 for the second sound transducer, 303 for the third sound transducer and 304 for the fourth sound transducer, regardless of whether the element 300 is configured as an input interface or is configured as a complete signal processor 300. Thus, the different sound transducers in a sound generator element 100 and 200, respectively, receive different signals from each other, which in an advantageous implementation are out of phase and have spectral components in a frequency range advantageously between 500 and 15,000 Hz, optionally with different interleaved bands attenuated due to interlocked bandpass filter structures in the different signal paths. Preferably, on the other hand, both signals are the same with respect to their power or loudness in a sound generator element. This also represents an advantage of the present invention in that the sound transducers, since they are no longer separated into sound transducers for translational signals and sound transducers for rotatory signals, can be configured identically, which simplifies or improves efficient production on the one hand and efficient application on the other, both in terms of wearing comfort and implementation of the signal processor.

In another embodiment, the implementation in FIG. 10 is configured as an earphone (without connection ridge, and in a hearing device, for example), wherein at least one and advantageously all four sound transducers are configured as a balanced armature transducer, as MEMS transducer or as dynamic transducer, each transducer further comprising a separate sound output for directing the sound into the ear according to its sound emission direction, wherein the sound emission direction from each sound transducer is the same or differs by at most 30°.

When implemented as headphones, each sound generator element is formed as a headphone chamber, which can be either a completely closed headphone chamber or an open headphone chamber, which are mechanically connected to each other by the connecting ridge 600 so that the headphones can be worn well and comfortably on an individual's head.

Preferably, at least one and, however, in particularly advantageous embodiments, each sound transducer in each sound generator element is configured as a headphone capsule, each headphone capsule having the same size, wherein a diameter of a headphone capsule is less than 4 cm.

Figure 11:
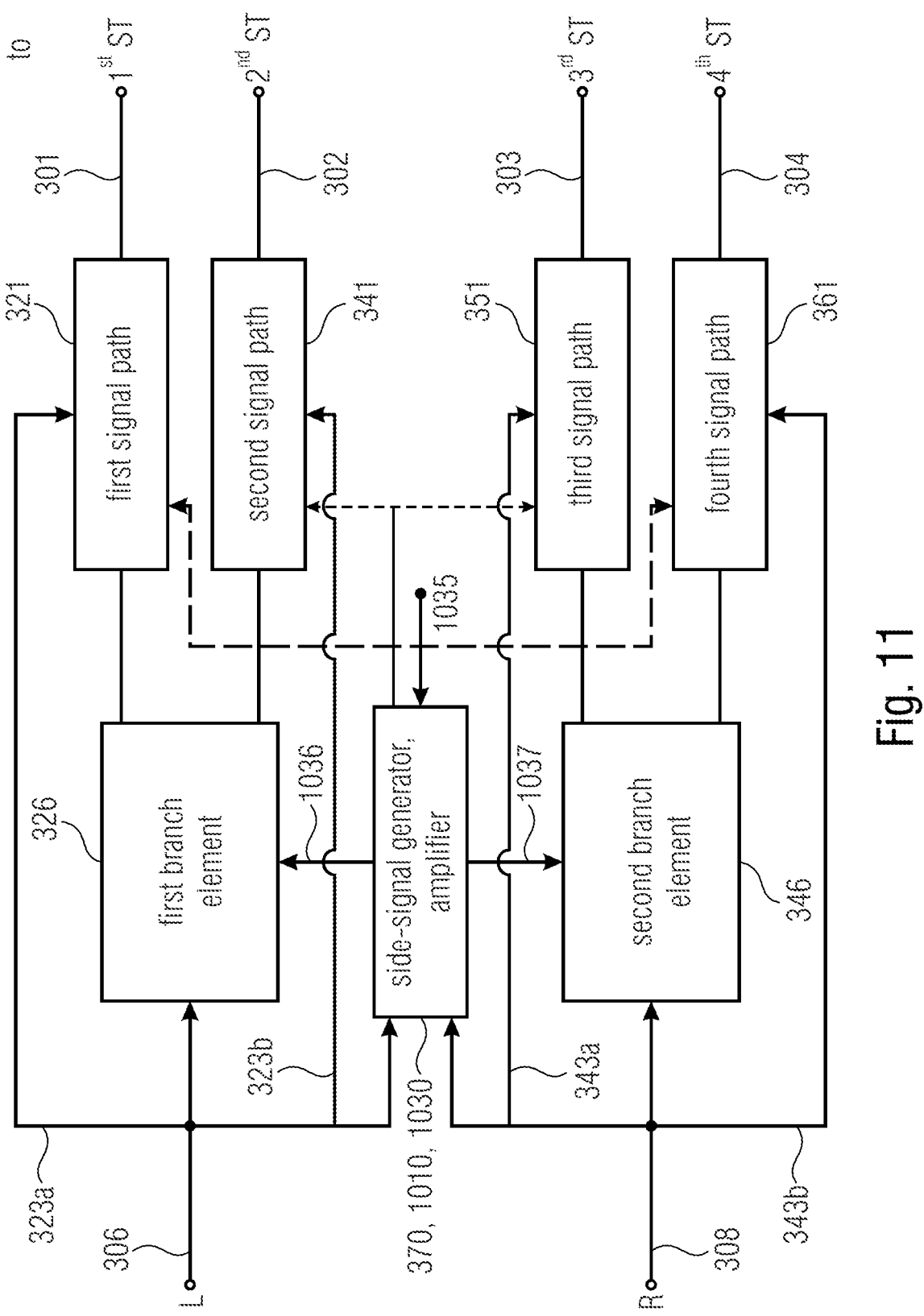
FIG. 11 shows a schematic implementation of a signal processor for generating the control signals for the four sound transducers of FIG. 10.

FIG. 11 shows an advantageous implementation of the signal processor 300 shown schematically in FIG. 10. On the input side, the signal processor includes a left headphone signal 306 and a right headphone signal 308 via the respective inputs L and R. Further, in an advantageous embodiment of the present invention, a separate branch element is provided for each side, i.e., a first branch element 326 (for the left branch) and a second branch element 346 (for the right branch). Each branch element branches the single signal path on the input side, i.e., the left signal, for example, into a first signal path 321 on the output side that provides the control signal for the first transducer and into an output side second signal path that provides the control signal 302 for the second transducer. Further, the signal processor 300 is configured to again comprise a branch element 346 for generating the control signals 303 and 304 for the third sound transducer 210 of FIG. 10 and the fourth sound transducer 220 of FIG. 10, respectively, the branch element leading into a third signal path 351 and a fourth signal path 361 on the output side.

Further, in advantageous embodiments of the present invention, the signal processor includes a side signal generator 370 that receives both the input signal of the first channel 306 and the input signal of the second channel 308 and provides a side signal on the output side and feeds the same into the respective branch element 326 and 346, respectively, or alternatively or additionally feeds the same into the respective signal paths. The side signal for the left channel may be shifted by 180° with respect to the side signal for the right channel. Further, each signal path is configured to receive, in addition to the output signal of the branch element, also the original input signal via bypass lines 323a, 323b for the left channel or bypass lines 343a and 343b for the right channel. Thus, each signal transducer receives a control signal consisting of the original left and right channels, respectively, and additionally comprises a signal originating from the branch element. Further, depending on the implementation, the signal in the signal path, i.e. the "combined" signal can be further processed differently for the two signal paths, such as by means of different mutually interlocked filter banks, i.e. such that the signal for one sound transducer in a headphone chamber and the signal for the other sound transducer in the headphone chamber have different frequency ranges from each other, which, however, together result in an excellent sound due to the previous signal processing. Furthermore, the controllable amplifier 1030 being adjusted with the adjustment value 1035 is not specifically illustrated in the drawing, but is accommodated in the side signal generator 370. The amplifier amplifies the push-pull signal to obtain the output signal that has been obtained by amplification or attenuation of the push-pull signal according to the adjustment value.

Figure 12:
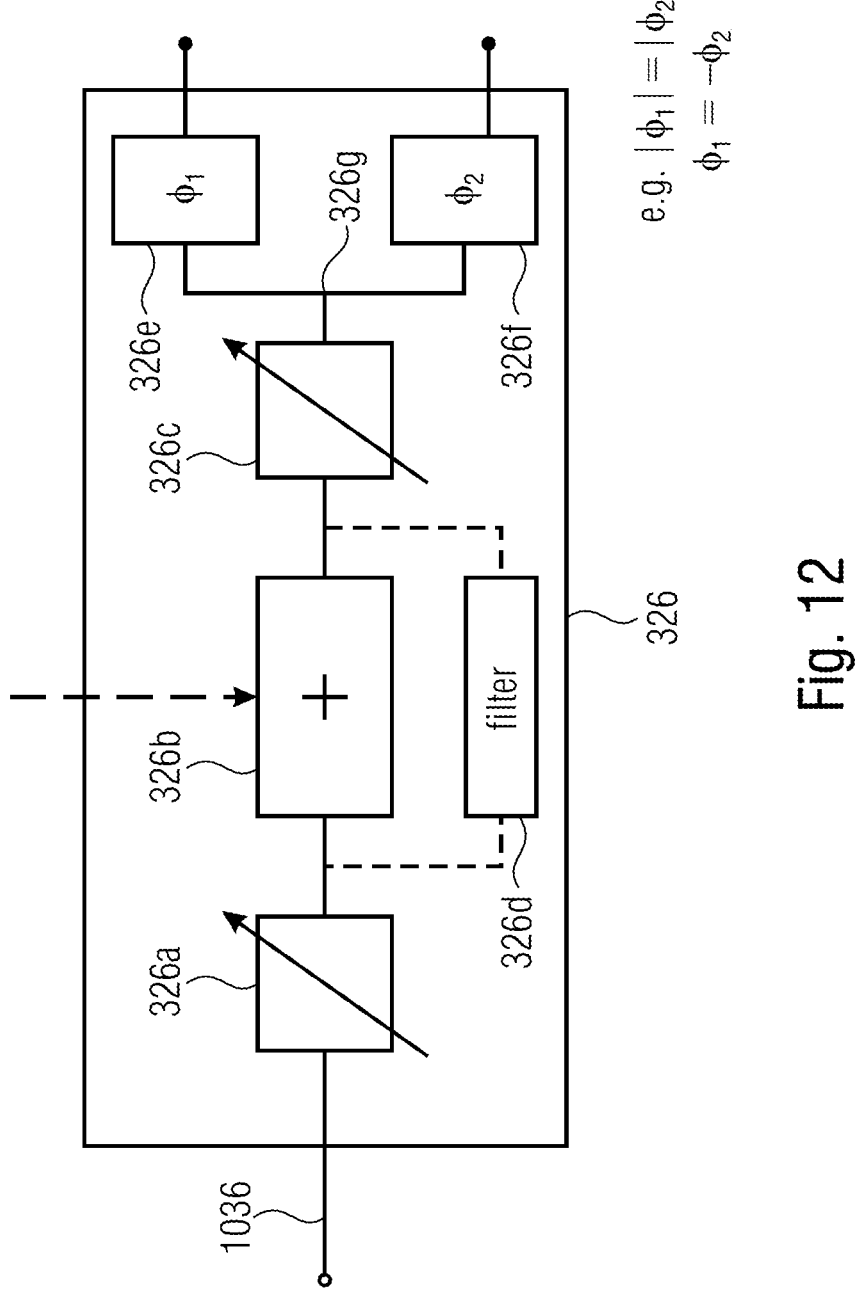
FIG. 12 shows an advantageous implementation of different options for a branching element of FIG. 11.

FIG. 12 shows an advantageous implementation of the branch element 326 or the branch element 346 of FIG. 11. Each branch element can comprise a variable amplifier 326a on the input side. Further, an adder 326b is provided, via which a side signal can be added, or alternatively another decorrelated signal or, if present, the rotatory signal individually recorded and processed, in which case the translation signals are fed in via the left input and the right input.

It should be noted that the variable amplifiers 326a, 326b do not necessarily have to be present. Instead, only a single amplifier or no amplifier may be provided, or the amplifiers may even be present on the output side after or before the phase shifter, i.e., after the branch element 326g, in order to obtain the same effect, but by means of twice the effort, compared to the implementation of the variable amplifier 326c before the branch point 326g.

Figure 13:
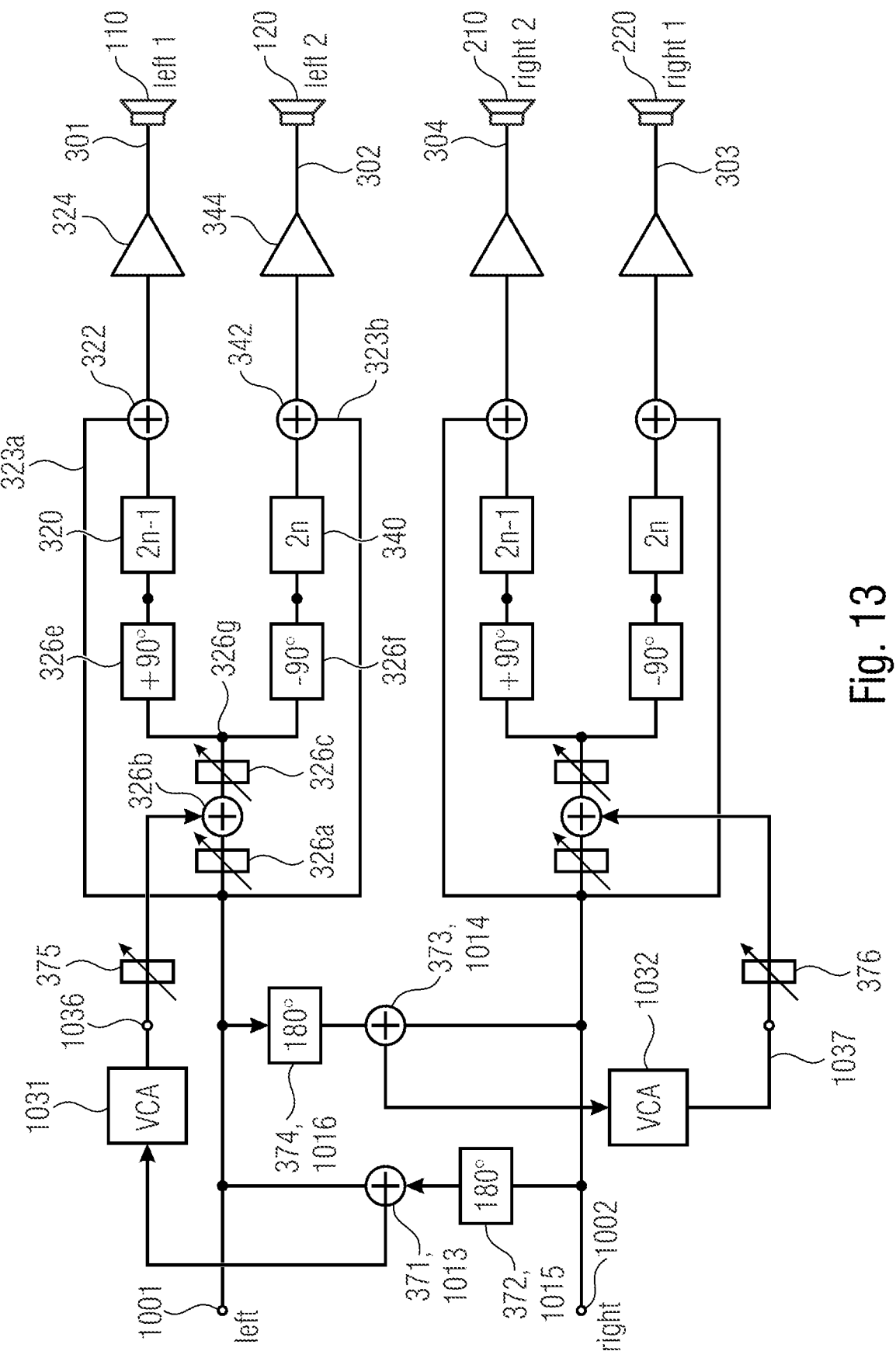
FIG. 13 shows a schematic illustration of an integrated or non-integrated implementation of the signal generation with a side signal generator as an example for a push-pull signal generator and interleaved bandpasses in the different signal paths.

FIG. 13 shows an implementation of the branch element of FIG. 12 with adder 326b and phase shifts of +/−90° in the phase shifter elements 326e, 326f. Further, the side signal generator 370 is configured to calculate the side signal as (L-R) for the left area, i.e. the two signal paths 321, 341, which is shown by the 180° phase shifter 372 and the adder 371 in FIG. 13. Further, for the two signal paths 351, 361, another side signal is generated for the right signal processing block, namely the signal (R-L), which is again achieved by the two blocks 374 (180° phase shift) and 373 (adder). Further, FIG. 13 shows that the corresponding side signal can be variably amplified/attenuated, as represented by the variable gain elements 375, 376. Depending on the implementation, the corresponding side signal is added into the branch element via the adder 326b, which is arranged before the branch point 326g. Alternatively, however, two adders 326b can be provided after the branch point 326g in the upper branch and in the lower branch. Further, FIG. 13 also shows the additional coupling of the unmodified left channel via adders 322, 342 in the left signal processing block and the corresponding adders in the right signal processing block at the bottom of FIG. 13. Furthermore, the controllable amplifier 1030, or its two individual amplifiers 1031 and 1032, being adjusted with the adjustment value 1035 is illustrated in the drawing. The amplifiers amplify the respective push-pull signal to obtain the respective output signal that has been obtained by amplification or attenuation of the push-pull signal according to the adjustment value.

Specific adjustment states of the embodiment of FIG. 13 are discussed below. Depending on the adjustment of amplifier 326a and amplifier 375, respectively 376, the portion of the side signal filtered by the interlocked filter banks can be made large or small. If the amplifier 326a is set to heavy attenuation and the amplifier 375 is set to amplification, the output of the adder 326b is mainly the side signal, which is processed by the phase shifters 326b, 326f and the filter banks 320, 340 and is then impressed on the original left signal by the adders 322, 342, for example. Then, the two signals output by the two sound transducers 110, 120 arranged next to each other differ quite strongly. Although they have the common part delivered through the branches 323a, 323b, they differ in the side signal, which is amplified compared to the left channel, for example. On the other hand, if the amplifier 326a is set to relatively high gain and the amplifier 375 is set to relatively low gain, the portion of the interdigitally filtered side signal in the control signal 301, 302 will be relatively small, so that almost the same signal is output by the two sound transducers 110, 120. Depending on the type of application and respective situation and respective headphones or earphones, an optimum adjustment can thus be found by the respective elements due to the high flexibility of the present invention, which adjustment can be found, for example, empirically by hearing tests for specific sound material and can be programmed in or reprogrammed automatically or manually depending on the type of application.

An implementation for the generation of the control signals for the individual loudspeakers, or loudspeaker systems, is subsequently illustrated with reference to FIGS. 14 to 16, wherein, in contrast to the previous embodiments, differently configured loudspeakers are used to generate the translational and the rotary sound. Such elements are described in the unpublished German patent application 102021203640.6, herein incorporated in its entirety by reference.

Some such systems include an implementation of a linearization filter. However, it is to be noted that the corresponding delays or bandwidth extension measures can also be used for the loudspeakers, or sound transducers, obtaining a combination of an amplified push-pull signal and a corresponding common mode signal. Thus, it is to be noted that the amplified push-pull signal providing the basis for a control signal, as illustrated on the basis of FIG. 1 at 1036, 72, or the accordingly amplified push-pull signals 1036, 1037 available at the push-pull signal feed for a channel and at the push-pull signal feed for another channel, may be fed into corresponding systems as illustrated in the described drawings at the corresponding position, regardless of whether separate loudspeakers are used for generating the translational sound and the rotary sound, or whether sound transducers obtaining a common mode/push-pull signal and generating the translational sound and the rotary sound in combination are used.

Figure 14:
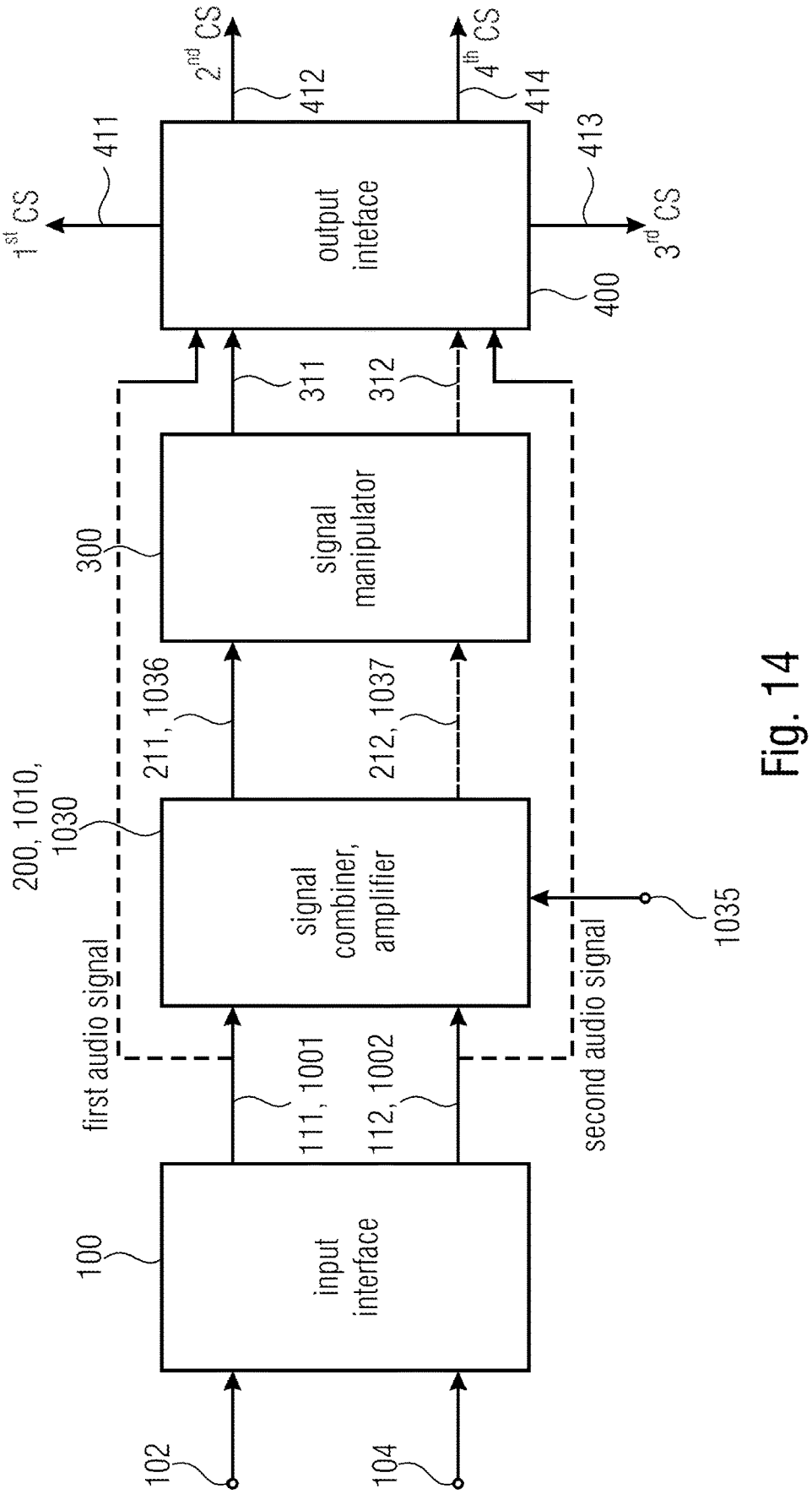
FIG. 14 shows an apparatus for generating a first control signal and an additional second control signal according to a further embodiment of the present invention.

FIG. 14 shows an apparatus for generating a first control signal 411 for a first transducer and a second control signal 412 for a second transducer. The apparatus includes an input interface 100 for providing a first audio signal 111 for a first audio channel and a second audio signal for a second audio channel. In addition, the apparatus includes a signal combiner 200 for determining from the first audio signal 111 and the second audio signal 112 a combination signal including an approximate difference of the first audio signal 111 and the second audio signal 112. This combination signal is shown at 211.

In embodiments, the signal combiner is further configured to generate a further combination signal 212 that also represents a difference between the first and the second audio signal and is derived from the first audio signal and the second audio signal or from the first combination signal 211. In embodiments, the second combination signal 212 differs from the first combination signal 211 and differs, in particular, by 180 degrees, i.e. it has an opposite sign. Furthermore, the controllable amplifier 1030 being adjusted with the adjustment value 1035 is not specifically illustrated in the drawing, but is contained in the element 200. The amplifier amplifies the push-pull signal, i.e. the "combined signal", to obtain the respective output signal that has been obtained by amplification or attenuation of the push-pull signal according to the adjustment value.

Similar to the advantageously used further combination signal 212, the combination signal 211 is also supplied to a signal manipulator 300 configured to manipulate the combination signal in order to obtain therefrom a manipulated combination signal, illustrated at 311 and corresponding to the second control signal 412. In special embodiments, the second control signal 412 is therefore transmitted from the signal manipulator by using the output interface 400 and is output or stored by the output interface. Furthermore, the output interface is configured to output the first control signal 411 for the first transducer in addition to the second control signal for the second transducer as well. The first control signal 411 is obtained by the output interface directly from the input interface and corresponds to the first audio signal 111, or is derived by the output interface 400 from the first audio signal, e.g., by using a bandwidth extension stage, i.e. a spectral enhancer, described later.

In embodiments, the signal manipulator 300 is configured to delay the combination signal, i.e. to feed it into a delay stage, or to amplify or attenuate the combination signal in a frequency-selective manner, i.e. to feed it into a linearization filter, in order to at least partially counteract a non-linear transducer characteristic over the frequency of the second transducer.

Alternatively or additionally, the output interface is configured to feed the first audio signal 111 into a bandwidth extension stage so as to obtain the first output signal 411. Therefore, the apparatus for generating a first control signal 411 and a second control signal 412 includes three aspects that may be used together or independent from one another.

The first aspect consists of generating the manipulated signal from the combination signal by using a delay, which utilizes the Haas effect.

The second aspect consists of the signal manipulator 300 using the linearization filter in order to at least partially compensate a heavily non-linear frequency response of the "rotary" transducer in the sense of a "predistortion".

The third aspect consists of the signal manipulator performing any other type of manipulation such as an attenuation or high-pass filtering or any other processing, wherein the output interface performs a bandwidth extension for the first audio signal.

This bandwidth extension using a bandwidth extension stage is particular in that at least a part of a spectrum of the first audio signal in a frequency range above 20 kHz is converted by using an amplification factor of more than 1 or equal to 1, i.e. without amplification, in order to obtain the first control signal including the frequency range above 20 kHz. In contrast to a conventional bandwidth extension, which is typically configured to extend a signal band-limited to perhaps 4 or 8 kHz in a frequency range of up to perhaps 16 or 20 kHz, further using attenuation to synthesize a decreasing performance characteristic of an audio signal, the inventive bandwidth extension differs in that it determines spectral values for a frequency range above 20 kHz, i.e. for an inaudible range, and in that this spectral range is not attenuated, but converted amplification factor larger than 1 or equal to 1 in order to bring into the non-audible spectral range signal energy that is then radiated by the membranes of the corresponding transducers in order to provide a high-quality audio signal experience. This audio signal experience consists of "conditioning", so to speak, the air carrying the sound energy in the audible range by sound energy in the non-audible range so that certain signals very rich in harmonics are clearly audible despite a great distance, such as the scream of the parrot in the jungle or a triangle in an orchestra.

In embodiments, all three aspects are implemented, as will be described later. However, only one aspect of the three aspects can be implemented, or any two aspects of the three aspects.

Preferably, the first input signal 102 and the second input signal 104 introduced into the input interface 100 represent a left audio channel and a right audio channel. The first audio signal 411 and the second audio signal 412 then represent the control signals for the first and the second transducers placed on the left side with respect to a listening position. The apparatus for generating is further configured to generate the control signals, i.e. the third control signal 413 for a third transducer and the fourth control signal 414 for the fourth transducer, for the right side as well. The third control signal 413 is formed analogously to the first control signal 411, and the fourth control signal 414 is formed analogously to the second control signal 412. The first control signal 411 and the third control signal 413 are supplied to conventional translational transducers, and the control signals 412 and 414 are supplied to "rotary" transducers, i.e. transducers that emit a sound field with rotating sound particle velocity vectors, as will be described with reference to FIG. 16.

Figure 15A:
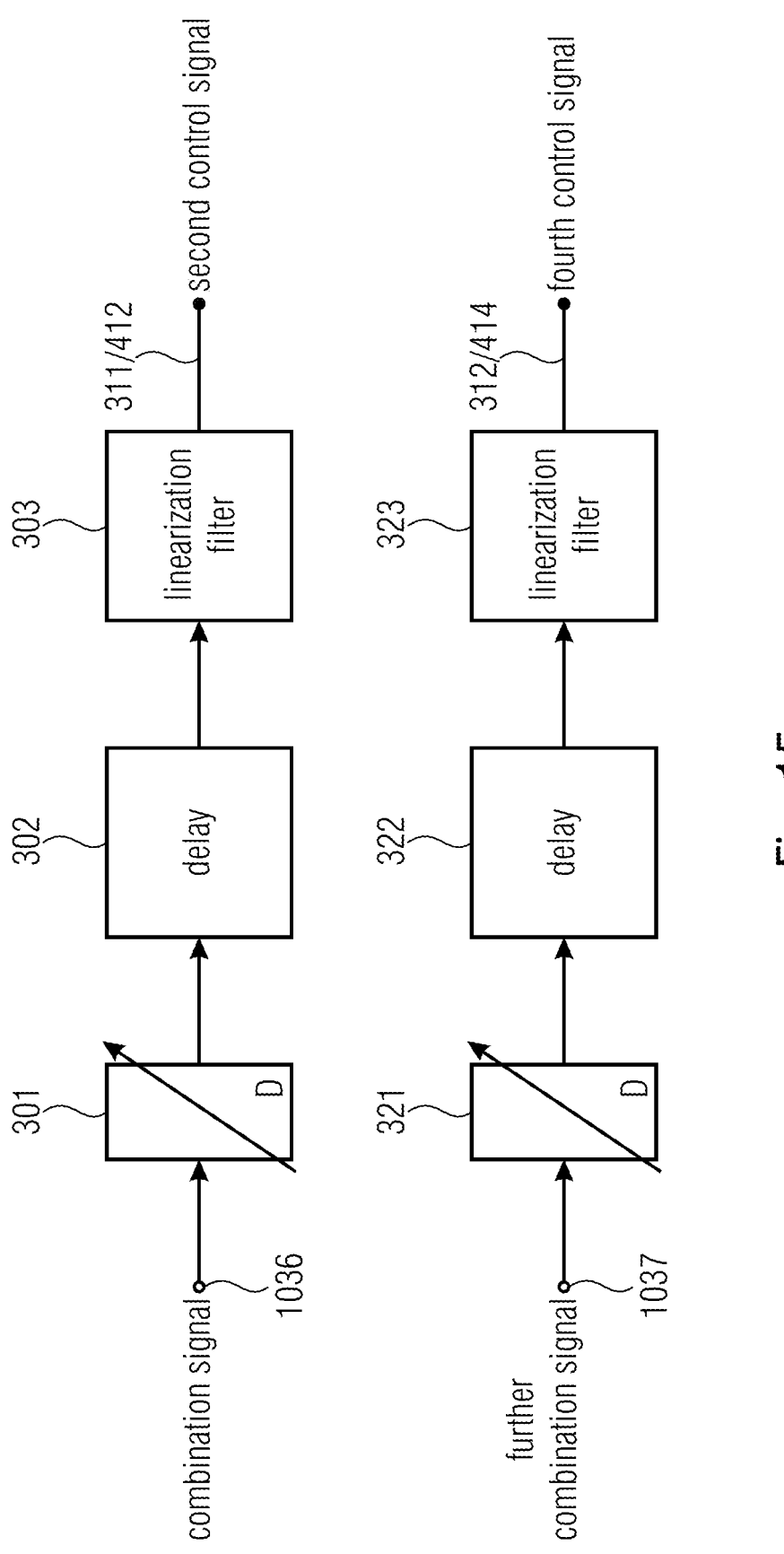
FIG. 15a shows a detailed illustration of the signal manipulator of FIG. 14.

FIG. 15a shows an advantageous implementation of the signal manipulator 300 in order to calculate the second control signal 311/412 from the combination signal 211. In addition, FIG. 15a also shows the implementation of the signal manipulator 300 in order to generate the fourth control signal 312 and 414 from the further combination signal 212. In order to generate the second control signal, in advantageous embodiments, the signal combiner includes a variable attenuation member 301, a delay stage 302, and a linearization filter 303. It is to be noted that the order of the blocks 301, 302, 303 is arbitrary. There may also be a single element that unites the functionalities of the linearization filter, the delay, and the attenuation. The attenuation may be adjusted, or is set to a predefined value that is between 3 and 20 dB, advantageously between 6 and 12 dB, e.g. at 10 dB.

Analogously, the signal manipulator 300 is configured to subject the combination signal 212 to an attenuation by an attenuation stage 321, to subject it to a delay 322, and to feed it into a linearization filter 323. All three elements may be integrated in a single filter that implements the attenuation that is typically constant across the entire frequency range, the delay that is also constant across the entire frequency range, and a linearization filter that attenuates, or amplifies, at least in a frequency-selective manner. It is to be noted that a partial set of the elements can be used as well, i.e. only attenuation and linearization without delay, or only delay without attenuation and linearization, or only attenuation without delay and linearization. In embodiments, all three aspects are implemented.

For the delay, in particular, a delay is used that is large enough that a precedence effect, or a Haas effect, or an effect of the first wave front, occurs between the non-delayed signal given by the first control signal 411, and the second control signal subject to the delay. The signal for the rotatory transducer, i.e. the second in control signal 412, is delayed such that a listener initially perceives the wave front due to the first control signal 411 and therefore carries out localization of the left channel. The rotatory component, which is essential for the audio quality, however, which does not carry any particular information with respect to the localization, is perceived slightly later and, due to the Haas effect, is not perceived as its own signal. Useful delay values for the delay stage 302 or 322 are advantageously between 10 and 40 ms, particularly advantageously between 25 ms and 35 ms, and in particular at 30 ms.

Figure 15B:
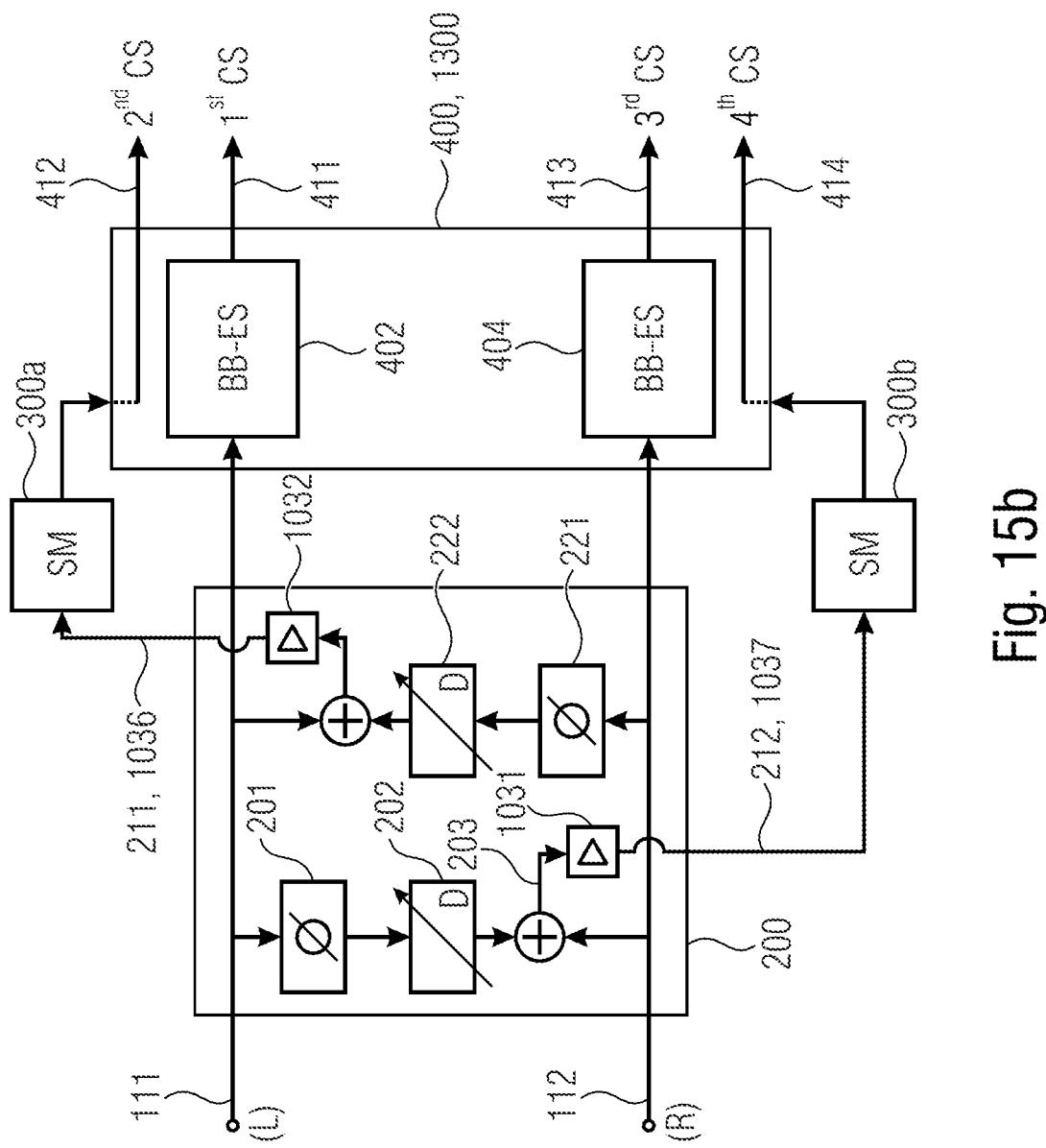
FIG. 15b shows a detailed illustration of the signal combiner of FIG. 14 according to an advantageous embodiment as well as an illustration of incorporating a bandwidth extension stage for each control signal for a translational transducer.

FIG. 15b shows an advantageous implementation of the signal combiner 200 to calculate an approximate difference represented by the combination signal 211 or the further combination signal 212. To this end, the signal combiner 200 includes a phase shifter 201, a downstream attenuation member 202, and an adder 203. In addition, the first audio signal 111 and the second audio signal 112 are used. The first audio signal 111 is phase-shifted by the phase shifter 201, is attenuated depending on the setting of the attenuation member 202, and is then added to the first audio signal 112 in order to obtain the further combination signal 212. In addition, the signal combiner 200 includes a further adder 223, a further phase shifter 221, and a further attenuation member 222, wherein the second audio signal 112 is phase-shifted by the phase shifter 221, the phase-shifted signal is possibly attenuated and then combined with the first audio signal 111. If the phase shifters 201 and 221 carry out a phase shift by 180°, which is advantageous, and if the attenuation member 202, 222 are set such that the attenuation is zero, i.e. these potentiometers are "fully turned up", the combination signal 211 is the result of the subtraction of the second audio signal 112 from the first audio signal 111, i.e. when the first audio signal 111 is the left channel and the right audio signal 112 is the right channel, the combination signal 211 is L-R. Analogously, the further combination signal 212 is R-L in this example. Furthermore, the controllable amplifiers 1031 and 1032 being adjusted with the adjustment value 1035 are illustrated in the drawing. The amplifiers amplify the respective push-pull signal to obtain the respective output signal that has been obtained by amplification or attenuation of the push-pull signal according to the adjustment value.

The implementation of a phase shift of 180° is achieved particularly easily by plugging in a corresponding jack carrying the audio signal in a "reverse" manner. Different phase shifts that differ from 180°, i.e. in a range of 150° to 210°, may also be achieved by correct phase shifter elements and may be of advantage in certain implementations. The same applies to certain attenuation settings of the attenuation members 202, 222, which, according to the implementation, are used to affect the combination signal in that, when forming the difference, the signal that is subtracted is attenuated in contrast to the signal from which the subtraction is carried out. Thus, a subtraction factor x between zero and 1 can be formed, as will be described in FIG. 16.

In addition to a special implementation of the signal combiner 200, FIG. 15b further shows an advantageous embodiment of the bandwidth extension of the translational signal, wherein this bandwidth extension is advantageously carried out in the output interface 400. To this end, the output interface 400 includes a first bandwidth extension stage 402 and a second bandwidth extension stage 404. The first bandwidth extension stage 402 is configured to subject the first audio signal 111 to a bandwidth extension in the non-audible range above 20 kHz, whereas the bandwidth extension stage 404 is configured to subject the second audio signal, i.e. the right channel for example, to a bandwidth extension in the non-audible range above 20 kHz as well.

The result of the bandwidth extension is the first audio signal for the first transducer, i.e. the rotary transducer, e.g. on the left side with respect to a listening position, and the third control signal obtained at the output of the bandwidth extension stage 404 is the control signal for the translational transducer on the right side with respect to the listening position. Both control signals 411, 413 are now provided with signal energy at frequencies above 20 kHz, in contrast to the audio signals 111, 112, wherein these signal components are advantageously present in the control signals up to 40 kHz and particularly advantageously even up to 80 kHz or above.

Even though FIG. 15b shows an implementation in which a bandwidth extension is only carried out with the translational signal, in other embodiments, a bandwidth extension may be carried out with the rotary signal. Alternatively to the bandwidth extension stages 304, 324, a bandwidth extension could be provided in the input interface 100. To this end, a bandwidth extension stage 121 for a first input signal 102 is provided so as to generate the first audio signal 111 from the first input signal 102. In addition, the input stage 100 is provided in order to generate the second audio signal 112 from the second input signal 104. In contrast to the implementation of FIG. 15b, these two audio signals have a frequency range that goes far beyond 20 kHz. If the bandwidth extension is already carried out in the input interface, further bandwidth extensions in the output interface 400, as is illustrated in FIG. 15b, or in the signal manipulation elements 300a, 300b are not required, since all signals already have a high bandwidth in the subsequent signal processing. However, due to the efficiency of processing, an implementation as illustrated in FIG. 15b is advantageous, wherein only the control signals for the translational transducers, i.e. the first control signal 411 and the third control signal 413, are subjected to the bandwidth extension, since the high frequencies are of particular significance for the propagation. Thus, all other processing stages can be performed in the input interface, in the signal combiner, and in the signal manipulator with the band-limited signal, saving processing resources, since all elements apart from the bandwidth extension stages 402, 404 in FIG. 15b can operate with band-limited signals.

The bandwidth extension stage is configured to generate a bandwidth extension above the range of 20 kHz, i.e. in the non-audible range, which goes up to 80 kHz, for example. To this end, advantageously, a harmonic bandwidth extension is carried out, wherein each frequency in the range between 10 and 20 kHz of the audio signal is multiplied with the factor 2, for example, in order to generate a frequency range of between 20 kHz and 40 kHz. In addition, an amplification by means of an amplification member that implements an amplification of greater than 1 is advantageously carried out in the bandwidth extension stage. The harmonic bandwidth extension unit together with the amplifier therefore generates in the corresponding audio signal a signal component that is between 20 and 40 kHz and even has a higher signal energy than the range from the baseband between 10 and 20 kHz. In order to reach an even higher range of between 40 kHz and 80 kHz, a further transposer that multiplies the frequencies each with 4 is provided, wherein the output signal is again advantageously multiplied with an amplification factor of greater than 1, wherein this amplifier is configured having the amplification factor of greater than 1. Although transposing factors that are odd-numbered, i.e. 1, 3, 5 and 7, can be used in principle, it has been shown that even-numbered transposing factors generate a more realistic audio signal impression. In addition, according to the implementation, the baseband may not be attenuated and amplified, i.e. it is taken as it is. However, since loudspeakers typically have a lower transducer efficiency, or a decreasing with higher frequencies, at frequencies above 20 kHz, this lower, or decreasing, transducer efficiency is compensated with an amplified transposed spectral range. Thus, it is advantageous that the amplifier for the range between 40 and 80 kHz amplifies more than the amplifier for the range between 20 kHz and 40 kHz. A second implementation of the bandwidth extension, operating on the basis of the technique of "mirroring", i.e. mirroring the transposed spectral range at the cross-over frequency (transition frequency), which may also be used.

It is advantageous in that in case of a non-constant signal progression in the baseband, there is no discontinuity at the transposition location, i.e. at 20 kHz, if an amplification factor of 1 is used. Mirroring, or up-sampling, may be easily done in the time domain by introducing one or several zeroes as additional sample values into an audio signal between two sample values. If amplification is carried out, only a small discontinuity is created. This discontinuity can be left as is or, if required, it can be attenuated by using average values for the amplification factors in a certain spectral transition area.

FIG. 16 shows a loudspeaker system including a first transducer 521 for the first control signal 411 and a second transducer 522a, 522b for the second control signal 412. In addition, the loudspeaker system comprises a third transducer 523 for the third control signal 413 and a fourth transducer 524a, 524b for the fourth control signal 414. All control signals may be amplified by respective amplifiers 501, 502, 503, 504, e.g., in a manner as input by a user interface via a volume control. The transducers 521, 523 represent the translational and, so to speak, conventional transducers that, in contrast to normal transducers, are characterized by being able to output sound energy in the range above 20 kHz as well, where they advantageously are intended to emit up to 80 kHz or above. The decreasing efficiency at higher frequencies is compensated by the amplification due to the amplification members 407, 408.

In an advantageous embodiment illustrated in FIG. 16, the rotary transducers 522a, 522b, or 524a, 524b, are implemented such that the transducers each include two individual transducers with a front side and a rear side, wherein the two front sides, as illustrated in FIG. 16, are directed towards each other. Between the front sides, i.e. between the membranes, there may be no distance or only such a distance that the membranes are able to deflect and generate, in the intermediate space between the membranes, sound that is able to exit along the edges of the membranes as a rotation. Such a transducer has a very good efficiency in the generation of rotating sound, i.e. a sound field with rotating sound particle velocity vectors. However, the frequency response is heavily non-linear. Thus, the linearization filter 303, 323 is provided to generate a signal via a "predistortion", so to speak, which, if it is output by the non-linear frequency response of the transducer 522a, 522b, or 524a, 524b, has a relative linear transmission characteristic or signal characteristic.

It has been shown that strongly overshooting frequency ranges in the rotation signal have an interfering effect, whereas indentations in the rotation signal at certain tones, leading to certain tones in the rotation signal being "hidden", are not perceived to be interfering. Thus, the plunges in the frequency response of the loudspeakers do not have to be lifted. This simultaneously avoids that a signal still present in the attenuated indentation, which may also be an artefact signal, is too heavily amplified by strong amplification factors at certain frequencies. According to the invention, cutting off only the overshoots, or at least partially reducing the overshoots, and "leaving" the plunges, achieves a particularly efficient and high-quality means to provide the corresponding control signal for the rotary sound transducer 522a, 522b, or 524a, 524b. Preferably, corresponding phase shifters 506, 508 are built into the rotatory sound transducers, which, according to the implementation, provide a phase shift of 180°, however, which may be set to other values, which are advantageously between 150° and 210°. With respect to FIG. 15b, it has been noted that the attenuation members 202, 222 may be set so as to obtain an approximate difference. This is illustrated in FIG. 16 at "L–x–R" and "R–x·L". If the corresponding attenuation member 202, 222 is set to an attenuation of zero, i.e. no attenuation at all, the factor x in FIG. 16 is equal to 1. However, if the attenuation member 202, 222 is set to a factor of half the attenuation, for example, the factor x is 0.5. However, if the attenuation member 202, 222 is set to full attenuation, the difference is no longer formed, and the first transducer 522a, 522b emits only the left signal. However, it is advantageous to set an attenuation of the attenuation member 202, 222 to a maximum of 0.25 so that the corresponding signal is a difference signal, or push-pull signal, even though, compared to the channel from which the subtraction is carried out, the subtracted channel is reduced with respect to its amplitude or power or energy.

In a further implementation, the apparatus for generating the first control signal and the second control signal, and in particular for generating the third and the fourth control signals, is implemented as a signal processor or software in order to generate the control signals for the individual loudspeakers, e.g. in a mobile device, such as a mobile telephone, and to then output them via a wireless interface. Alternatively, the transducers as illustrated in FIG. 16, including the amplifiers 502 to 504, are implemented together with the apparatus as illustrated in FIG. 14 into a loudspeaker unit that additionally includes the transducer 521 and the transducer 522a, 522b in a special carrier. Then, for example, this loudspeaker unit may be placed as it is at a left reproduction position with respect to a listening position. The same may be done for another loudspeaker unit including the elements 523, 524a, 524b as well as the corresponding part of the apparatus for generating the control signals so that a loudspeaker unit is provided for the right position with respect to a defined listening position. Accordingly, loudspeaker units may be used for further channels than the two stereo channels, e.g. for a center channel, for a left rear channel, for a right rear channel, in the case of a 5.1 system. In the case of higher systems, a transducer for rotatory sound and a transducer for translational sound that are driven with the separate control signals may be used at corresponding further positions, such as a ceiling loudspeaker.

A advantageous embodiment of the present invention is located within a mobile device such as mobile telephone, a tablet, a notebook, etc. In particular, the control apparatus, or the apparatus for generating a control signal, is loaded as a hardware element or as an app, or program, on the mobile telephone. The mobile telephone is configured to receive the first audio signal and the second audio signal or the multi-channel signal from any source that may be local or in the internet, and to generate the control signals depending thereon. These signals are transmitted by the mobile telephone to the sound generator with the sound generator elements either in a wired or wireless manner, e.g. by means of Bluetooth or Wi-Fi. In the latter case, the sound generating elements have to have a battery supply, or a power supply in general, in order to achieve the corresponding amplifications for the wireless signals received, e.g. according to the Bluetooth format or the Wi-Fi format.

Even though some aspects have been described within the context of a device, it is understood that said aspects also represent a description of the corresponding method, so that a block or a structural component of a device is also to be understood as a corresponding method step or as a feature of a method step. By analogy therewith, aspects that have been described within the context of or as a method step also represent a description of a corresponding block or detail or feature of a corresponding device. Some or all of the method steps may be performed while using a hardware device, such as a microprocessor, a programmable computer or an electronic circuit. In some embodiments, some or several of the most important method steps may be performed by such a device.

Depending on specific implementation requirements, embodiments of the invention may be implemented in hardware or in software. Implementation may be effected while using a digital storage medium, for example a floppy disc, a DVD, a Blu-ray disc, a CD, a ROM, a PROM, an EPROM, an EEPROM or a FLASH memory, a hard disc or any other magnetic or optical memory which has electronically readable control signals stored thereon which may cooperate, or cooperate, with a programmable computer system such that the respective method is performed. This is why the digital storage medium may be computer-readable.

Some embodiments in accordance with the invention thus comprise a data carrier which comprises electronically readable control signals that are capable of cooperating with a programmable computer system such that any of the methods described herein is performed.

Generally, embodiments of the present invention may be implemented as a computer program product having a program code, the program code being effective to perform any of the methods when the computer program product runs on a computer.

The program code may also be stored on a machine-readable carrier, for example.

Other embodiments include the computer program for performing any of the methods described herein, said computer program being stored on a machine-readable carrier.

In other words, an embodiment of the inventive method thus is a computer program which has a program code for performing any of the methods described herein, when the computer program runs on a computer.

A further embodiment of the inventive methods thus is a data carrier (or a digital storage medium or a computer-readable medium) on which the computer program for performing any of the methods described herein is recorded. The data carrier, the digital storage medium, or the recorded medium are typically tangible, or non-volatile.

A further embodiment of the inventive method thus is a data stream or a sequence of signals representing the computer program for performing any of the methods described herein. The data stream or the sequence of signals may be configured, for example, to be transmitted via a data communication link, for example via the internet.

A further embodiment includes a processing unit, for example a computer or a programmable logic device, configured or adapted to perform any of the methods described herein.

A further embodiment includes a computer on which the computer program for performing any of the methods described herein is installed.

A further embodiment in accordance with the invention includes a device or a system configured to transmit a computer program for performing at least one of the methods described herein to a receiver. The transmission may be electronic or optical, for example. The receiver may be a computer, a mobile device, a memory device or a similar device, for example. The device or the system may include a file server for transmitting the computer program to the receiver, for example.

In some embodiments, a programmable logic device (for example a field-programmable gate array, an FPGA) may be used for performing some or all of the functionalities of the methods described herein. In some embodiments, a field-programmable gate array may cooperate with a microprocessor to perform any of the methods described herein. Generally, the methods are performed, in some embodiments, by any hardware device. Said hardware device may be any universally applicable hardware such as a computer processor (CPU), or may be a hardware specific to the method, such as an ASIC.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

The invention claimed is:

1. An apparatus for generating a control signal for a sound generator, comprising:

a push-pull signal generator for generating a push-pull signal from a first channel signal and a second channel signal of a multi-channel audio signal;

a controllable amplifier for amplifying or attenuating the push-pull signal with an adjustable amplification or attenuation according to an adjustment value, wherein the apparatus is configured to determine the control signal from an output signal of the controllable amplifier; and a controller for determining the adjustment value, wherein the controller is configured to determine a first adjustment value in case of a first similarity between the first channel signal and the second channel signal is a first similarity, and to determine a second adjustment value in case the of a second similarity between the first channel signal and the second channel signal is a second similarity, wherein the first similarity represents a lower similarity than the second similarity, and wherein the first adjustment value represents a lower amplification than the second adjustment value or a larger attenuation than the second adjustment value, wherein the controller comprises:

a multiplier for multiplying the first channel signal and the second channel signal to acquire a first multiplication result, for multiplying the first channel signal with itself to acquire a second multiplication result, and for multiplying the second channel signal with itself to acquire a third multiplication result;

an integrator for integrating the first multiplication result to acquire a first integration result, for integrating the second multiplication result to acquire a second integration result, and for integrating the third multiplication result to acquire a third integration result;

a root former for forming a root from the second integration result to acquire a first root result, and for forming a root from the third integration result to acquire a second root result;

a further multiplier to multiply the first root result with the second root result to acquire a fourth multiplication result; and a divider for dividing the first integration result by the fourth multiplication result to acquire a quantitative similarity value of the similarity between the first channel signal and the second channel signal, wherein the controller is configured to determine the adjustment value from the quantitative similarity value.

2. The apparatus according to claim 1, wherein the controller is configured to determine a correlation value between a first channel signal and a second channel signal, wherein the correlation value is a measure for the similarity between the first channel signal and the second channel signal.

3. The apparatus according to claim 2, wherein the controller is configured to determine the ajustment value for a correlation value of 0 such that an amplification correcponding to the adjustment value comprises an amplification factor of between 0.9 and 1.1.

4. The apparatus according to claim 1, wherein the controller is configured to calculate a normalized cross-correlation function from the first channel signal and the second channel signal, wherein a value of the normalized cross-correlation function is a measure for the similarity between the first channel signal and the second channel signal.

5. The apparatus according to claim 1, wherein the controller is configured to calculate the quantitative similarity value by using a correlation function with a value range of negative and positive values, wherein the controller is configured to determine, for a negative value of the correlation function, the adjustment value that represents one of an attenuation and an amplification, and to determine, for a positive value of the correlation function, the adjustment value that represents the respectively other one of the amplification and the attenuation.

6. The apparatus according to claim 1, wherein the controller is configured to calculate the quantitative similarity value being in a value range of possible similarity values, and to determine the adjustment value from the quantitative similarity value according to a mapping function, wherein the mapping function progresses monotonously so that, for a similarity value representing a lower similarity, an adjustment value is determined that provides a smaller amplification than for a similarity value representing a larger similarity.

7. The apparatus according to claim 1, wherein the controllable amplifier comprises an amplification range between at least −6 dB and at least +6 dB, and wherein the controller is configured to map a value range for the quantitative similarity value onto the amplification range, or wherein the controller is further configured to provide, for quantitative similarity values indicating at least a 90% similarity of the first channel signal and the second channel signal, an adjustment value at which a common mode signal is amplified with a reduced amplification, compared to an amplification at a lower similarity than the 90% similarity between the first channel signal and the second channel signal.

8. The apparatus according to claim 1, wherein the controller is configured to analyze the push-pull signal and to determine the first adjustment value in case of a first amplitude-related quantity of the push-pull signal, and the second adjustment value in case of a second amplitude-related quantity of the push-pull signal, wherein the first amplitude-related quantity is larger than the second amplitude-related quantity.

9. The apparatus according to claim 1, wherein the push-pull signal generator is configured to determine the push-pull signal by forming a difference between the first channel signal and the second channel signal.

10. The apparatus according to claim 1, wherein the multi-channel audio signal comprises a left channel signal and a right channel signal, wherein the push-pull signal generator is configured to generate the push-pull signal and a further push-pull signal that differs from the push-pull signal, wherein a further controllable amplifier is configured to amplify the further push-pull signal, wherein the controller is configured to provide to the further controllable amplifier an adjustment value that causes an identical amplification or attenuation of the further push-pull signal compared to the amplification or attenuation of the push-pull signal.

11. The apparatus according to claim 1, further comprising:

a common mode signal generator for generating a first common mode signal from the first channel signal or a second common mode signal from the second channel signal, wherein the apparatus is configured to additionally generate the control signal by using the first common mode signal or the second common mode signal.

12. The apparatus according to claim 11, wherein the sound generator comprises a first loudspeaker for the amplified push-pull signal and a second loudspeaker configured differently from the first loudspeaker, the second loudspeaker being controlled with the second common mode signal, wherein the apparatus further comprises an output interface to output the amplified push-pull signal to the first loudspeaker and to output the second common mode signal to the second loudspeaker, or wherein the sound generator comprises a first sound transducer and a second sound transducer, and wherein the apparatus comprises a sound transducer signal generator configured to determine a first control signal for the first sound transducer and a second control signal for the second sound transducer from the output signals of the controllable amplifier and the first common mode signal or the second common mode signal.

13. The apparatus according to claim 12, wherein the common mode signal generator is configured to perform a bandwidth extension of the first channel signal or the second channel signal beyond a frequency range of more than 20 kHz, or wherein the apparatus comprises a push-pull signal manipulator to delay or pre-distort the amplified push-pull signal so as to at least partially compensate a non-linearity of the first or second loudspeaker, or wherein the sound transducer signal generator is configured to process the output signals of the controllable amplifier in a first way to determine a first processed push-pull signal from the push-pull signal, and to process the output signal of the controllable amplifier in a second way to determine a further processed push-pull signal from the amplified push-pull signal, wherein the second way differs from the first way, and to combine the first processed push-pull signal with the first common mode signal so as to acquire the control signal for the first sound transducer, and to combine the second processed push-pull signal with the first common mode signal so as to acquire the second control signal for the second sound transducer.

14. The apparatus according to claim 13, wherein the sound transducer signal generator is configured to, in case of processing in the first way, use a first plurality of bandpass filters, and, in case of processing in the second way, use a second plurality of bandpass filters, wherein the first plurality of bandpass filters is configured to differ from the second plurality of bandpass filters so that the second plurality of bandpass filters comprises in a frequency range one or several passbands and the first plurality of bandpass filters comprises in the frequency range one or several rejection bands.

15. The apparatus according to claim 1, comprising:

a volume control with a user interface to acquire a volume user setting, wherein the volume control is configured to amplify a first raw channel signal and a second raw channel signal on the basis of the volume user setting to acquire the first channel signal and the second channel signal, or to amplify the control signal for the sound generator on the basis of the volume user setting.

16. The apparatus according to claim 1, wherein the controller is configured to determine the adjustment value from the first channel signal and the second channel signal, and to filter the first channel signal and the second channel signal with a high-pass filter and a bandpass filter, and to determine the adjustment value from a filtered first channel signal and a second filtered channel signal, or wherein the controller is configured to filter the push-pull signal with a high-pass filter or a bandpass filter, and to determine the adjustment value from a filtered push-pull signal.

17. The apparatus according to claim 16, wherein the high-pass filter or the bandpass filter comprises a lower cutoff frequency of between 50 and 200 Hz, and wherein the bandpass filter comprises an upper cutoff frequency of between 2 kHz and 8 kHz.

18. The apparatus according to claim 1, wherein the integrator is controllable by a user with respect to an integration time.

19. The apparatus according to claim 1, wherein the multi-channel audio signal is an audio piece, and wherein the controller is configured to generate an adjustment value for the audio piece by analysis of the audio piece prior to generating the control signal, or wherein the controller is configured to, on the basis of a starting value, determine the adjustment value in a variable manner across time for the multi-channel audio signal, wherein the controller is configured to determine the adjustment value on the basis of a temporal range of the multi-channel audio signal extending prior to a current point in time or after a current point in time, wherein the range comprises a timespan prior to the current point in time or the range after the current point in time that is between 1 ms and 15 s, or wherein the range comprises an entire piece.

20. The apparatus according to claim 1, wherein the multi-channel audio signal comprising the first channel signal and the second channel signal comprises metadata comprising the adjustment value, wherein the controller is further configured to extract the adjustment value from the metadata, and wherein the controllable amplifier is configured to apply the adjustable amplification or attenuation to the push-pull signal according to the extracted adjustment value.

21. An apparatus for generating an extended multi-channel audio signal, comprising:

an input interface for acquiring a multi-channel audio signal comprising a first channel signal and a second channel signal;

a controller for determining an adjustment value for an amplification or attenuation of a push-pull signal derivable from the first channel signal and the second channel signal, wherein the controller is configured to determine a first adjustment value in case of a first similarity between the first channel signal and the second channel signal, and to determine a second adjustment value in case of a second similarity between the first channel signal and the second channel signal, wherein the first similarity represents a lower similarity than the second similarity, and wherein the first adjustment value represents a smaller amplification than the second adjustment value or a larger attenuation than the second adjustment value; and an output interface for outputting the extended multi-channel audio signal comprising the first channel signal, the second channel signal, and metadata, wherein the metadata comprises the adjustment value, and wherein the controller comprises:

a multiplier for multiplying the first channel signal and the second channel signal to acquire a first multiplication result, for multiplying the first channel signal with itself to acquire a second multiplication result, and for multiplying the second channel signal with itself to acquire a third multiplication result;

an integrator for integrating the first multiplication result to acquire a first integration result, for integrating the second multiplication result to acquire a second integration result, and for integrating the third multiplication result to acquire a third integration result;

a root former for forming a root from the second integration result to acquire a first root result, and for forming a root from the third integration result to acquire a second root result;

a further multiplier to multiply the first root result with the second root result to acquire a fourth multiplication result; and a divider for dividing the first integration result by the fourth multiplication result to acquire a quantitative similarity value, wherein the controller is configured to determine the adjustment value from the quantitative similarity value.

22. A method for generating a control signal for a sound generator, comprising:

generating a push-pull signal from a first channel signal and a second channel signal of a multi-channel audio signal;

amplifying or attenuating the push-pull signal with an adjustable amplification or attenuation according to an adjustment value, wherein the method is configured to determine the control signal from an output signal amplified or attenuated with the adjustable amplification or attenuation; and determining the adjustment value so that a first adjustment value is determined in case of a first similarity between the first channel signal and the second channel signal, and a second adjustment value is determined in case of a second similarity between the first channel signal and the second channel signal, wherein the first similarity represents a lower similarity than the second similarity, and wherein the first adjustment value represents a lower amplification than the second adjustment value or a larger attenuation than the second adjustment value, wherein the determining comprises:

multiplying the first channel signal and the second channel signal to acquire a first multiplication result, multiplying the first channel signal with itself to acquire a second multiplication result, and multiplying the second channel signal with itself to acquire a third multiplication result;

integrating the first multiplication result to acquire a first integration result, integrating the second multiplication result to acquire a second integration result, and integrating the third multiplication result to acquire a third integration result;

forming a root from the second integration result to acquire a first root result, and forming a root from the third integration result to acquire a second root result;

multiplying the first root result with the second root result to acquire a fourth multiplication result; and dividing the first integration result by the fourth multiplication result to acquire a quantitative similarity value, wherein the adjustment value is determined from the quantitative similarity value.

23. A method for generating an extended multi-channel audio signal, comprising:

acquiring a multi-channel audio signal comprising a first channel signal and a second channel signal;

determining an adjustment value for an amplification or attenuation of a push-pull signal derivable from the first channel signal and the second channel signal, wherein the determining is configured so that a first adjustment value is determined in case of a first similarity between the first channel signal and the second channel signal, and a second adjustment value is determined in case of a second similarity between the first channel signal and the second channel signal, wherein the first similarity represents a lower similarity than the second similarity, and wherein the first adjustment value represents a smaller amplification than the second adjustment value or a larger attenuation than the second adjustment value, wherein the determining comprises:

multiplying the first channel signal and the second channel signal to acquire a first multiplication result, multiplying the first channel signal with itself to acquire a second multiplication result, and multiplying the second channel signal with itself to acquire a third multiplication result;

integrating the first multiplication result to acquire a first integration result, integrating the second multiplication result to acquire a second integration result, and integrating the third multiplication result to acquire a third integration result;

forming a root from the second integration result to acquire a first root result, and forming a root from the third integration result to acquire a second root result;

multiplying the first root result with the second root result to acquire a fourth multiplication result; and dividing the first integration result by the fourth multiplication result to acquire a quantitative similarity value, wherein the adjustment value is determined from the quantitative similarity value; and outputting the extended multi-channel audio signal comprising the first channel signal, the second channel signal, and metadata, wherein the metadata comprises the adjustment value.

24. A non-transitory digital storage medium having a computer program stored thereon to perform the method for generating a control signal for a sound generator, comprising:

generating a push-pull signal from a first channel signal and a second channel signal of a multi-channel audio signal;

amplifying or attenuating the push-pull signal with an adjustable amplification or attenuation according to an adjustment value, wherein the method is configured to determine the control signal from an output signal amplified or attenuated with the adjustable amplification or attenuation; and determining the adjustment value so that a first adjustment value is determined in case of a first similarity between the first channel signal and the second channel signal, and a second adjustment value is determined in case of a second similarity between the first channel signal and the second channel signal, wherein the first similarity represents a lower similarity than the second similarity, and wherein the first adjustment value represents a lower amplification than the second adjustment value or a larger attenuation than the second adjustment value, wherein the determining comprises:

multiplying the first channel signal and the second channel signal to acquire a first multiplication result, multiplying the first channel signal with itself to acquire a second multiplication result, and multiplying the second channel signal with itself to acquire a third multiplication result;

integrating the first multiplication result to acquire a first integration result, integrating the second multiplication result to acquire a second integration result, and integrating the third multiplication result to acquire a third integration result;

forming a root from the second integration result to acquire a first root result, and forming a root from the third integration result to acquire a second root result;

multiplying the first root result with the second root result to acquire a fourth multiplication result; and dividing the first integration result by the fourth multiplication result to acquire a quantitative similarity value, wherein the adjustment value is determined from the quantitative similarity value, when said computer program is run by a computer.

25. A non-transitory digital storage medium having a computer program stored thereon to perform the method for generating an extended multi-channel audio signal, comprising:

acquiring a multi-channel audio signal comprising a first channel signal and a second channel signal;

determining an adjustment value for an amplification or attenuation of a push-pull signal derivable from the first channel signal and the second channel signal, wherein the determining is configured so that a first adjustment value is determined in case of a first similarity between the first channel signal and the second channel signal, and so that a second adjustment value is determined in case of a second similarity between the first channel signal and the second channel signal, wherein the first similarity represents a lower similarity than the second similarity, and wherein the first adjustment value represents a smaller amplification than the second adjustment value or a larger attenuation than the second adjustment value, wherein the determining comprises:

multiplying the first channel signal and the second channel signal to acquire a first multiplication result, multiplying the first channel signal with itself to acquire a second multiplication result, and multiplying the second channel signal with itself to acquire a third multiplication result;

integrating the first multiplication result to acquire a first integration result, integrating the second multiplication result to acquire a second integration result, and integrating the third multiplication result to acquire a third integration result;

forming a root from the second integration result to acquire a first root result, and forming a root from the third integration result to acquire a second root result;

multiplying the first root result with the second root result to acquire a fourth multiplication result; and dividing the first integration result by the fourth multiplication result to acquire a quantitative similarity value, wherein the adjustment value is determined from the quantitative similarity value; and outputting the extended multi-channel audio signal comprising the first channel signal, the second channel signal, and metadata, wherein the metadata comprises the adjustment value, when said computer program is run by a computer.

* * * * *